(12) United States Patent
Cho et al.

(10) Patent No.: US 9,590,185 B2
(45) Date of Patent: Mar. 7, 2017

(54) AMINE-BASED COMPOUND AND ORGANIC LIGHT-EMITTING DIODE INCLUDING THE SAME

(71) Applicant: Samsung Display Co., Ltd., Yongin, Gyeonggi-do (KR)

(72) Inventors: Hwan-Hee Cho, Yongin (KR); Mi-Kyung Kim, Yongin (KR); Se-Hun Kim, Yongin (KR); Sam-Il Kho, Yongin (KR); Hyoung-Kun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 410 days.

(21) Appl. No.: 14/192,854

(22) Filed: Feb. 27, 2014

(65) Prior Publication Data

US 2014/0252327 A1    Sep. 11, 2014

(30) Foreign Application Priority Data

Mar. 5, 2013  (KR) .................. 10-2013-0023569

(51) Int. Cl.
*H01L 51/50* (2006.01)
*H01L 51/00* (2006.01)

(52) U.S. Cl.
CPC ........ *H01L 51/006* (2013.01); *H01L 51/0059* (2013.01); *H01L 51/0072* (2013.01); *H01L 51/5056* (2013.01)

(58) Field of Classification Search
None
See application file for complete search history.

(56) References Cited

U.S. PATENT DOCUMENTS

2005/0221124 A1* 10/2005 Hwang ............... C07F 9/5728
                                                                428/690
2006/0186793 A1*  8/2006 Iou ..................... H01L 51/5036
                                                                313/503

(Continued)

FOREIGN PATENT DOCUMENTS

KR   10-2005-0097670 A   10/2005
KR   10-2010-0039815 A    4/2010
KR   10-2012-0052993 A    5/2012

*Primary Examiner* — Gregory Clark
(74) *Attorney, Agent, or Firm* — Lewis Roca Rothgerber Christie LLP

(57) ABSTRACT

Provided are an amine-based compound and an organic light-emitting diode including the same. The amine-based compound is represented by Formula 1 or Formula 2 below:

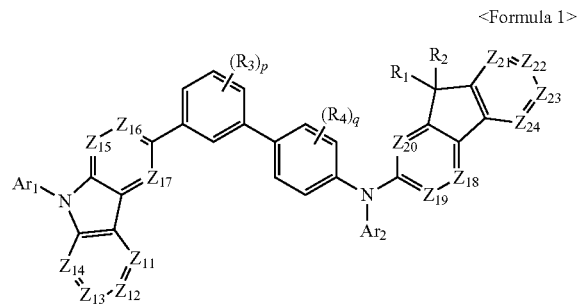

<Formula 1>

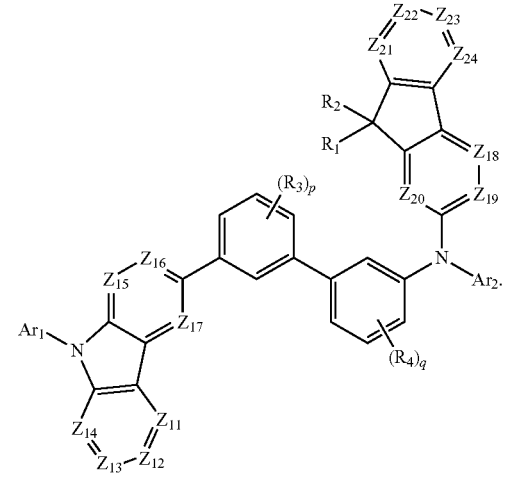

<Formula 2>

20 Claims, 1 Drawing Sheet

(56) References Cited

U.S. PATENT DOCUMENTS

2011/0193074 A1  8/2011  Lee et al.
2012/0043531 A1* 2/2012  Jung .................... H01L 51/006
                                                           257/40
2012/0146014 A1  6/2012  Kato

* cited by examiner

AMINE-BASED COMPOUND AND ORGANIC LIGHT-EMITTING DIODE INCLUDING THE SAME

CROSS-REFERENCE TO RELATED APPLICATION

This application claims priority to and the benefit of Korean Patent Application No. 10-2013-0023569, filed on Mar. 5, 2013, in the Korean Intellectual Property Office, the entire content of which is incorporated herein by reference.

BACKGROUND

1. Field

Embodiments of the present invention relate to an amine-based compound and an organic light-emitting diode including the same.

2. Description of the Related Art

Organic light-emitting diodes (OLEDs), which are self-emitting diodes, have advantages such as wide viewing angles, good contrast, quick response, high brightness, good driving voltage characteristics, and an ability to provide multicolored images.

A typical OLED has a structure including a substrate, and an anode, a hole transport layer, an emission layer (EML), an electron transport layer, and a cathode, which are sequentially stacked on the substrate. The hole transport layer, the emission layer, and the electron transport layer are organic thin films formed of organic compounds.

An operating principle of an OLED having the above-described structure is as follows. When a voltage is applied between the anode and the cathode, holes injected from the anode move to the emission layer via the hole transport layer, and electrons injected from the cathode move to the emission layer via the electron transport layer. The holes and electrons (carriers) recombine in the organic EML to generate excitons. When the excitons drop from an excited state to a ground state, light is emitted.

Korean Patent Publication No. 10-2012-0052993 provides examples of aromatic amine derivatives and suggests that binding of a benzene ring bound to a carbazole group at a para position leads to a low-voltage driving. In addition, when a benzene ring is bound at that para position, a driving voltage of the organic EL device is reduced. This may be because charge mobility is increased by expansion of a conjugated system.

According to Korean Patent Publication No. 10-2012-0052993, of Formula (III), the following Formula (III') appears to be preferred:

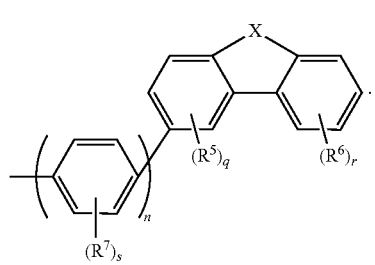

[Formula III']

In Formula (III'), X, $R^5$, $R^6$, $R^7$, n, q, r, and s are as defined in the Korean Patent Publication No. 10-2012-0052993.

However, as disclosed in the present specification, it is found that when a benzene ring bound to a carbazole group of an aromatic amine derivative binds only at a para position, such as those according to Korean Patent Publication No. 10-2012-0052993, efficiency and lifespan of a diode are reduced.

SUMMARY

Aspects of embodiments of the present invention are directed toward an amine-based compound which prevents or reduces a decrease in efficiency and/or lifespan of a diode, without substantially increasing a driving voltage.

Embodiments of the present invention are directed to an amine-based compound and an organic light-emitting diode including the same.

According to an embodiment of the present invention, an amine-based compound represented by Formula 1 or Formula 2 below is provided:

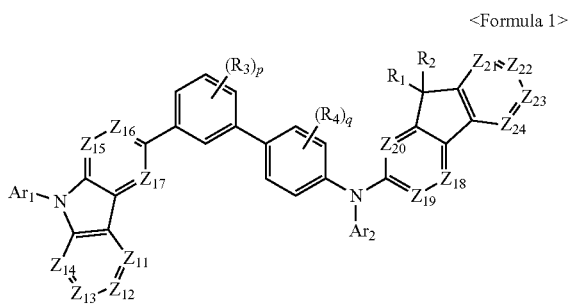

<Formula 1>

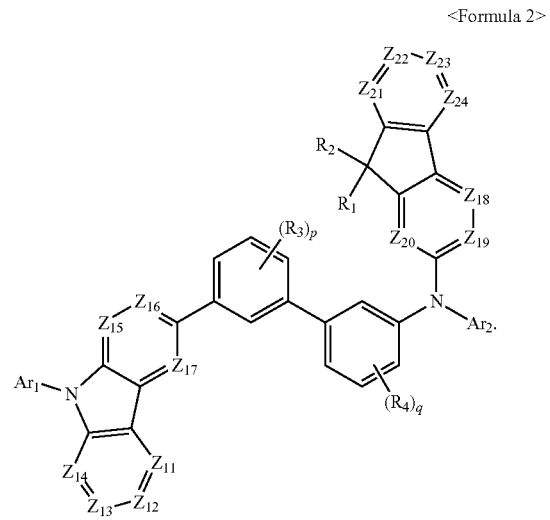

<Formula 2>

In Formulae 1 and 2, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$. $Ar_1$ and $Ar_2$ are each independently selected from a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group. $R_1$ and $R_2$ are each independently selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and $C_2$-$C_{60}$ heteroaryl group. $R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —N($Q_{11}$)($Q_{12}$), —Si($Q_{13}$)($Q_{14}$)($Q_{15}$), and —B($Q_{16}$)($Q_{17}$) (wherein $Q_{11}$ and $Q_{17}$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group). p and q are each independently an integer of 1 to 4.

In one embodiment, in Formulae 1 and 2, $Z_{11}$ is C($R_{11}$), $Z_{12}$ is C($R_{12}$), $Z_{13}$ is C($R_{13}$), $Z_{14}$ is C($R_{14}$), $Z_{15}$ is C($R_{15}$), $Z_{16}$ is C($R_{16}$), $Z_{17}$ is C($R_{17}$), $Z_{18}$ is C($R_{18}$), $Z_{19}$ is C($R_{19}$), $Z_{20}$ is C($R_{20}$), $Z_{21}$ is C($R_{21}$), $Z_{22}$ is C($R_{22}$), $Z_{23}$ is C($R_{23}$), and $Z_{24}$ is C($R_{24}$).

In one embodiment, in Formulae 1 and 2, $Ar_1$ and $Ar_2$ are each independently selected from phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl; and phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

In one embodiment, in Formulae 1 and 2, $Ar_1$ and $Ar_2$ are each independently selected from phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl; and phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

In one embodiment, in Formulae 1 and 2, $Ar_1$ and $Ar_2$ are each independently selected from a group represented by one of Formulae 3-1 to 3-20 below:

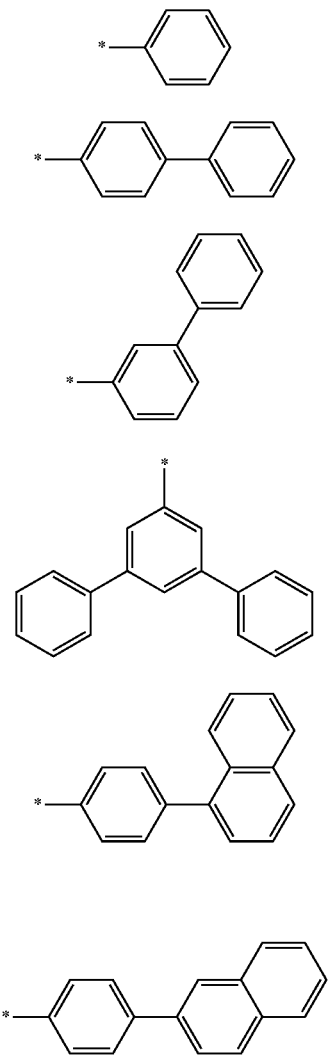

Formula 3-1

Formula 3-2

Formula 3-3

Formula 3-4

Formula 3-5

Formula 3-6

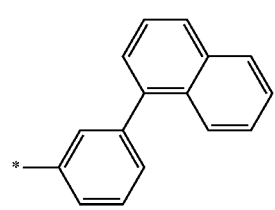

Formula 3-7

-continued

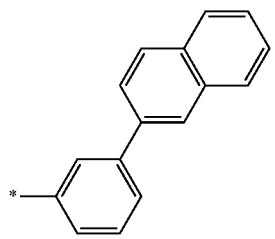

Formula 3-8

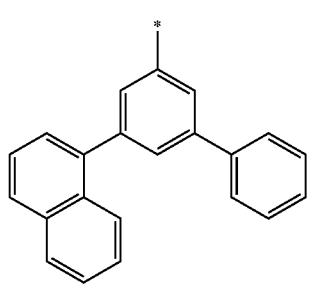

Formula 3-9

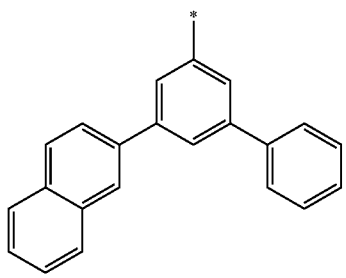

Formula 3-10

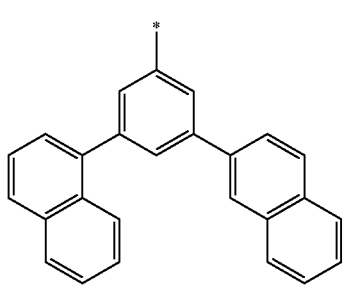

Formula 3-11

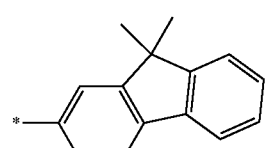

Formula 3-12

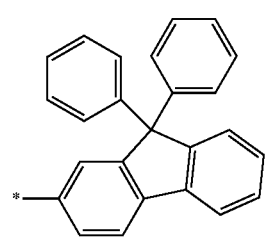

Formula 3-13

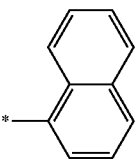

where * represents a binding site to a corresponding N of Formula 1 or Formula 2.

In one embodiment, in Formulae 1 and 2, $R_1$ and $R_2$ are each independently selected from a $C_1$-$C_{20}$ alkyl group; a $C_1$-$C_{20}$ alkyl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl; phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl; and phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

In one embodiment, in Formulae 1 and 2, $R_1$ and $R_2$ are each independently selected from methyl, ethyl, propyl, butyl, pentyl, hexyl, heptyl, and a group represented by one of Formulae 3-1 to 3-20 above, where * represents a binding site to a corresponding fluorene carbon of Formula 1 or Formula 2.

In one embodiment, in Formulae 1 and 2, $R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group; a $C_1$-$C_{20}$ alkyl group, substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl; phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl; and phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

In one embodiment, in Formulae 1 and 2, $R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group.

In one embodiment, in Formulae 1 and 2, $R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, methyl, ethyl, propyl, butyl, pentyl, hexyl, heptyl, and a group represented by one of Formulae 3-1 to 3-20 above, where represents a binding site to a corresponding position on the amine-based compound represented by Formula 1 or Formula 2.

In one embodiment, in Formulae 1 and 2, the amine-based compound is selected from one of Compounds 1 to 96 as shown in the detailed description below.

According to a further embodiment, an amine-based compound represented by Formula 1A or Formula 2A below is provided:

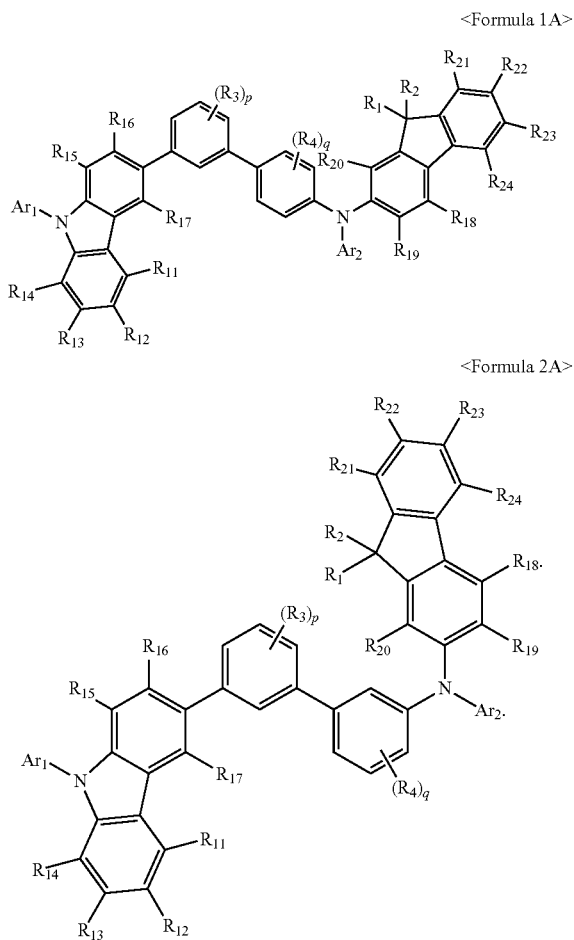

<Formula 1A>

<Formula 2A>

In Formulae 1A and 2A, p and q are each independently selected from an integer of 1 to 4; $Ar_1$ and $Ar_2$ are each independently selected from a group represented by one of Formulae 3-1 to 3-20 above, where * represents a binding site to a corresponding position on the amine-based compound represented by Formula 1A or Formula 2A; $R_1$ and $R_2$ are each independently selected from a $C_1$-$C_{20}$ alkyl group and a group represented by one of Formulae 3-1 to 3-20 above, where * represents a binding site to a corresponding position on the amine-based compound represented by Formula 1A or Formula 2A; $R_3$, $R_4$ and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a group represented by one of Formulae 3-1 to 3-20 above, where * represents a binding site to a corresponding position on the amine-based compound represented by Formula 1A or Formula 2A.

In one embodiment, in Formulae 1A and 2A, $R_3$, $R_4$, and $R_{11}$ to $R_{24}$ are hydrogen atoms.

According to another embodiment of the present invention, provided is an organic light-emitting diode including: a first electrode; a second electrode on the first electrode; and an organic layer between the first electrode and the second electrode and including an emission layer, wherein the organic layer includes at least one amine-based compound according to Formulae 1 or 2.

In one embodiment, the organic layer includes a hole transporting region between the first electrode and the emission layer, the hole transporting region including at least one selected from a hole injection layer, a hole transport layer, a functional layer having a hole injection capability and a hole transport capability, a buffer layer, and an electron blocking layer; and an electron transporting region between the emission layer and the second electrode, the electron transporting region including at least one selected from a hole blocking layer, an electron transport layer, and an electron injection layer.

In one embodiment, the hole transporting region includes the amine-based compound according to Formulae 1 or 2.

In one embodiment, the hole transporting region further includes a p-dopant.

In one embodiment, the hole transporting region includes a hole transport layer, the hole transport layer including the amine-based compound according to Formulae 1 or 2.

In one embodiment, the emission layer includes a host and a dopant, the dopant including an organometallic compound, which includes at least one selected from Ir, Pt, Os, Ti, Zr, Hf, Eu, Tb, and Tm.

BRIEF DESCRIPTION OF THE DRAWINGS

The accompanying drawings, together with the specification, illustrate embodiments of the present invention, and, together with the description, serve to explain the principles of the present invention. The above and other features of the present invention will become more apparent by describing in more detail embodiments thereof with reference to the attached drawings in which.

DETAILED DESCRIPTION

Figure 1:
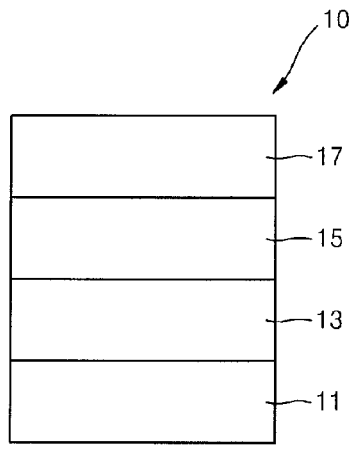
FIG. 1 is a schematic view of a structure of an organic light-emitting diode according to an embodiment of the present invention.

In the following detailed description, only certain embodiments of the present invention are shown and described, by way of illustration. As those skilled in the art would recognize, the invention may be embodied in many different forms and should not be construed as being limited to the embodiments set forth herein. In the context of the present application, when a first element is referred to as being "on" a second element, it can be directly on the second element or it can be indirectly on the second element with one or more intervening elements interposed therebetween. Herein, the use of "may" when describing embodiments of the present invention refers to "one or more embodiments of the present invention." Additionally, expressions such as "at least one of," when preceding a list of elements, modify the entire list of elements and do not modify the individual elements of the list. Like reference numerals designate like elements throughout the specification.

According to an embodiment, an amine-based compound represented by Formula 1 or 2 below is provided:

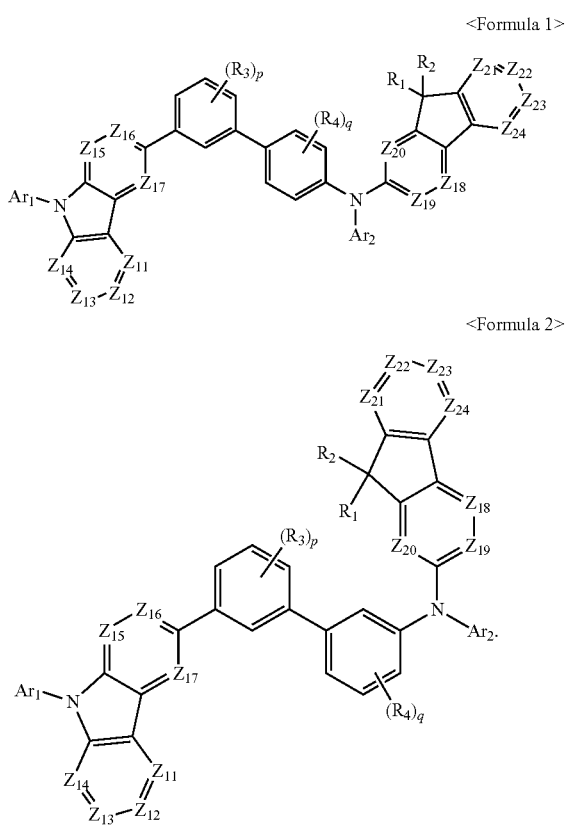

<Formula 1>

<Formula 2>

In one embodiment, in Formulae 1 and 2, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $O(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$.

For example, in one embodiment, in Formulae 1 and 2, $Z_{11}$ is $C(R_{11})$, $Z_{12}$ is $C(R_{12})$, $Z_{13}$ is $C(R_{13})$, $Z_{14}$ is $C(R_{14})$, $Z_{15}$ is $C(R_{15})$, $Z_{16}$ is $C(R_{16})$, $Z_{17}$ is $C(R_{17})$, $Z_{18}$ is $C(R_{18})$, $Z_{19}$ is $C(R_{19})$, $Z_{20}$ is $C(R_{20})$, $Z_{21}$ is $C(R_{21})$, $Z_{22}$ is $C(R_{22})$, $Z_{23}$ is $C(R_{23})$, and $Z_{24}$ is $C(R_{24})$, but $Z_{11}$, $Z_{12}$; $Z_{13}$, $Z_{14}$, $Z_{15}$, $Z_{16}$, $Z_{17}$, $Z_{18}$, $Z_{19}$, $Z_{20}$, $Z_{21}$, $Z_{22}$, $Z_{23}$, and $Z_{24}$, but embodiments are not limited thereto.

In one embodiment, $A_1$ and $Ar_2$ in Formulae 1 and 2 are each independently selected from:
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, and
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, in one embodiment, $Ar_1$ and $Ar_2$ in Formulae 1 and 2 are each independently selected from:
phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl, and
phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

According to another embodiment of the present invention, $Ar_1$ and $Ar_2$ in Formulae 1 and 2 are each independently selected from:
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

According to another embodiment of the present invention, $Ar_1$ and $Ar_2$ in Formulae 1 and 2 are each independently selected from a group represented by one of Formulae 3-1 to 3-20 below, but $Ar_1$ and $Ar_2$ are not limited thereto:

Formula 3-1

Formula 3-2

Formula 3-3

Formula 3-4

Formula 3-5

Formula 3-6

Formula 3-7

-continued

Formula 3-8

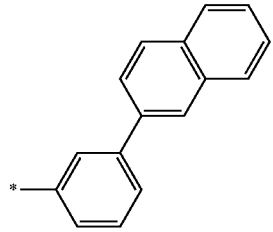

Formula 3-9

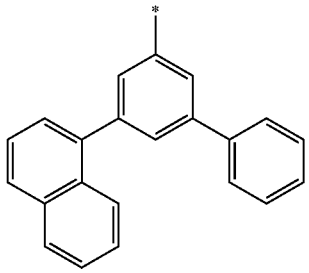

Formula 3-10

Formula 3-11

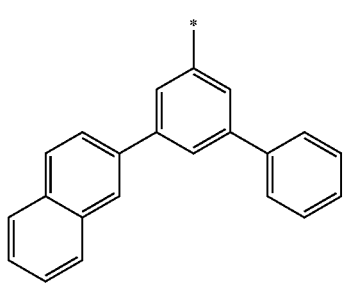

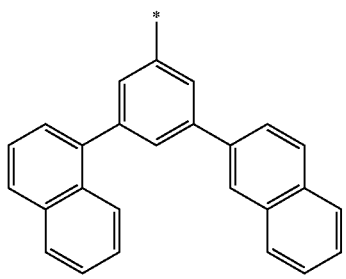

Formula 3-12

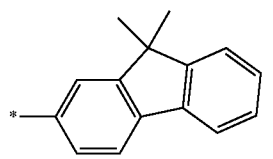

Formula 3-13

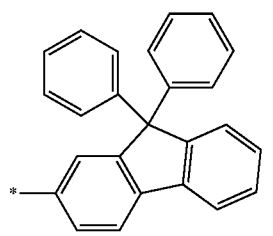

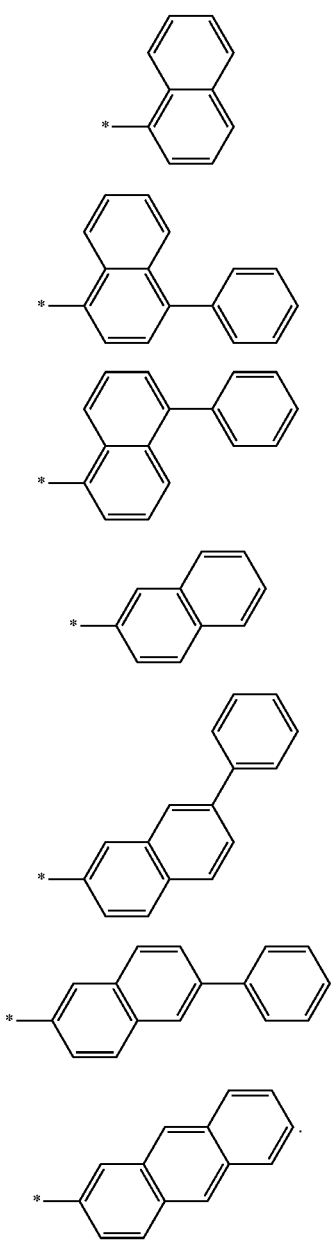

Formula 3-14
Formula 3-15
Formula 3-16
Formula 3-17
Formula 3-18
Formula 3-19
Formula 3-20

* in Formulae 3-1 to 3-20 represents a binding site to a corresponding position on the amine-based compound. Thus, in the above embodiment, where $Ar_1$ and $Ar_2$ in Formulae 1 and 2 are each independently selected from a group represented by one of Formulae 3-1 to 3-20 above, * in Formulae 3-1 to 3-20 represents a binding site to a corresponding N of Formula 1 or Formula 2.

In one embodiment, $R_1$ and $R_2$ in Formulae 1 and 2 are each independently selected from:
a $C_1$-$C_{60}$ alkyl group, a $C_2$-$C_{60}$ alkenyl group, a $C_2$-$C_{60}$ alkynyl group, and a $C_1$-$C_{60}$ alkoxy group,
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group,
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and $C_2$-$C_{50}$ heteroaryl group, and
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and $C_2$-$C_{50}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, in one embodiment, $R_1$ and $R_2$ in Formulae 1 and 2 are each independently selected from:
a $C_1$-$C_{20}$ alkyl group,
a $C_1$-$C_{20}$ alkyl group substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl,
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, but embodiments are not limited thereto.

According to an embodiment of the present invention, $R_1$ and $R_2$ in Formulae 1 and 2 are each independently selected from methyl, ethyl, propyl, butyl, pentyl, hexyl, heptyl, and a group represented by one of Formulae 3-1 to 3-20 above, but embodiments are not limited thereto.

In one embodiment, in Formulae 1 and 2, $R_3$, $R_4$, and $R_{11}$ to $R_{24}$ are each independently selected from:
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and $C_2$-$C_{60}$ heteroaryl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$alkyl group, a $C_2$-$C_{60}$alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, and —N($Q_{11}$)($Q_{12}$), —Si($Q_{13}$)($Q_{14}$)($Q_{15}$) and —B($Q_{16}$)($Q_{17}$), wherein $Q_{11}$ to $Q_{17}$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group.

For example, in one embodiment, $R_3$, $R_4$, and $R_{11}$ to $R_{24}$ in Formulae 1 and 2 are each independently selected from:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group, a $C_1$-$C_{20}$ alkyl group, substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, qui- nolinyl, benzoquinolinyl, quinoxalinyl, quinazolinyl, cinnolinyl, carbazolyl, and triazinyl, but embodiments are not limited thereto.

According to another embodiment of the present invention, $R_3$, $R_4$, and $R_{11}$ to $R_{24}$ in Formulae 1 and 2 are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group, but embodiments are not limited thereto.

According to another embodiment of the present invention, $R_3$, $R_4$, and $R_{11}$ to $R_{24}$ in Formulae 1 and 2 are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, methyl, ethyl, propyl, butyl, pentyl, hexyl, heptyl, and a group represented by one of Formulae 3-1 to 3-20 above, but embodiments are not limited thereto.

According to one embodiment of the present invention, $R_3$ and $R_4$ in Formulae 1 and 2 are linked to each other to form a saturated or an unsaturated ring.

In Formulae 1 and 2, p represents a number of $R_3$ groups and may be an integer of 1 to 4. In embodiments in which p is 2 or more, one or more of the $R_3$ groups may be identical to, or different from each other. q represents a number of $R_4$ groups and may be an integer of 1 to 4. In embodiments in which q is 2 or more, one or more of the $R_4$ groups may be identical to or different from each other.

According to an embodiment of the present invention, the amine-based compound is represented by Formulae 1A or 2A below:

<Formula 1A>

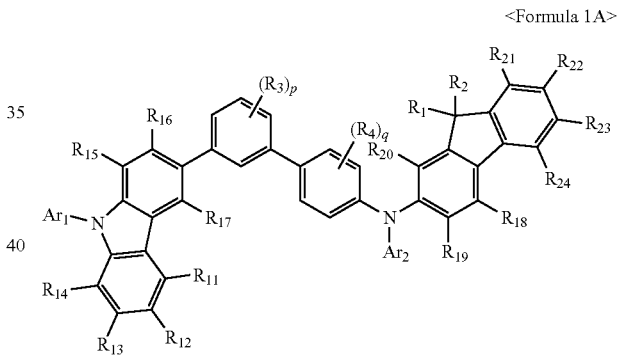

<Formula 2A>

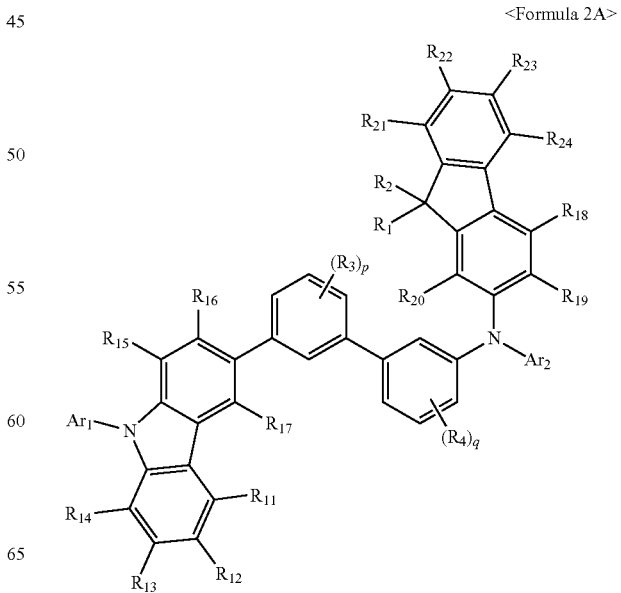

$R_1$ to $R_4$, $R_{11}$ to $R_{24}$, $Ar_1$, $Ar_2$, p, and q in Formulae 1A and 2A are as already described above with reference to $R_1$ to $R_4$, $R_{11}$ to $R_{24}$, $Ar_1$, $Ar_2$, p, and q of Formulae 1 and 2.

For example, in one embodiment, in Formulae 1A and 2A:

$Ar_1$ and $Ar_2$ are each independently selected from a group represented by one of Formulae 3-1 to 3-20 above;

$R_1$ and $R_2$ are each independently selected from a $C_1$-$C_{20}$ alkyl group and a group represented by one of Formulae 3-1 to 3-20 above;

$R_3$, $R_4$ and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a group represented by one of Formulae 3-1 to 3-20 above; and p and q are each independently selected from an integer of 1 to 4, but embodiments are not limited thereto.

According to an embodiment of the present invention, each of $R_3$, $R_4$ and $R_{11}$ to $R_{24}$ in Formulae 1A and 2A is a hydrogen atom, but embodiments are not limited thereto.

According to an embodiment of the present invention, the amine-based compound is represented by Formula 2 or 2A, but embodiments are not limited thereto.

The amine-based compound may be selected from Compounds 1 to 96 below:

1

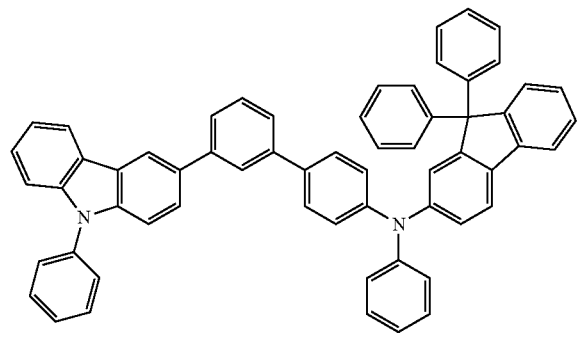

2

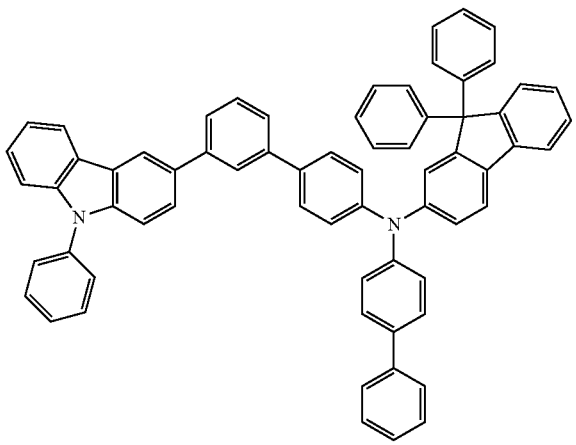

3

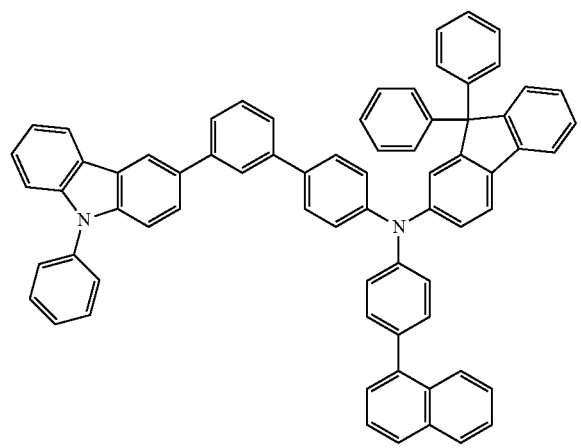

4

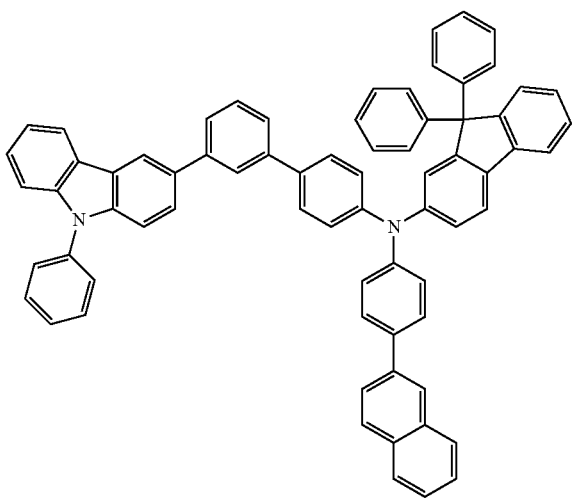

-continued
5
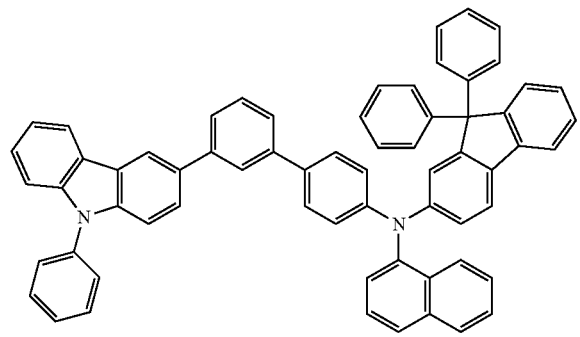
6
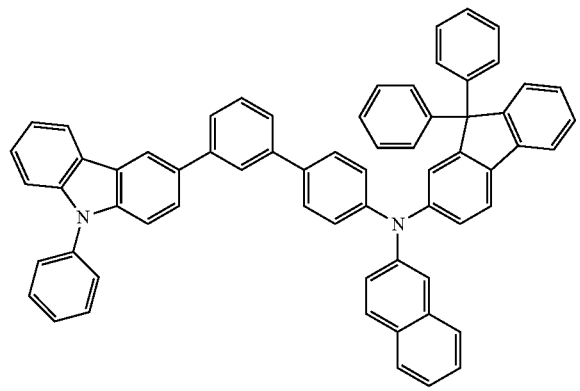
7
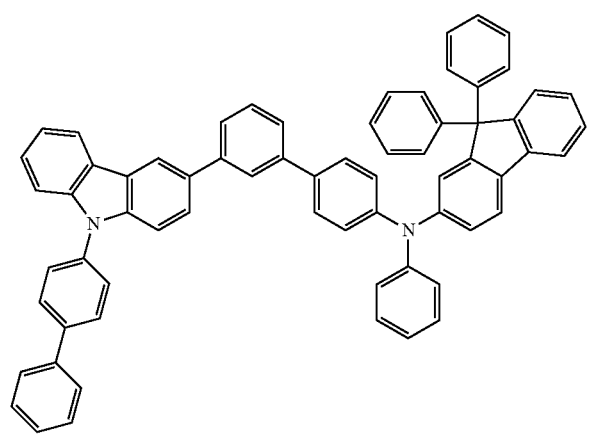
8
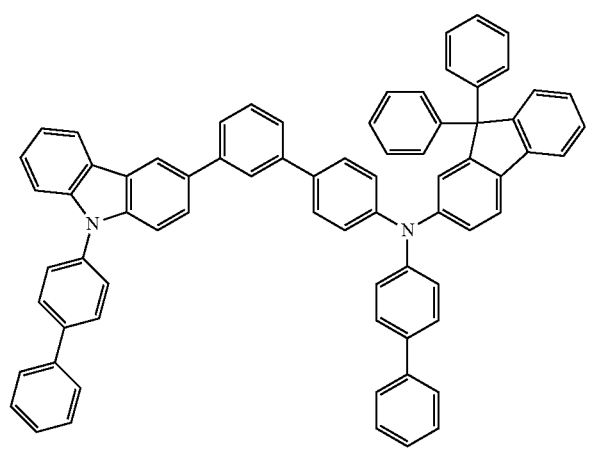
9
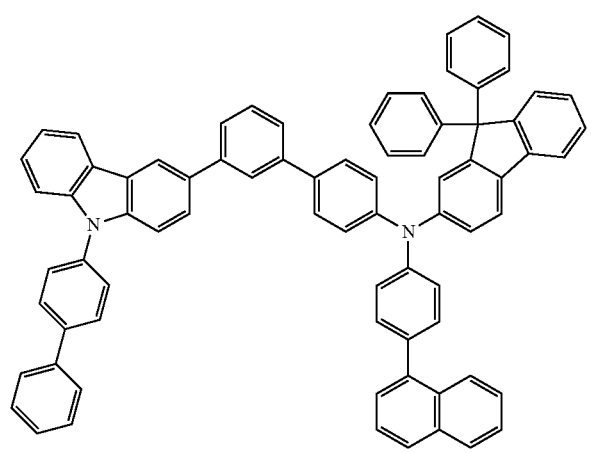
10
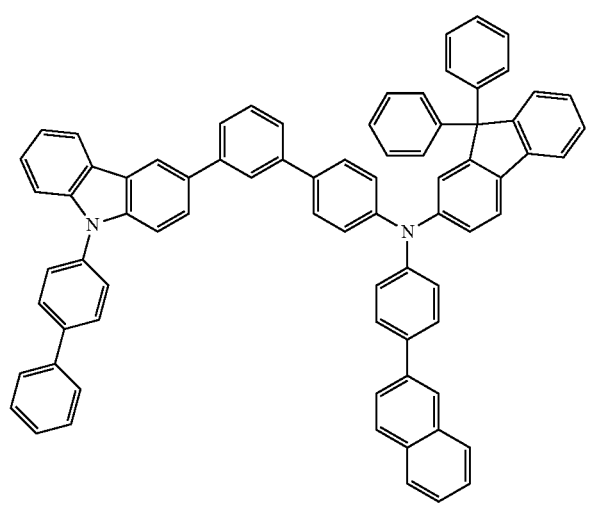

-continued
11
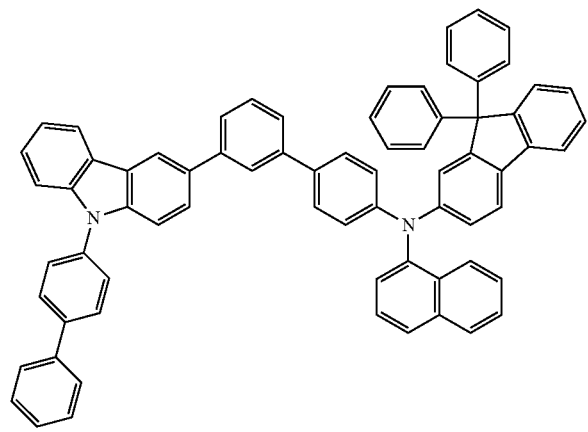
12
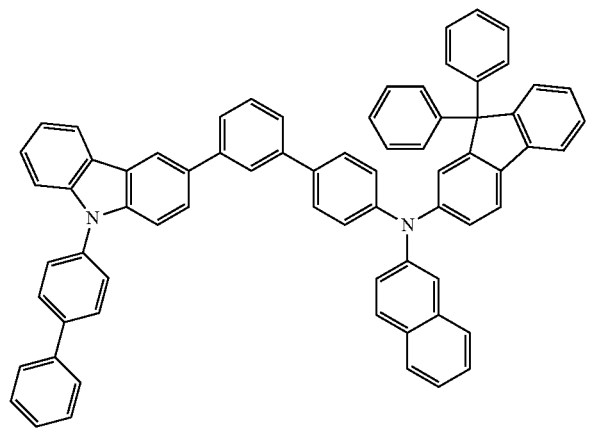
13
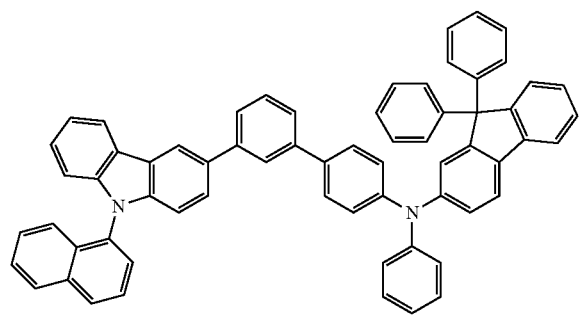
14
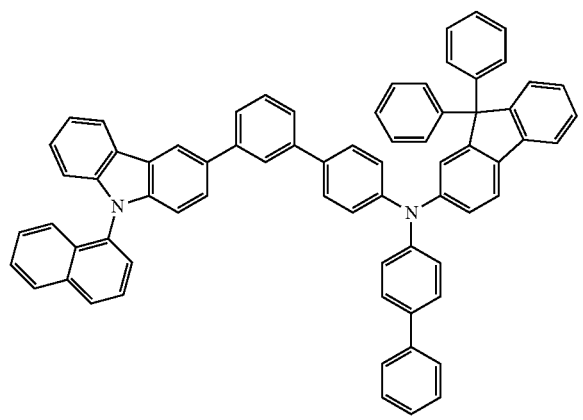
15
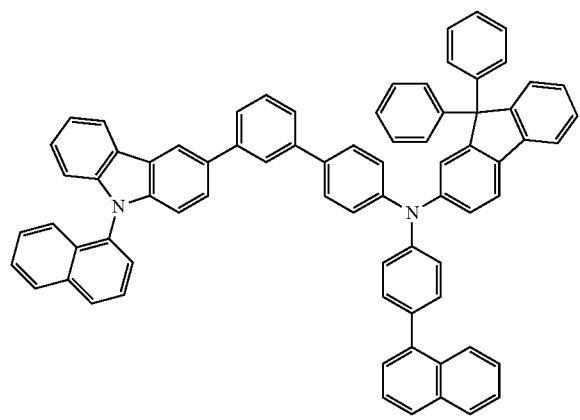
16
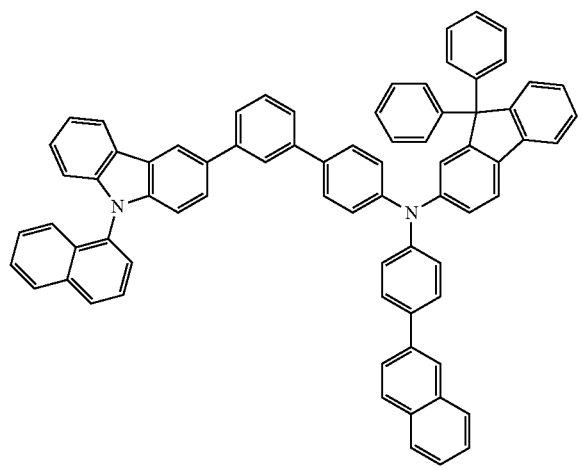

-continued
17
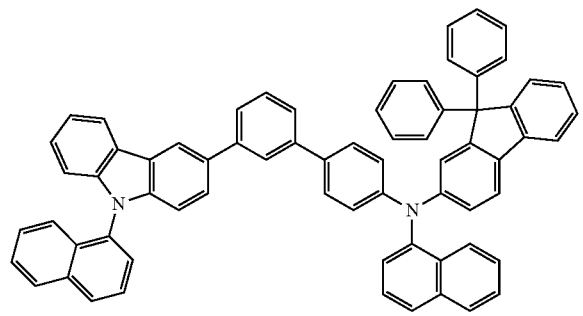
18
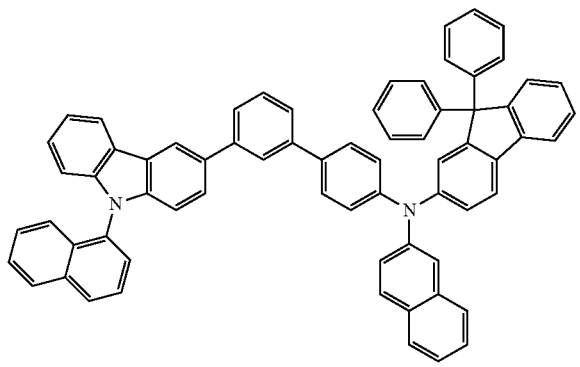
19
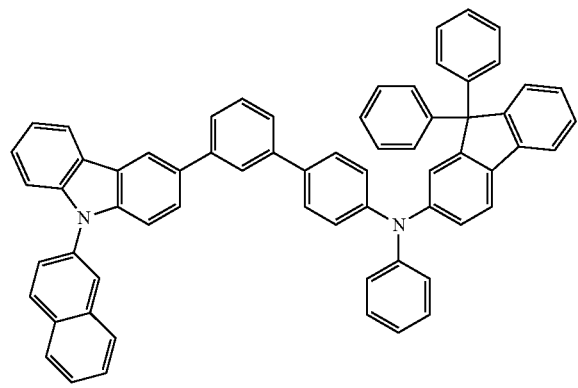
20
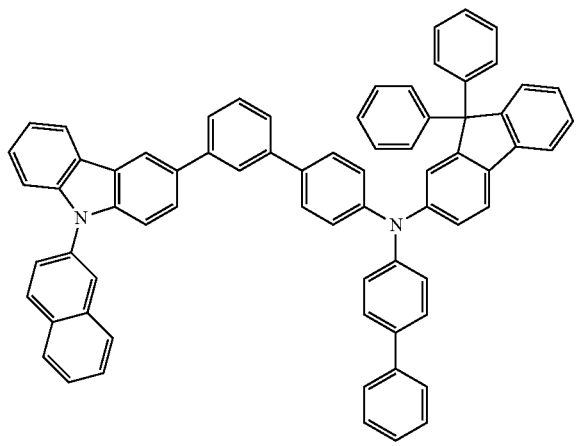
21
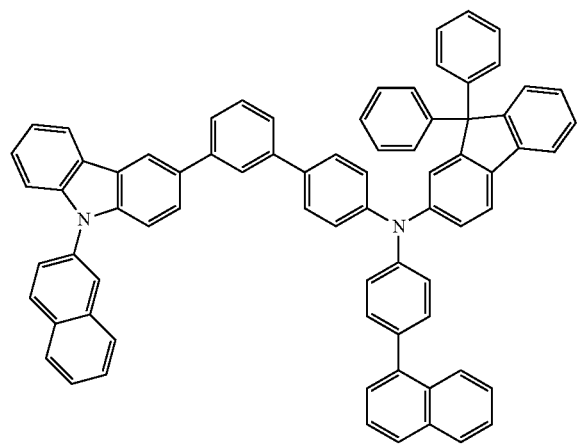
22
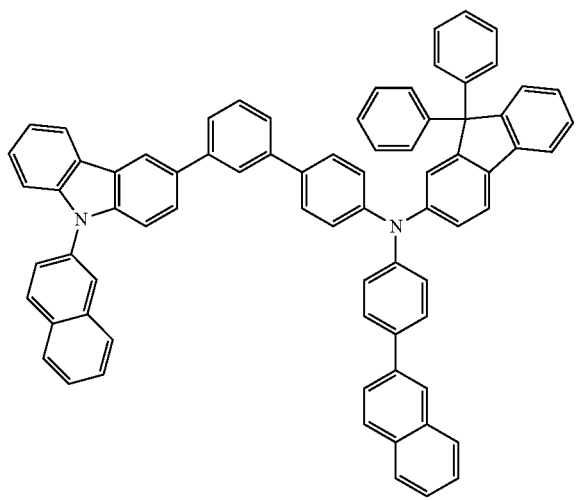

-continued
23
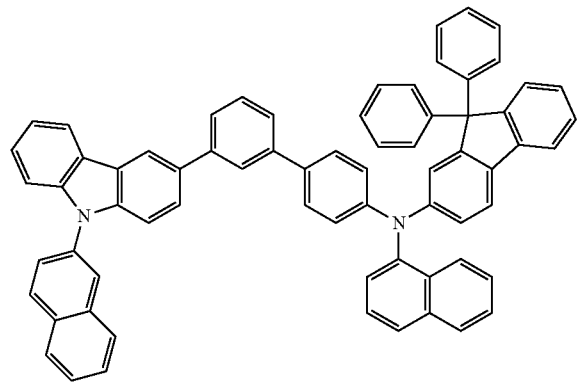
24
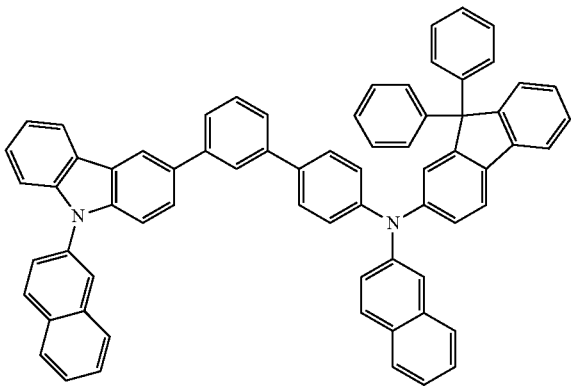
25
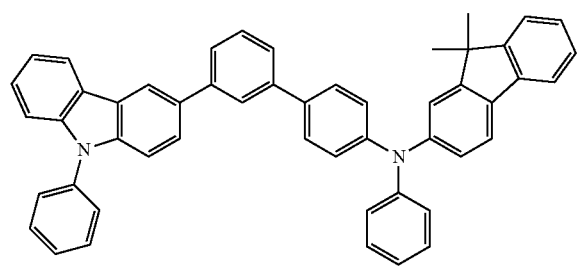
26
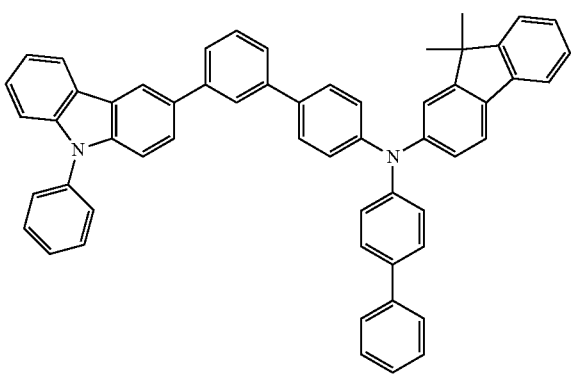
27
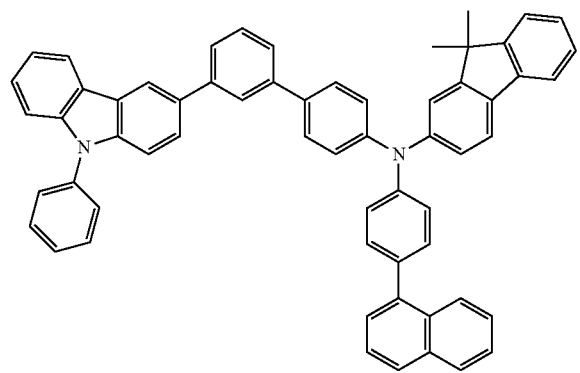
28
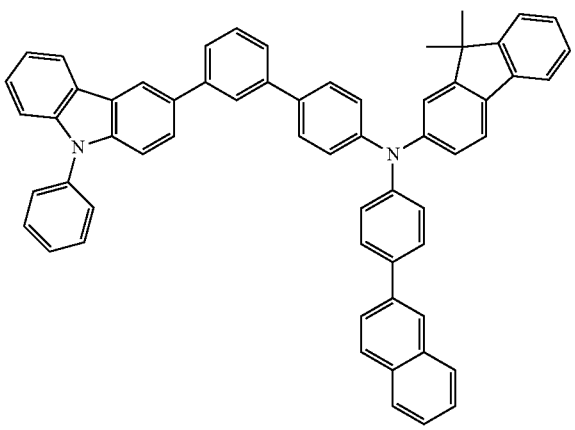
29
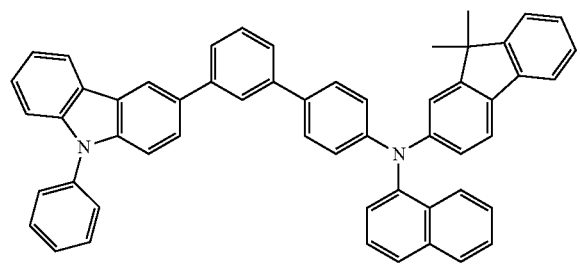
30
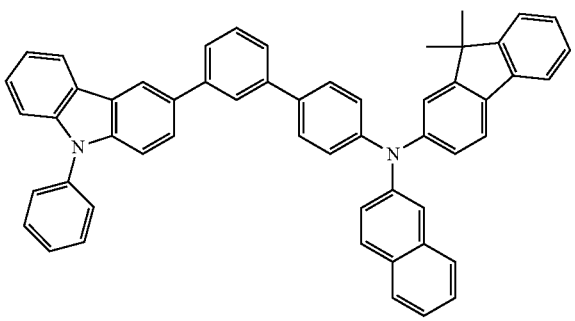

-continued
31
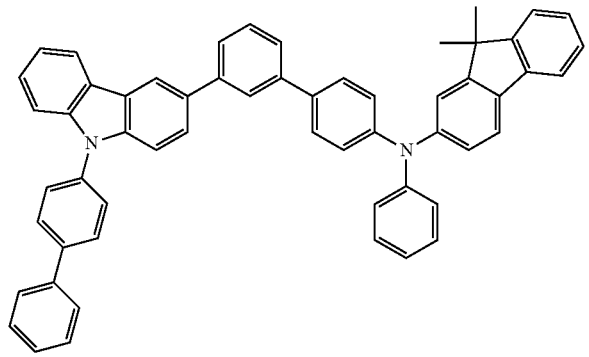
32
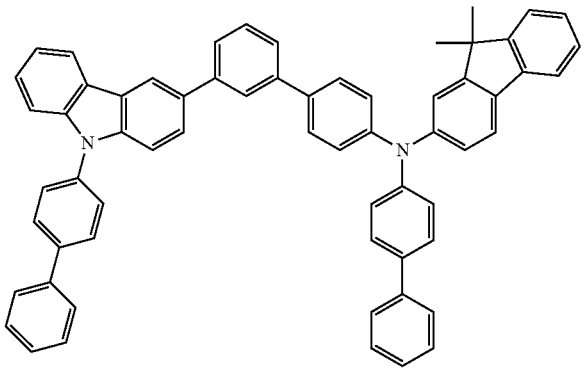
33
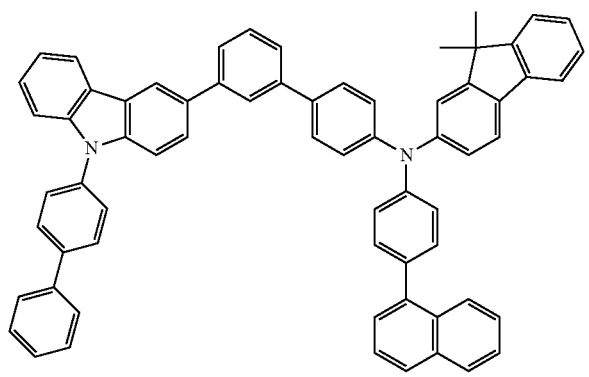
34
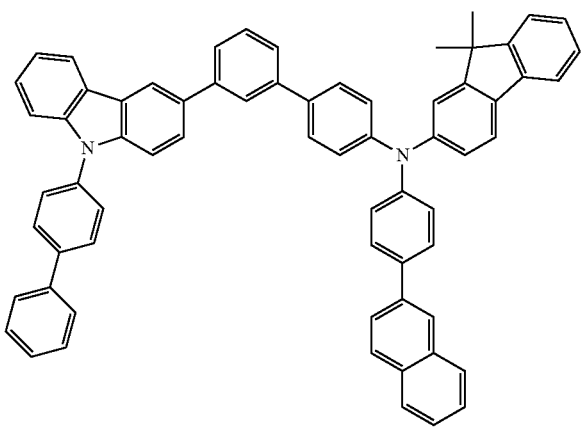
35
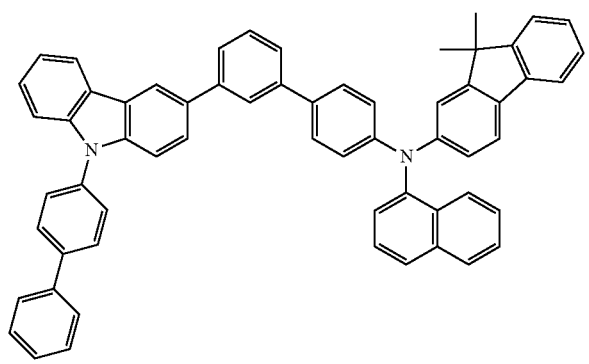
36
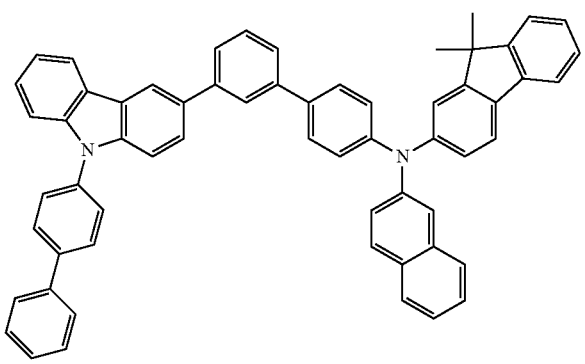
37
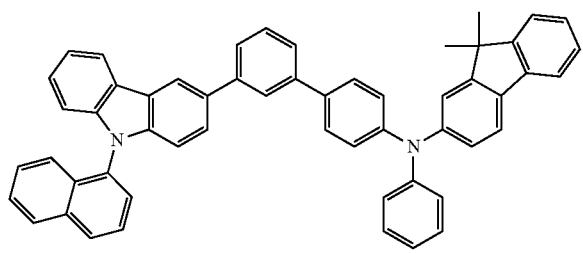
38
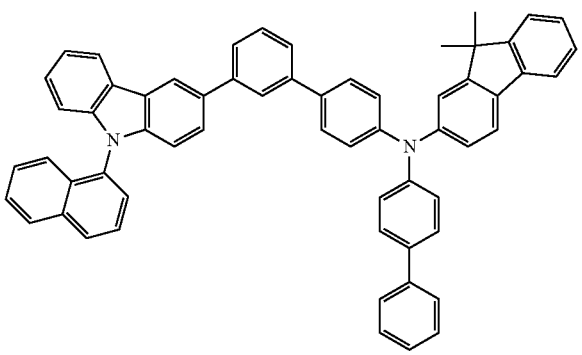

-continued
39
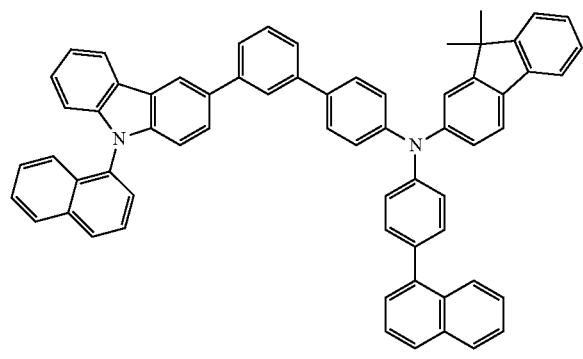
40
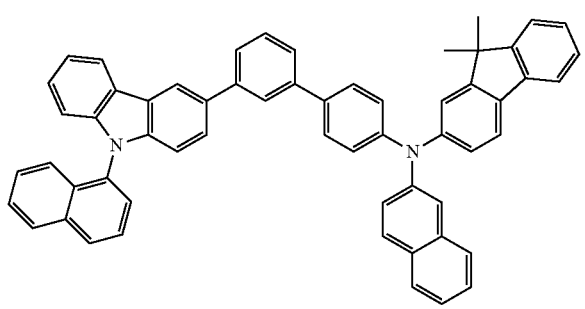
41
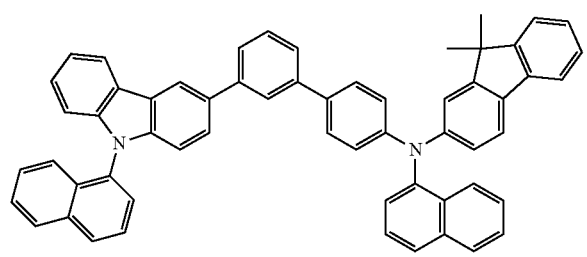
42
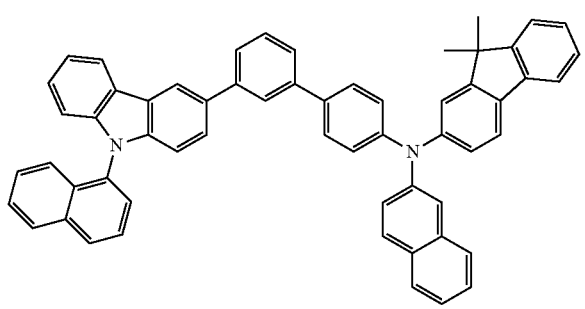
43
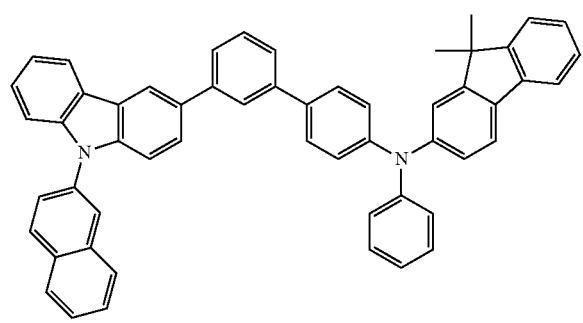
44
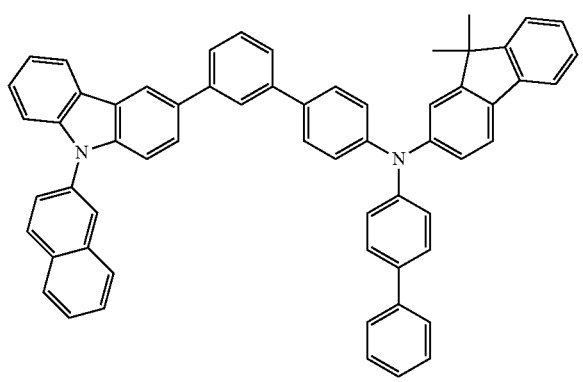
45
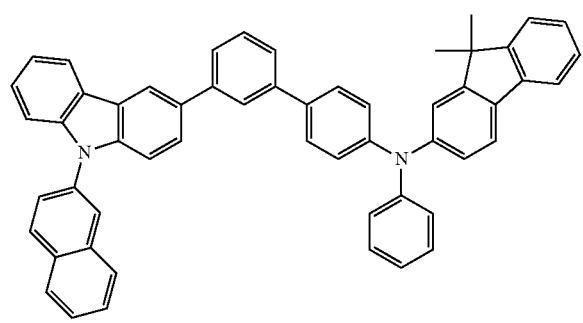
46
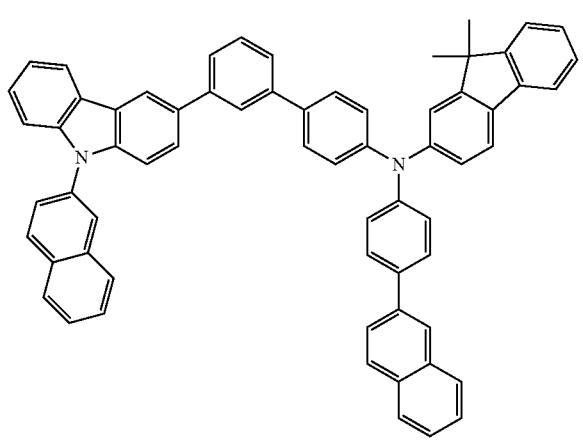

-continued
47
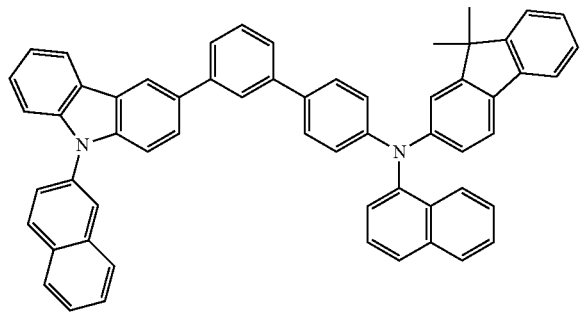
48
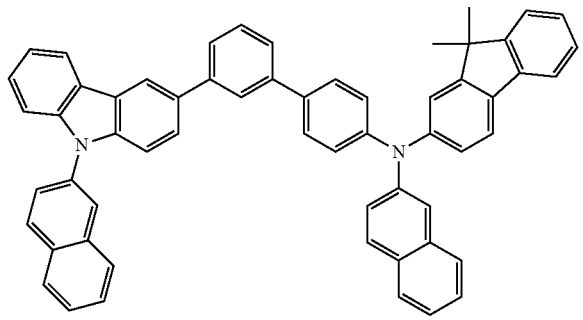
49
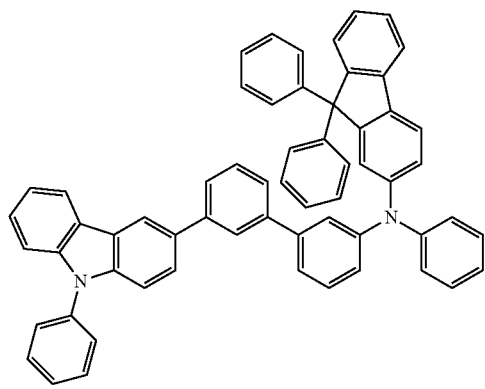
50
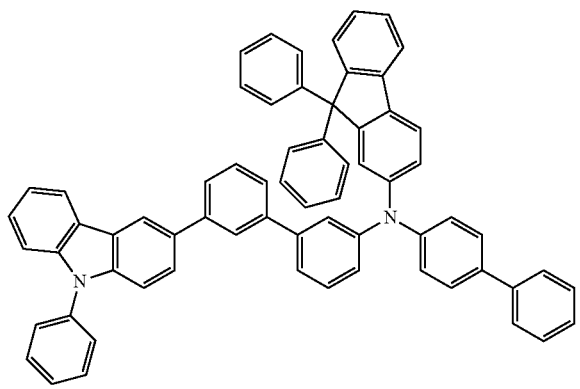
51
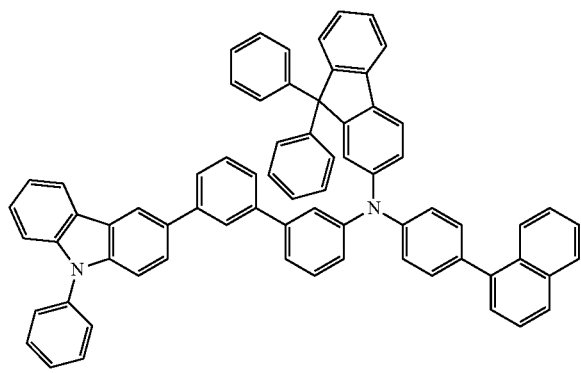
52
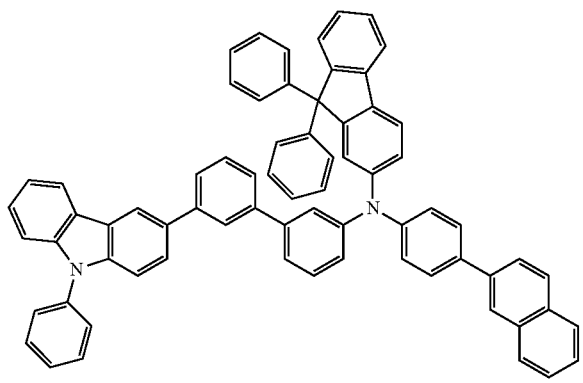
53
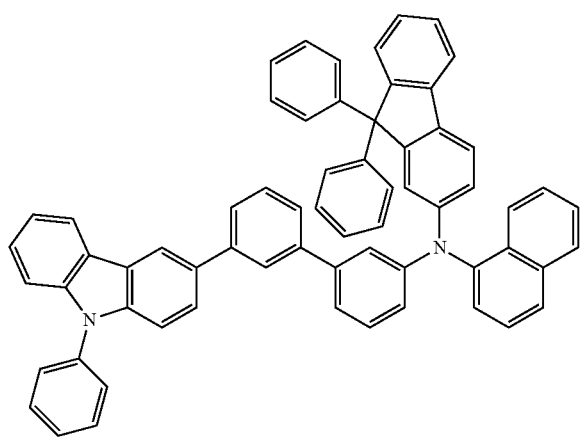
54
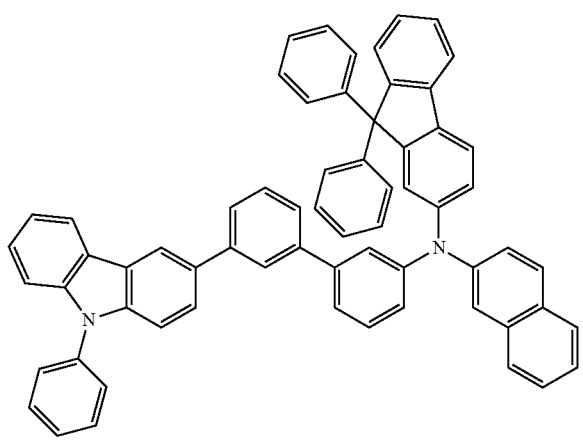

55
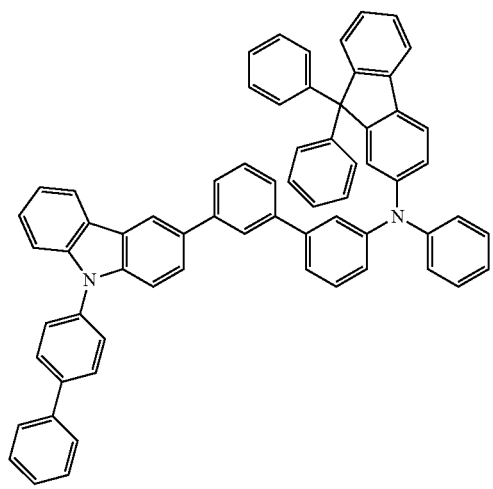
56
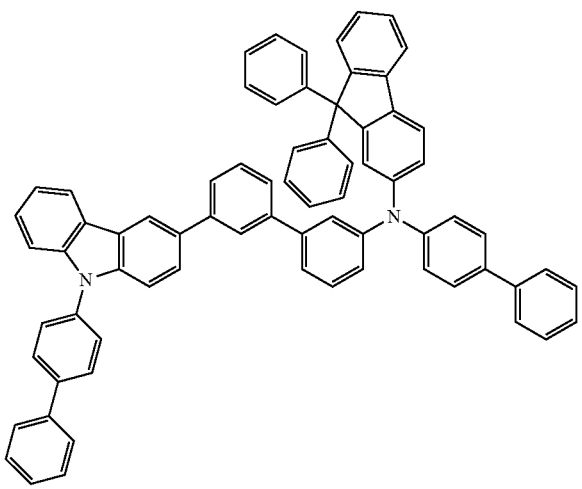
57
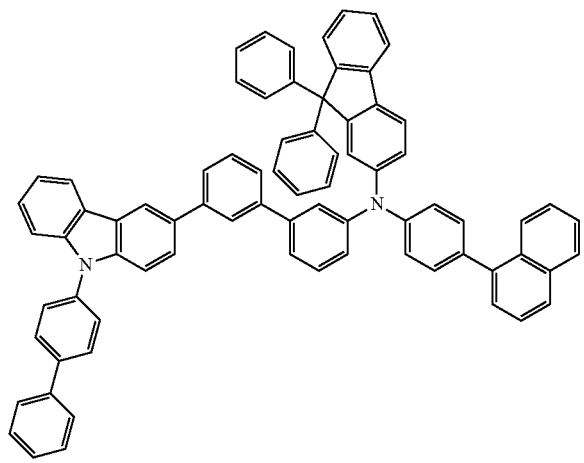
58
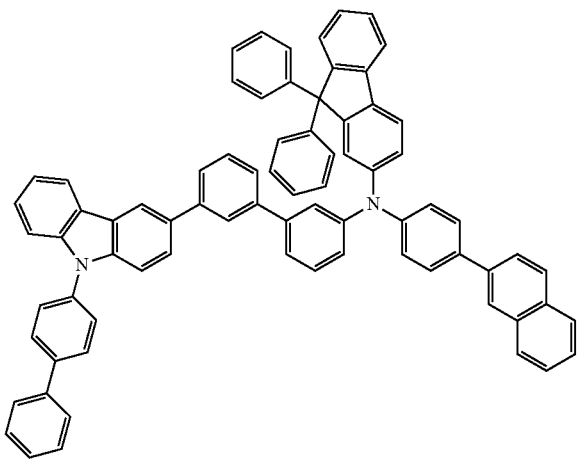
59
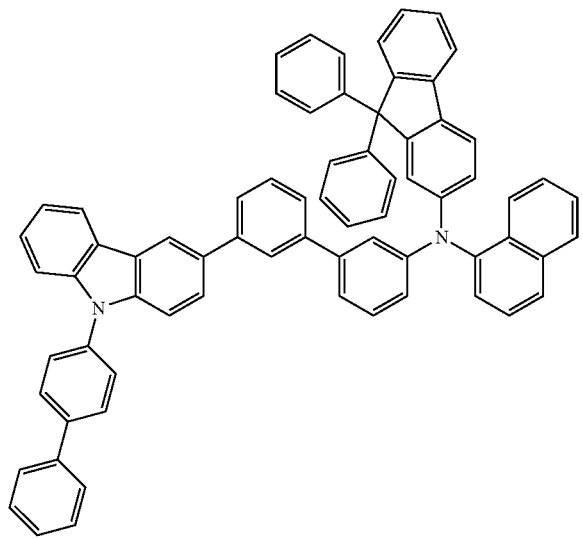
60
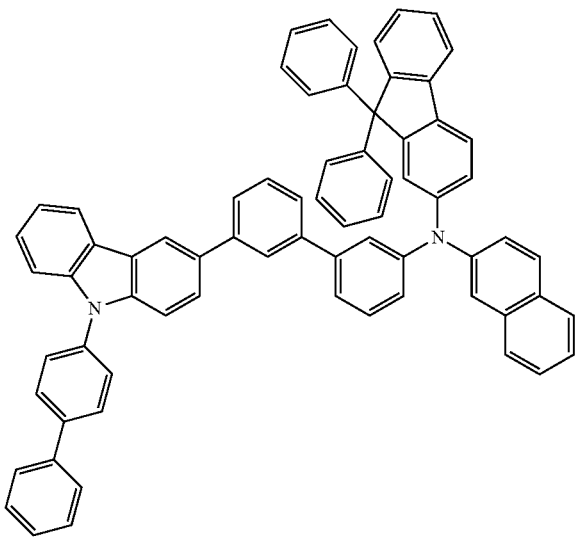

61
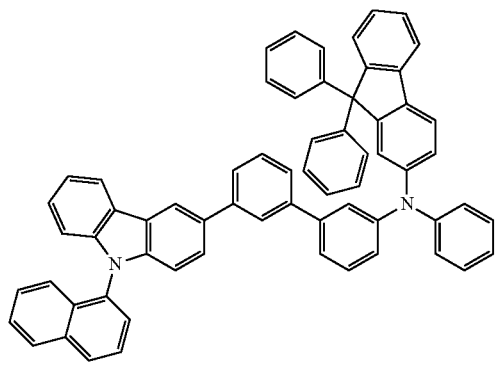
62
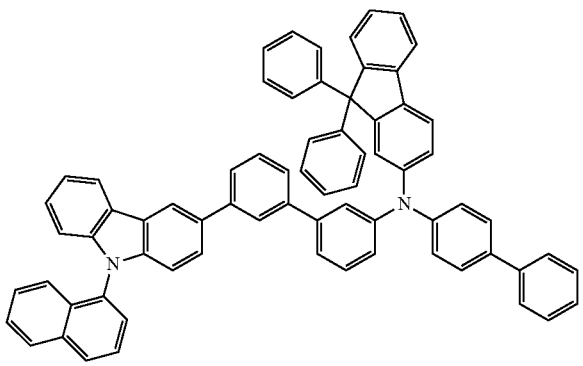
63
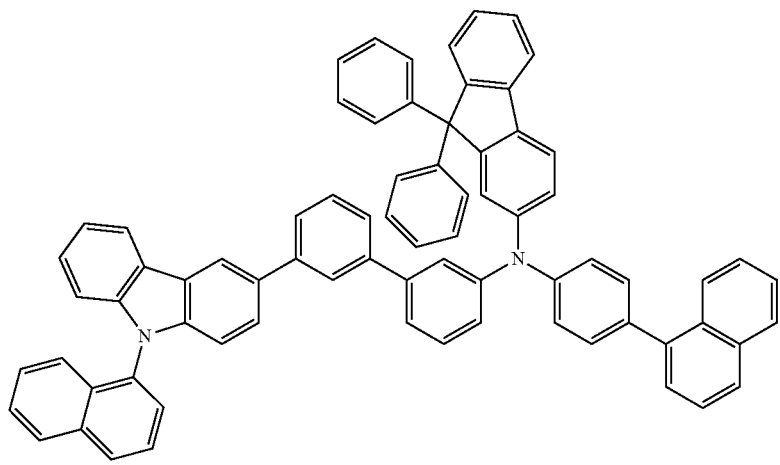
64
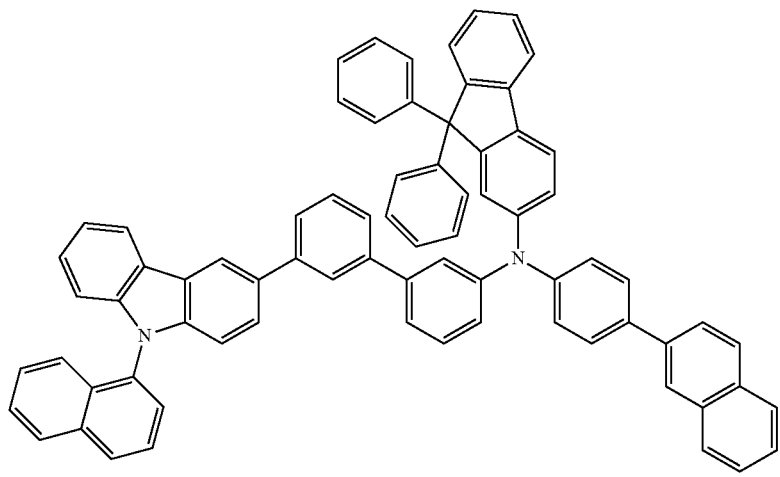

65
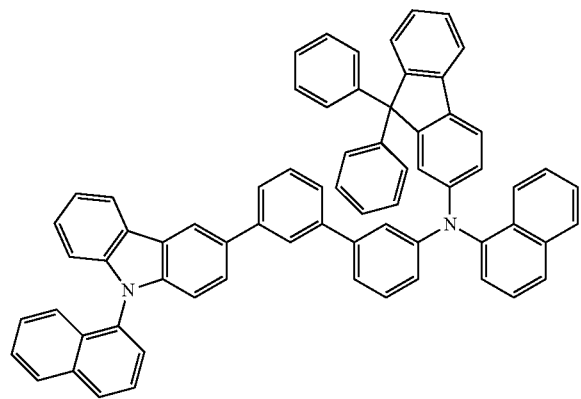
66
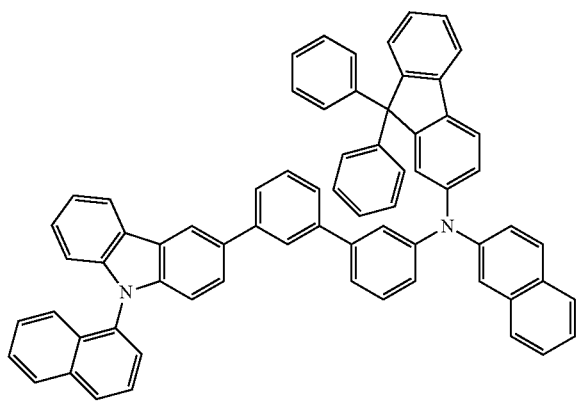
67
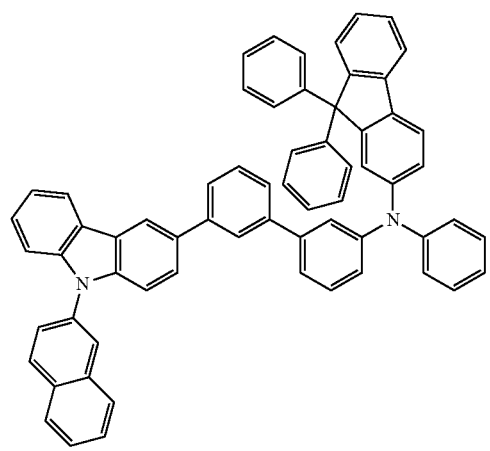
68
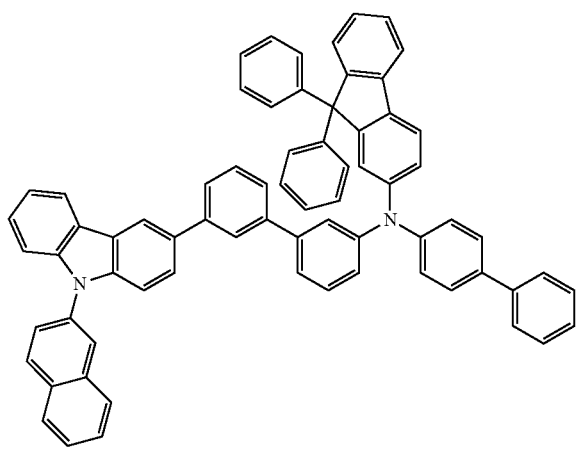
69
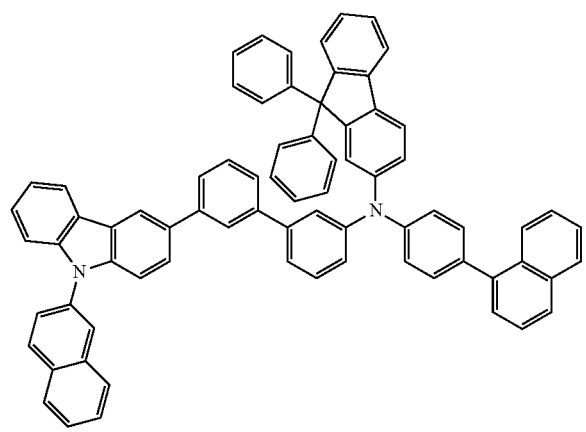
70
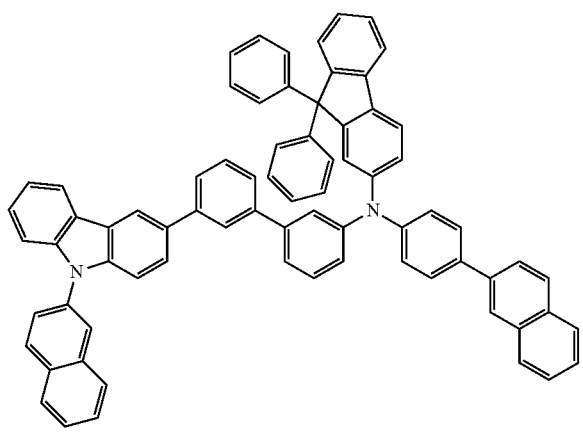

-continued
71
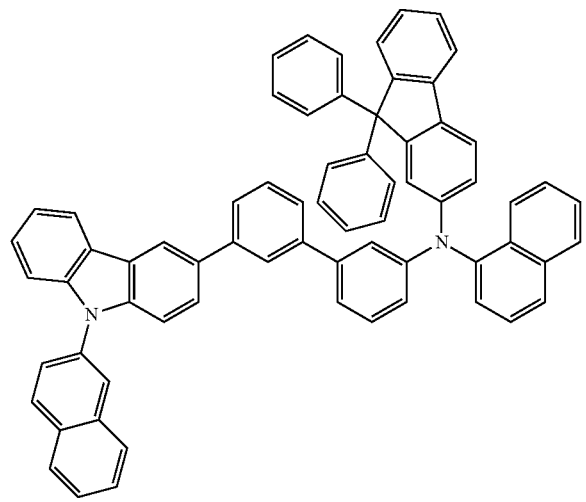
72
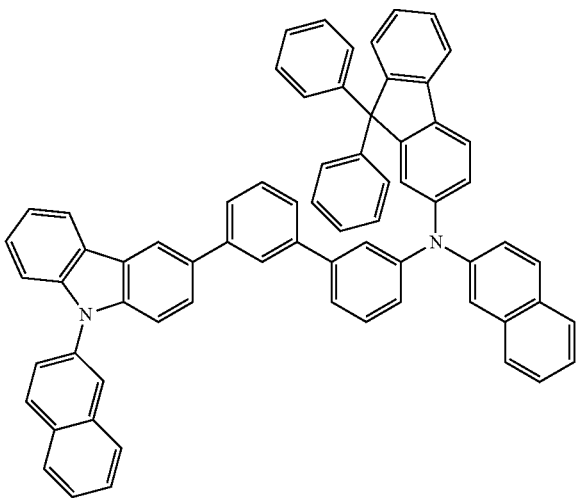
73
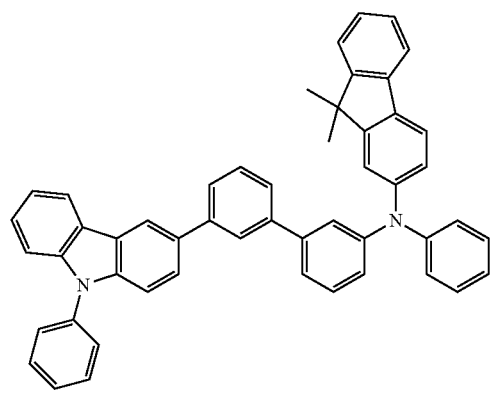
74
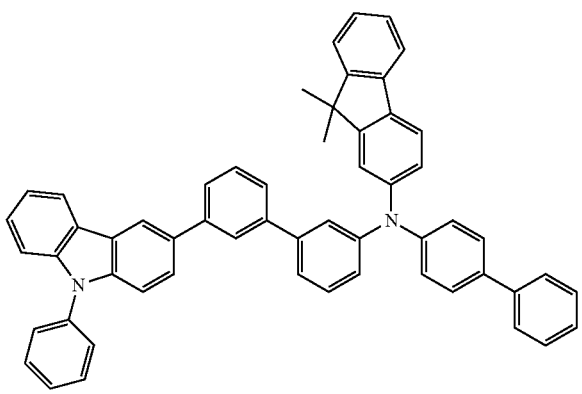
75
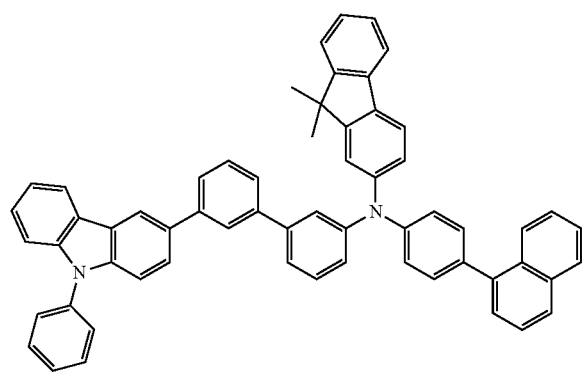
76
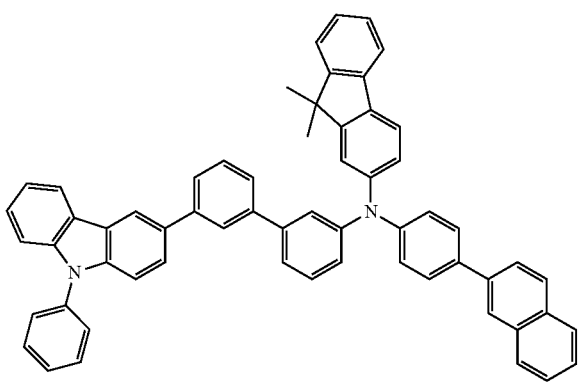

77
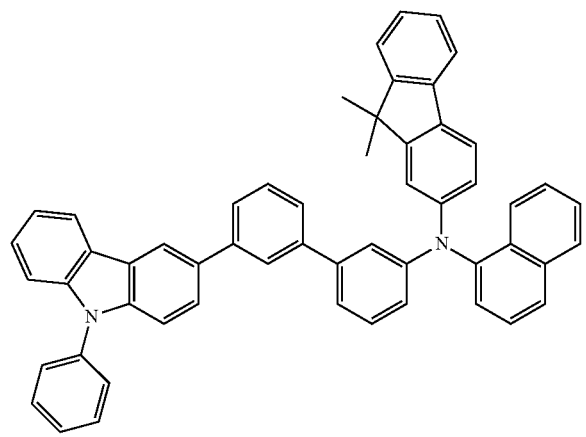
78
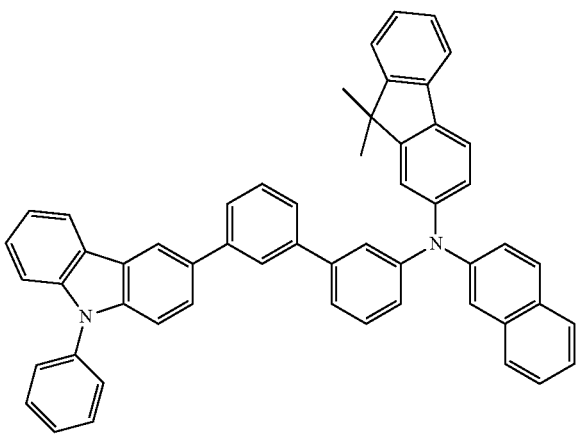
79
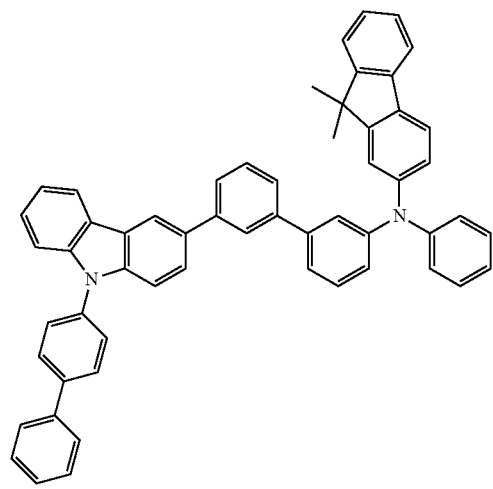
80
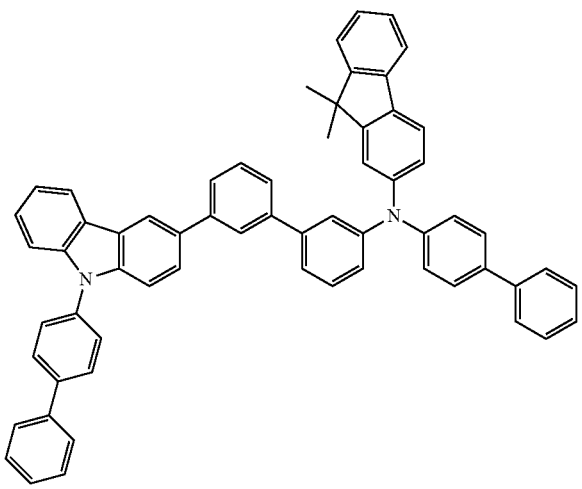
81
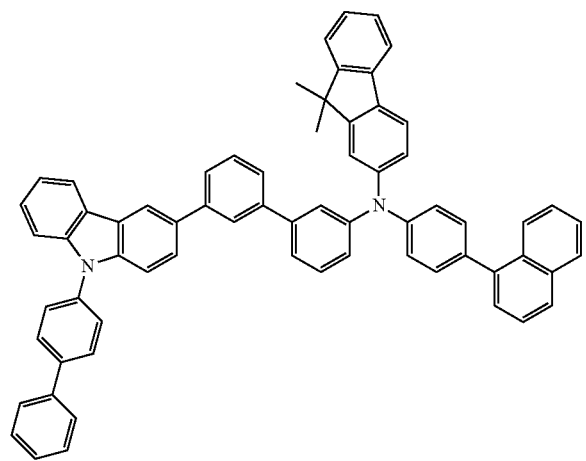
82
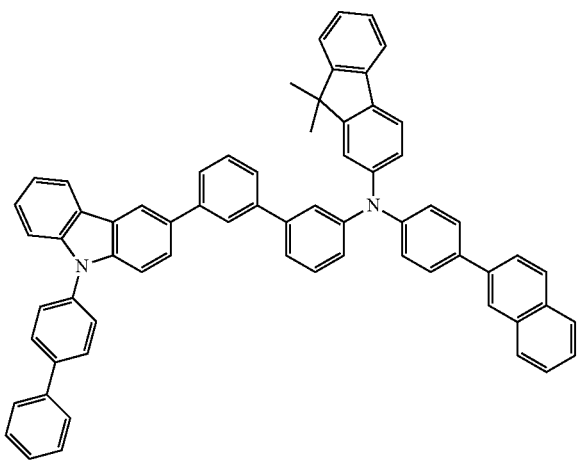

83
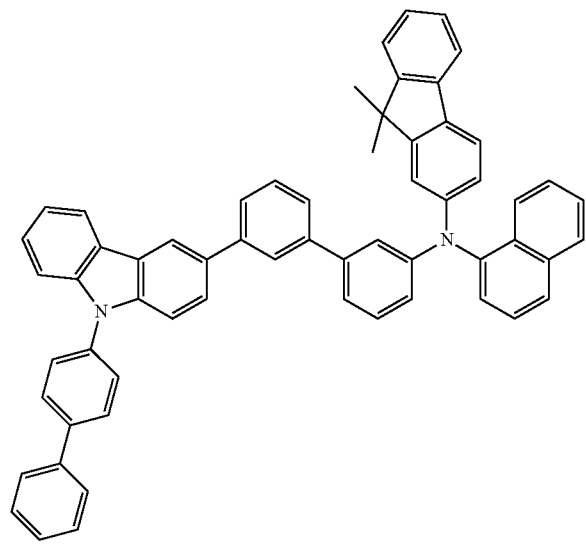
84
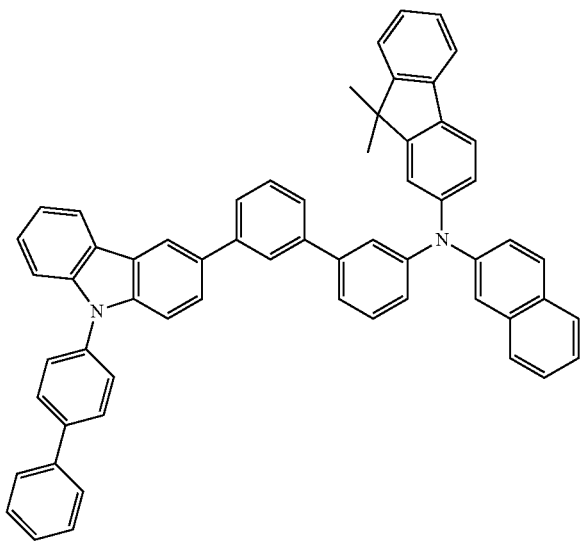
85
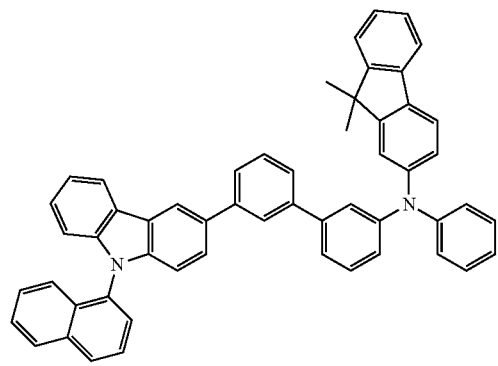
86
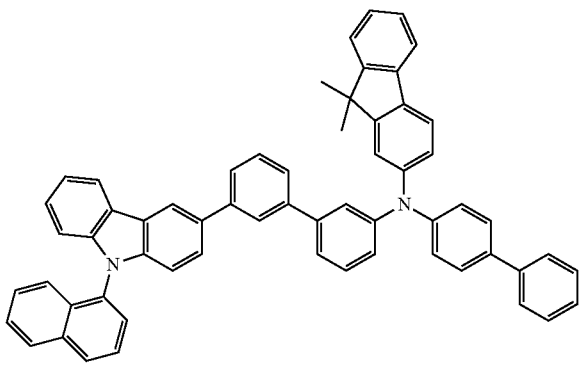
87
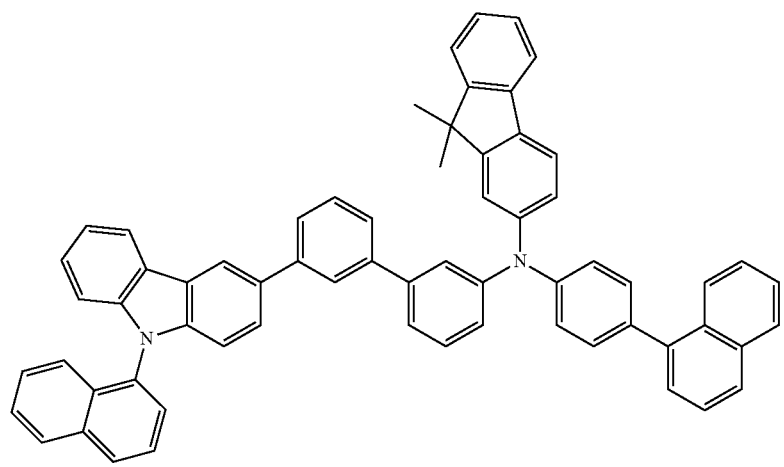

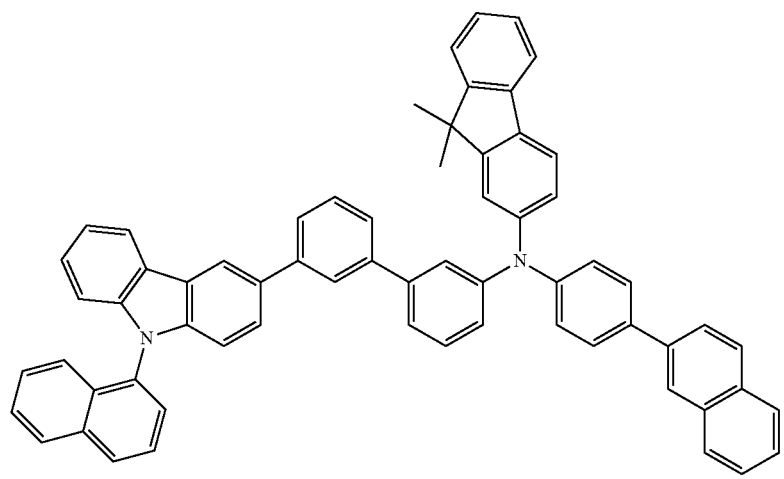
88
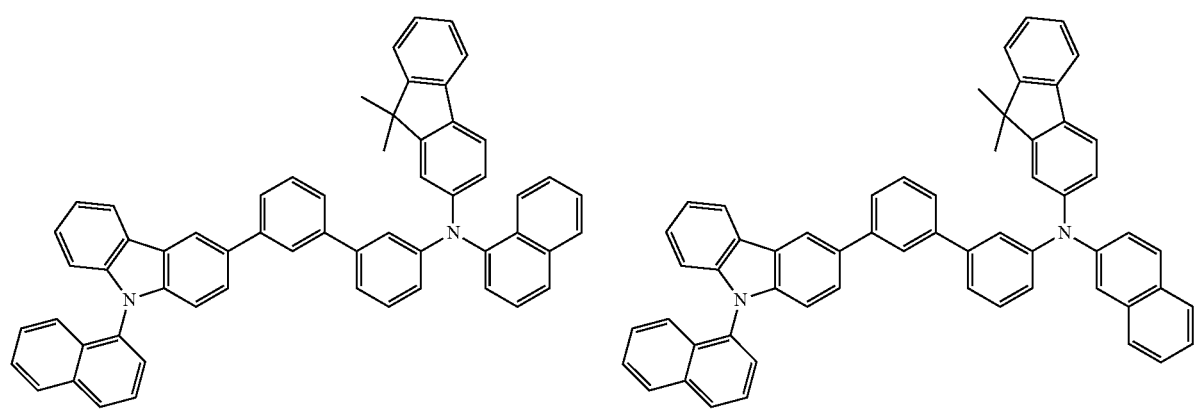
89 90
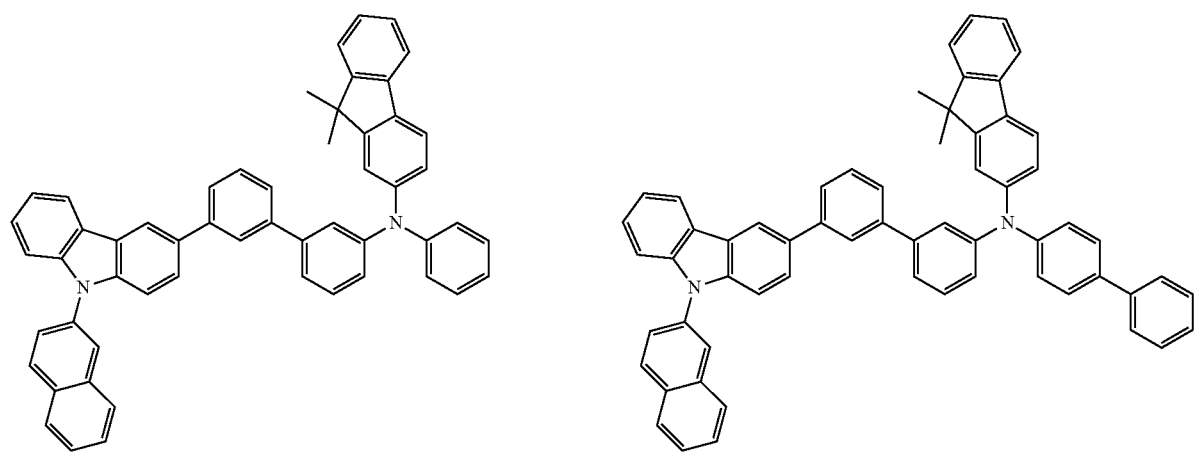
91 92

-continued

93

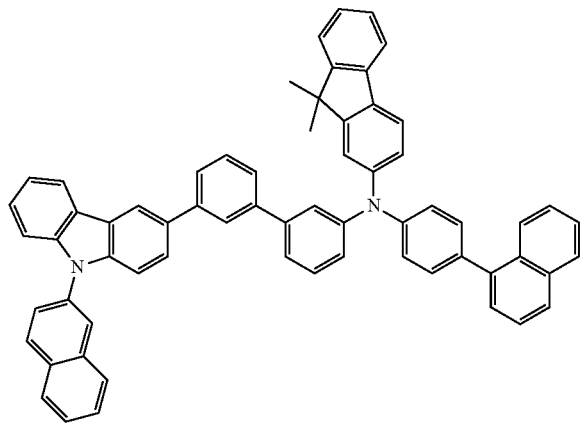

94

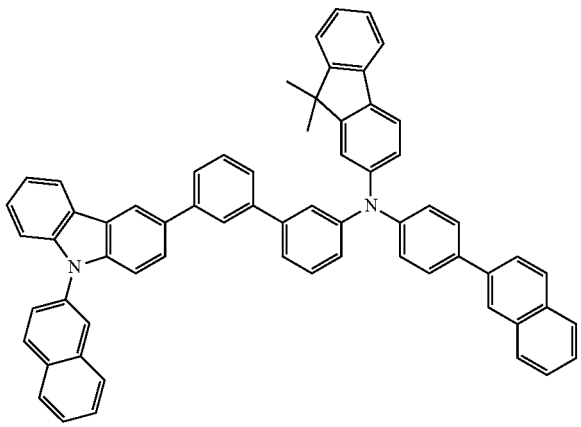

95

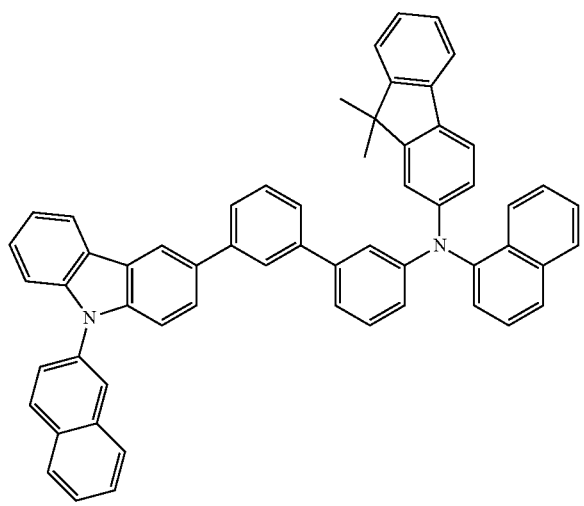

96

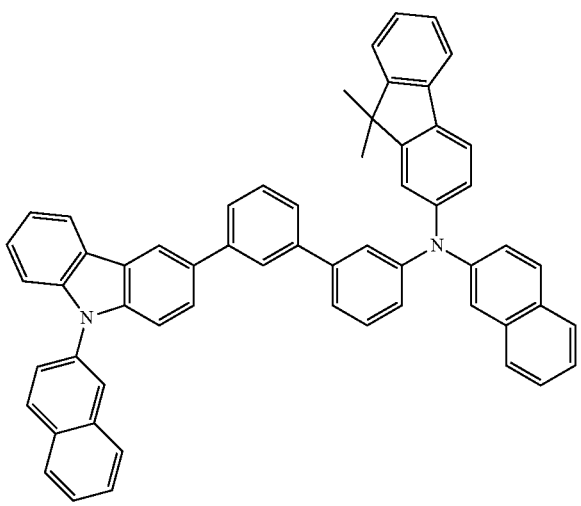

According to aspects of embodiments of the present invention, in Formulae 1 and 2, because a first benzene ring is bound to a carbazole-based ring at a first carbon in the first benzene ring, and is bound to a second benzene ring at a meta position of the first benzene ring, with respect to the first carbon (i.e. the second benzene ring and the carbazole-based ring are meta to one another about the first benzene ring, see Formula 1' and Formula 2', below), in contrast to a structure in which the second benzene ring and the carbazole-based ring are para to one another about the first benzene ring, a compound represented by Formula 1 or 2 may have lower HOMO energy levels (based on calculated values) and may have a decreased hole mobility. Accordingly, because hole mobility is typically faster than electron mobility, hole mobility and electron mobility may be balanced in an emission layer of an organic light-emitting diode having a hole transporting region, which includes a compound represented by Formula 1 or Formula 2, between an anode and the emission layer. In addition, leakage of electrons injected to a second electrode (cathode) from an emission layer to a hole transport layer may be prevented or reduced. Accordingly, when the compound represented by Formula 1 or Formula 2 is included in a hole transporting region of an organic light-emitting diode, the organic light-emitting diode may have improved efficiency and/or lifespan.

In Formula 1' and Formula 2' below, the first benzene ring and the second benzene ring described above are referred as "a first benzene" and "a second benzene", respectively.

<Formula 1'>

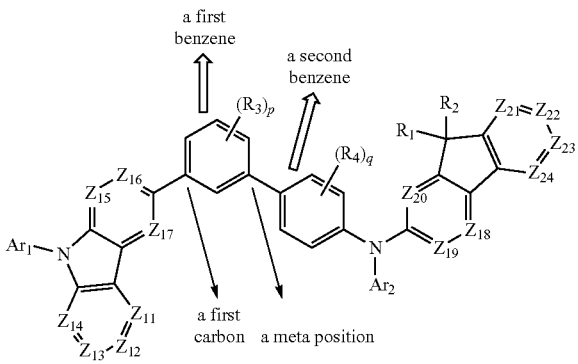

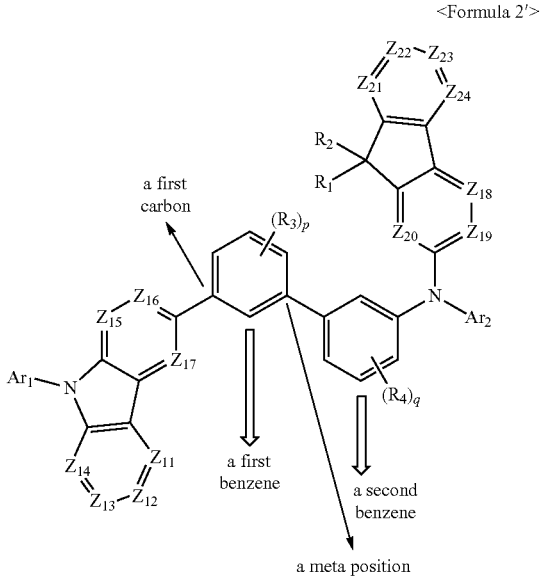

<Formula 2'>

Accordingly, an organic light-emitting diode including the amine-based compound represented by Formula 1 or 2 may have improved efficiency, brightness, and/or lifespan.

The amine-based compound represented by Formula 1 or 2 may be synthesized by referring to the following examples described later.

The amine-based compound of Formula 1 or Formula 2 may be used between a pair of electrodes of an organic light-emitting diode. For example, the amine-based compound may be used in at least one of a hole injection layer, a hole transport layer, and a functional layer having a hole injection capability and a hole transport capability.

Accordingly, in another embodiment, an organic light-emitting diode is provided including: a first electrode; a second electrode on the first electrode; and an organic layer between the first electrode and the second electrode, the organic layer including an emission layer and at least one amine-based compound represented by Formula 1 or Formula 2. For example, the organic layer may include one amine-based compound represented by Formula 1 or Formula 2, or may include two or more different amine-based compounds represented by Formula 1 and/or Formula 2.

For example, the organic layer may include only Compound 1 as the amine-based compound. By way of example, Compound 1 may be in a hole transport layer of the organic light-emitting diode. According to another embodiment of the present invention, the organic layer includes Compound 1 and Compound 2 as the at least one amine-based compound. In one embodiment, Compound 1 and Compound 2 may be in a same layer (for example, Compound 1 and Compound 2 both being in the hole transport layer), or in different layers (for example, Compound 1 being in the hole transport layer and Compound 2 being in the emission layer).

The organic layer may include a hole transporting region between the first electrode and the emission layer, the hole transporting region including at least one of a hole injection layer, a hole transport layer, a functional layer having a hole injection capability and a hole transport capability, a buffer layer, and an electron blocking layer.

The organic layer may further include an electron transporting region between the emission layer and the second electrode, the electron transporting region including at least one of a hole blocking layer, an electron transport layer, and an electron injection layer.

The amine-based compound may be in the hole transporting region. The hole transporting region may further include a p-dopant. The hole transporting region may include a hole transport layer that contains the amine-based compound.

The term "organic layer" as used herein may refer to a single layer or to a plurality of layers, between a first electrode and a second electrode of an organic light-emitting diode.

FIG. 1 is a schematic sectional view of an organic light-emitting diode 10 according to an embodiment of the present invention. Hereinafter, the structure of an organic light-emitting diode according to an embodiment of the present invention and a method of manufacturing the organic light-emitting diode 10, including an amine-based compound, according to an embodiment of the present invention are described in connection with FIG. 1.

A substrate 11, which may be any substrate suitable for use in OLEDs, and may be a glass substrate or a transparent plastic substrate with a suitable mechanical strength, thermal stability, transparency, surface smoothness, ease of handling, and/or water resistance.

A first electrode 13 may be formed by depositing or sputtering a material for the first electrode on the substrate 11. When the first electrode 13 is an anode, the material for the first electrode may be selected from materials with a high work function to ease hole injection. The first electrode 13 may be a reflective electrode or a transmission electrode. The material for the first electrode may be a transparent material with high conductivity, and examples of such a material include indium tin oxide (ITO), indium zinc oxide (IZO), tin oxide ($SnO_2$), and zinc oxide (ZnO). In embodiments in which magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may have a single-layer structure or a multi-layer structure including at least two layers. For example, the first electrode 13 may have a three-layered structure of ITO/Ag/ITO, but the structure of the first electrode 13 is not limited thereto.

The organic layer 15 (which may include one or more layers as already described above) may be on the first electrode 13.

For example, the organic layer 15 may include a hole injection layer, a hole transport layer, a buffer layer, an emission layer, an electron transport layer, and/or an electron injection layer.

A hole injection layer (HIL) may be formed on the first electrode 13 by using various suitable methods, such as vacuum deposition, spin coating, casting, and Langmuir-Blodgett (LB) deposition.

In embodiments in which the HIL is formed using vacuum deposition, vacuum deposition conditions may vary according to a compound that is used to form the HIL and a desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

In embodiments in which the HIL is formed using spin coating, the coating conditions may vary according to a compound that is used to form the HIL and a desired structure and thermal properties of the HIL to be formed. For example, the coating rate may be in a range of about 2000 rpm to about 5000 rpm, and a temperature at which heat treatment is performed to remove a solvent after coating may be in a range of about 80° C. to about 200° C. However, the coating conditions are not limited thereto.

According to some embodiments any material suitable for use as a hole injection material in an organic light-emitting diode may be used for the HIL. Examples of the hole injection material include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris (3-methylphenylphenylamino) triphenylamine (m-MTDATA) (shown below), N,N'-di(1-naphthyl)-N,N'-diphenylbenzidine (NPB), TDATA (shown below), 2-TNATA (shown below), polyaniline/dodecylbenzenesulfonic acid (pani/DBSA), poly(3,4-ethylenedioxythiophene)/poly(4-styrenesulfonate) (PEDOT/PSS), polyaniline/camphor sulfonic acid (pani/CSA), and (polyaniline)/poly(4-styrenesulfonate) (PANI/PSS), but are not limited thereto.

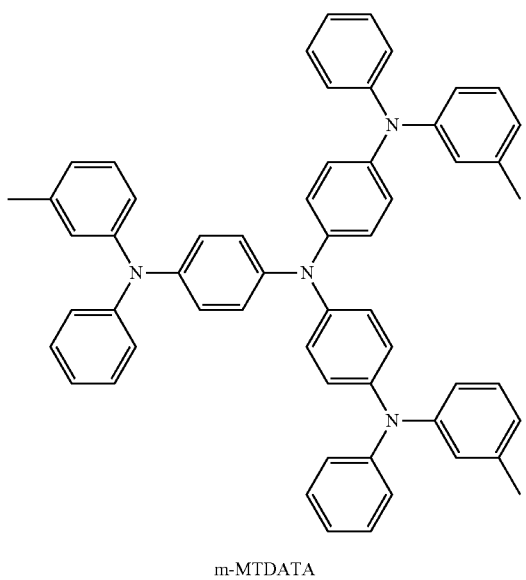

m-MTDATA

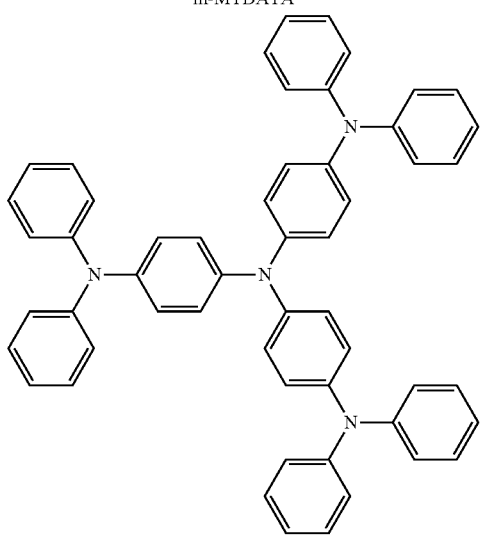

TDATA

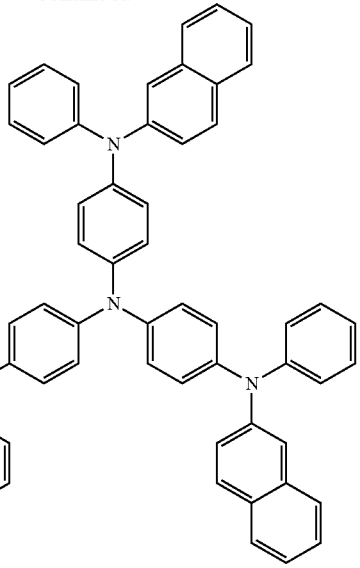

2-TNATA

In some embodiments, the HIL includes the amine-based compound represented by Formulae 1 or 2, however a material for forming the HIL is not limited thereto.

A thickness of the HIL may be in a range of about 100 Å to about 10000 Å, for example, about 100 Å to about 1000 Å. In embodiments in which the thickness of the HIL is within these ranges, the HIL may have good hole injection characteristics without a substantial increase in a driving voltage.

A hole transport layer (HTL) may be formed on the HIL by using vacuum deposition, spin coating, casting, LB deposition, or the like. In embodiments in which the HTL is formed using vacuum deposition or spin coating, the deposition and coating conditions may be similar to those for the formation of the HIL, though the deposition and coating conditions may vary according to a compound that is used to form the HTL.

As a hole transport material, the amine-based compound represented by Formulae 1 or 2 described above may be used.

A thickness of the HTL may be in a range of about 50 Å to about 20000 Å, for example, about 100 Å to about 1500 Å. In embodiments in which the thickness of the HTL is within these ranges, the HTL may have good hole transport characteristics without a substantial increase in a driving voltage.

A functional layer having a hole injection ability and a hole transport ability, also referred to herein as an "H-functional layer", may also be included in the organic layer. The H-functional layer may include one or more materials selected from the materials for the HIL and the materials for the HTL, but is not limited thereto. A thickness of the H-functional layer may be in a range of about 100 Å to about 10,000 Å, for example, about 100 Å to about 1,000 Å. In embodiments in which the thickness of the H-functional layer is within these ranges, the H-functional layer may have good hole injection and transport characteristics without a substantial increase in a driving voltage.

In some embodiments, the H-functional layer includes the amine-based compound represented by Formulae 1 or 2. However, a material for forming the H-functional layer is not limited thereto.

At least one of the HIL, HTL, and H-functional layer may further include a charge-generating material to increase conductivity of a layer, in addition to the hole injecting material, the hole transport material, and/or the material having both hole injection and hole transport capabilities as described above.

The charge-generating material may be, for example, a p-dopant. The p-dopant may be selected from quinine derivatives, metal oxides, and compounds with a cyano group, but is not limited thereto. Non-limiting examples of the p-dopant include a quinone derivative, such as tetracyanoquinonedimethane (TCNQ) or 2,3,5,6-tetrafluoro-tetracyano-1,4-benzoquinonedimethane (F4-TCNQ) (shown below); a metal oxide, such as tungsten oxide or molybdenium oxide; and a cyano group-containing compound, such as Compound 200 (shown below).

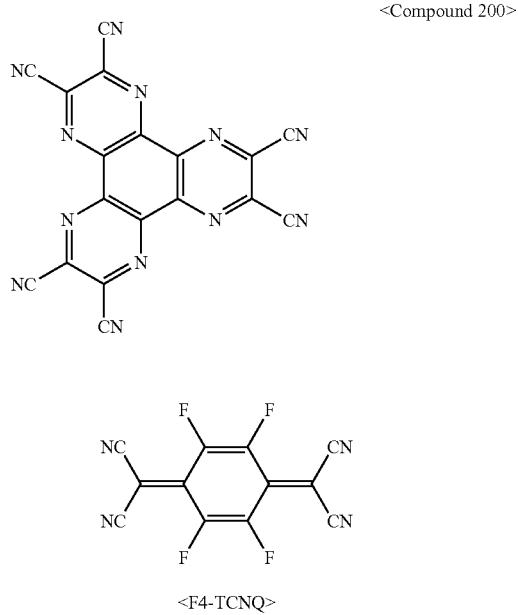 [SMILES: N#Cc1nc2c3nc(C#N)c(C#N)nc3c3nc(C#N)c(C#N)nc3c2nc1C#N ; N#CC(C#N)=c1c(F)c(F)c(=C(C#N)C#N)c(F)c1F]

In embodiments in which the hole injection layer, the hole transport layer, and/or the H-functional layer further include a charge-generating material, the charge-generating material may be homogeneously dispersed or non-homogeneously distributed in the hole injection layer, the hole transport layer, and/or the H-functional layer.

A buffer layer may be between the emission layer and at least one of the HIL, the HTL, and the H-functional layer. The buffer layer may compensate for an optical resonance distance of light according to a wavelength of the light emitted from the emission layer, and thus may increase efficiency. The buffer layer may include any hole injecting materials or hole transporting materials suitable for use in an organic light-emitting diode. In some embodiments, the buffer layer includes a same material as those included in the HIL, HTL, and/or H-functional layer.

The emission layer (EML) may be formed on the HTL, the H-functional layer, or the buffer layer by vacuum deposition, spin coating, casting, LB deposition, or the like. In embodiments in which the EML is formed using vacuum deposition or spin coating, the deposition and coating conditions may be similar to those for the formation of the HIL, though the conditions for deposition and coating may vary according to a material that is used to form the EML.

The EML may include a host and a dopant. The dopant may include a fluorescent dopant and/or a phosphorescent dopant. For example, the phosphorescent dopant may include an organometallic complex including iridium (Ir), platinum (Pt), osmium (Os), titanium (Ti), zirconium (Zr), hafnium (Hf), europium (Eu), terbium (Tb), or thulium (Tm).

In embodiments in which the organic light-emitting diode is a full color organic light-emitting diode, the EML may be patterned into a red EML, a green EML, and a blue EML. According to another embodiment of the present invention, the EML includes a stack structure of two or more of a red EML, a green EML, and a blue EML to emit white light. However, the structure of the EML is not limited thereto.

At least one of the red EML, the green EML, and the blue EML may include one or more dopants such as those illustrated below (ppy=phenylpyridine).

For example, the compounds illustrated below may be used as a blue dopant, but the blue dopant is not limited thereto:

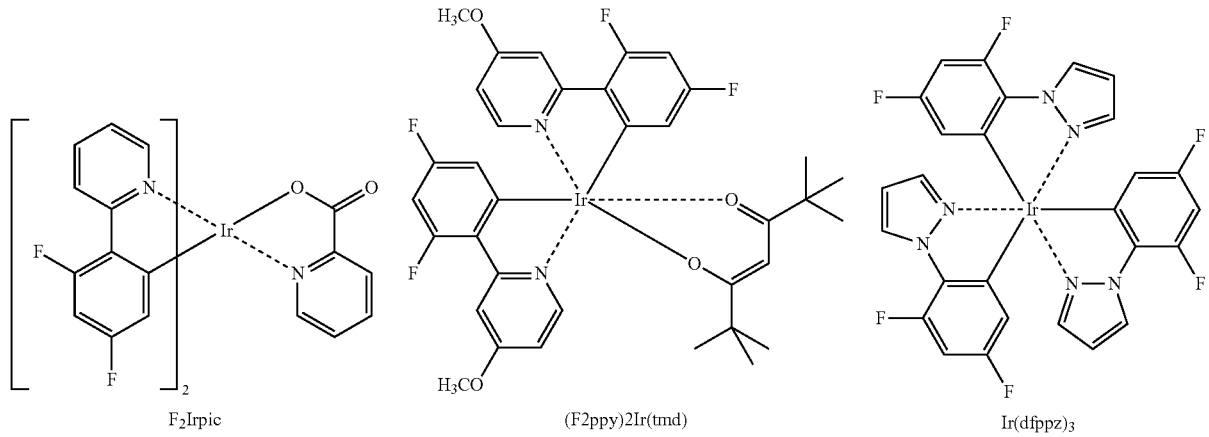

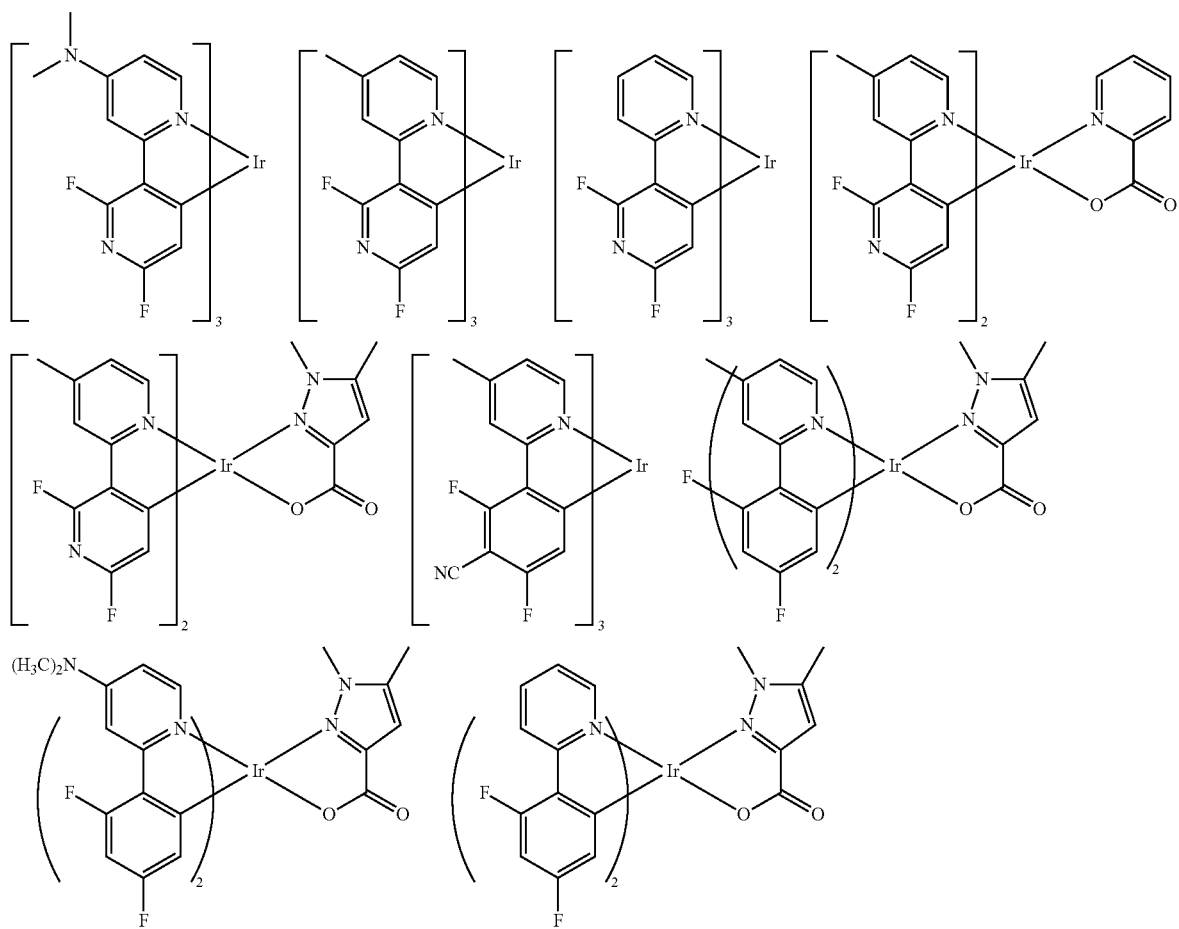
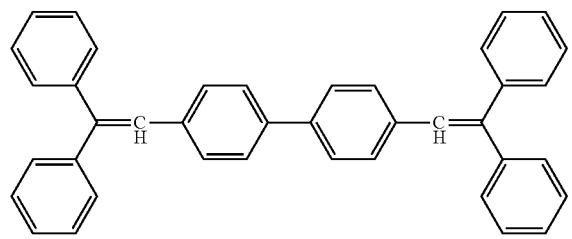
DPVBi
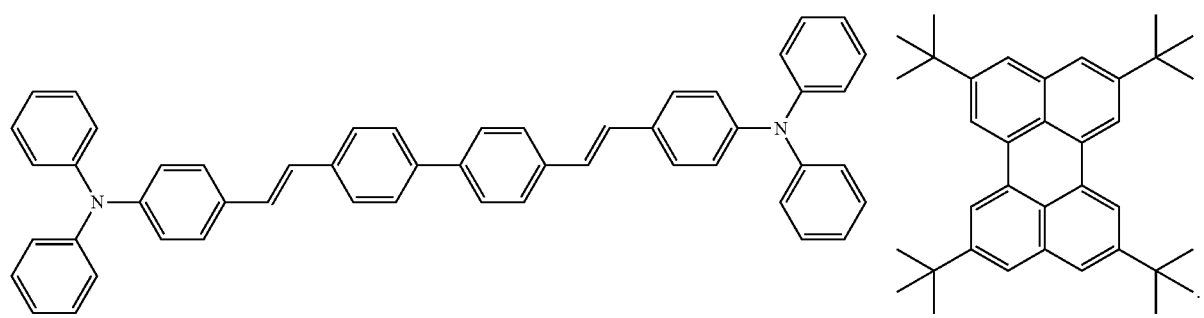
DPAVBi
TBPe

As a further example, the compounds illustrated below may be used as a red dopant, but the red dopant is not limited thereto. For example, DCM or DCJTB may be used as the red dopant.
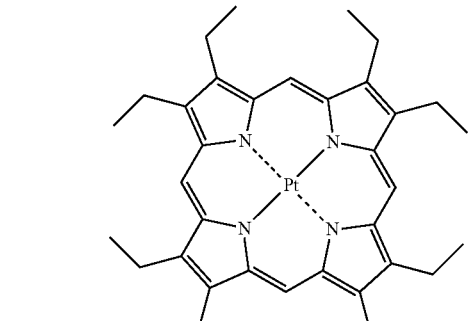
PtOEP
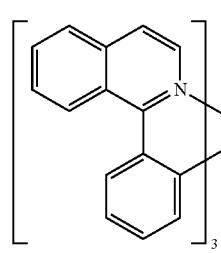
Ir(piq)₃
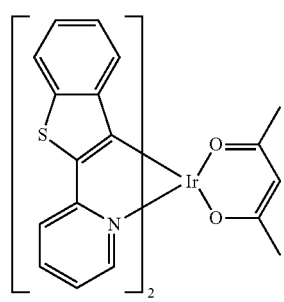
Btp₂Ir(acac)
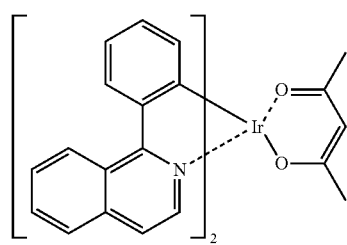
Ir(piq)₂(acac)
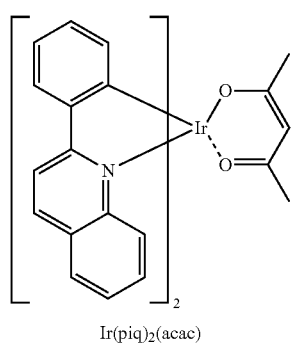
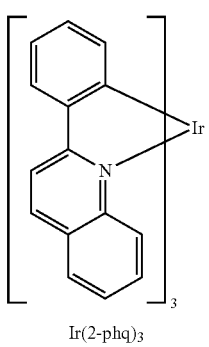
Ir(2-phq)₃
-continued
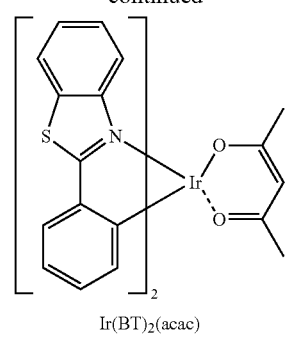
Ir(BT)₂(acac)
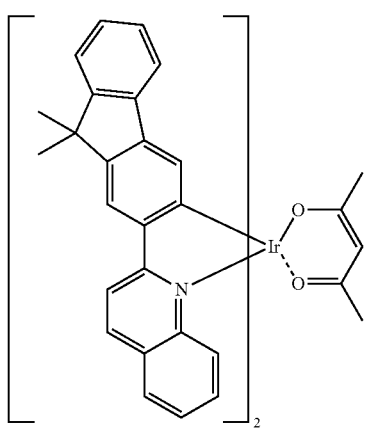
Ir(flq)₂(acac)
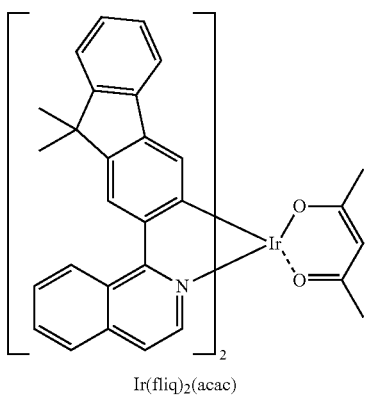
Ir(fliq)₂(acac)
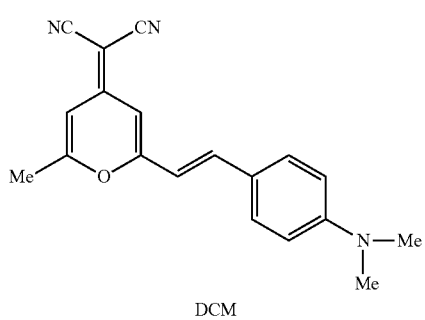
DCM

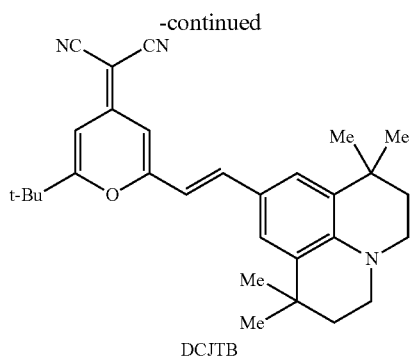
DCJTB
As a further example, the compounds illustrated below may be used as a green dopant, but the green dopant is not limited thereto. For example, C545T may be used as the green dopant.
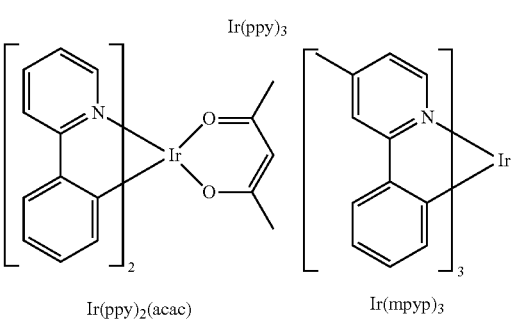
Ir(ppy)₃
Ir(ppy)₂(acac)        Ir(mpyp)₃
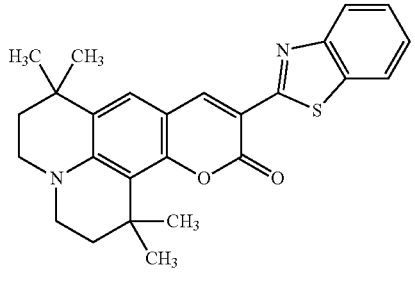
C545T
Additional examples of dopants that may be included in the EML include complexes such as those illustrated below, but are not limited thereto:
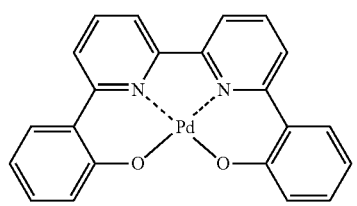
D1
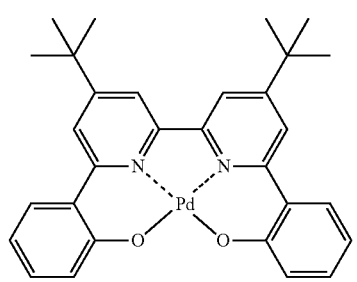
D2
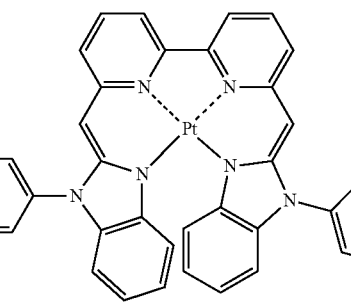
D3
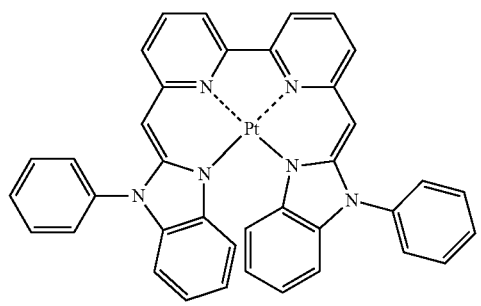
D4
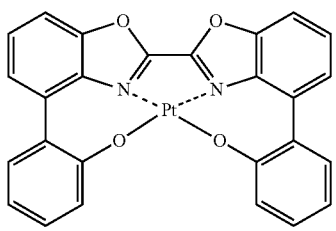
D5
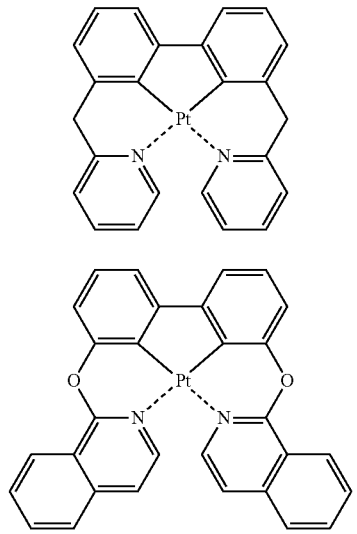
D6

-continued
D7
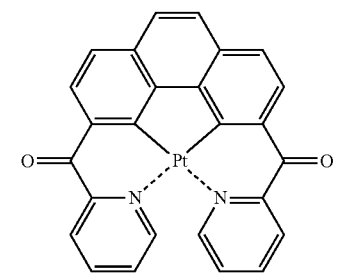
D8
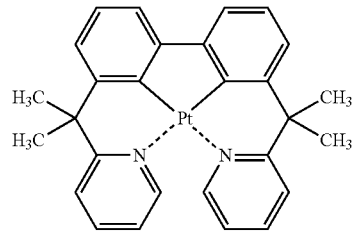
D9
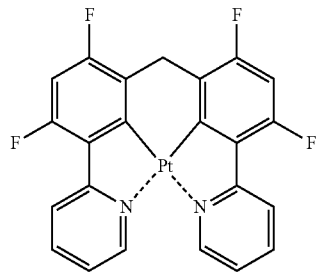
D10
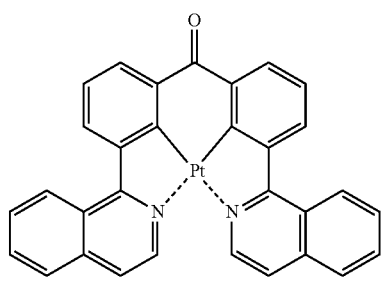
D11
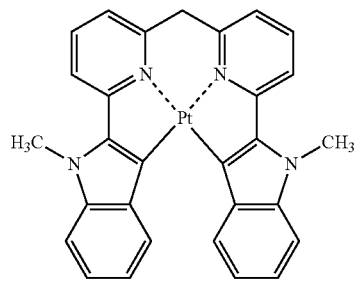
D12
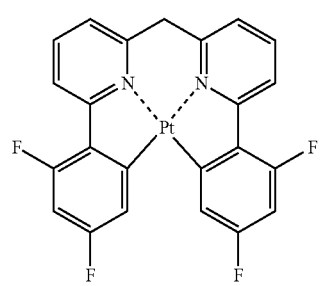
-continued
D13
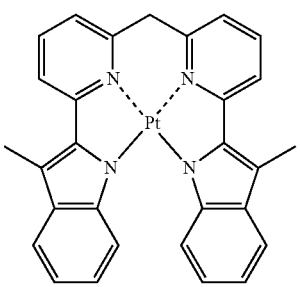
D14
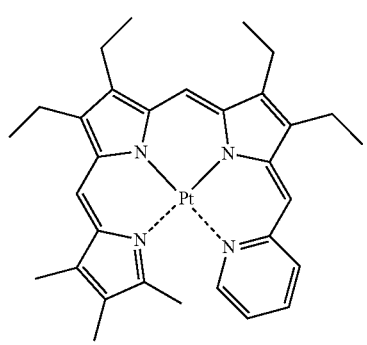
D15
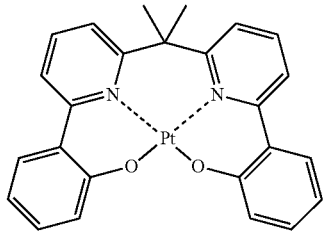
D16
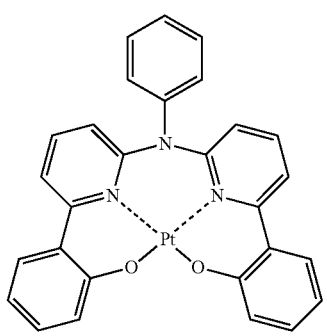
D17
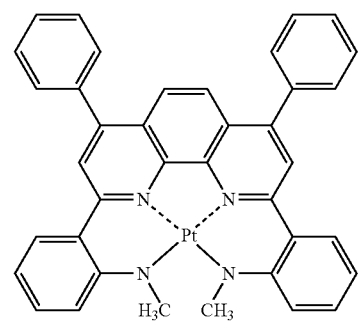

D18 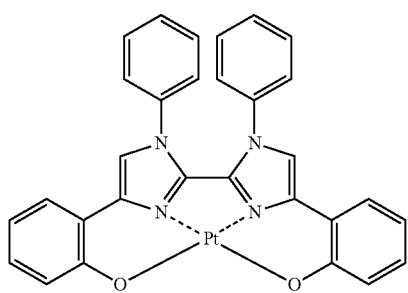
D19 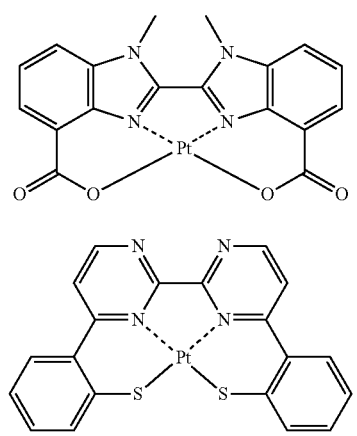
D20 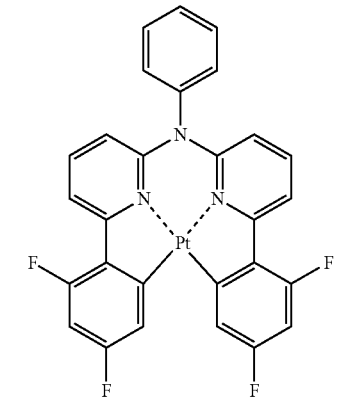
D21 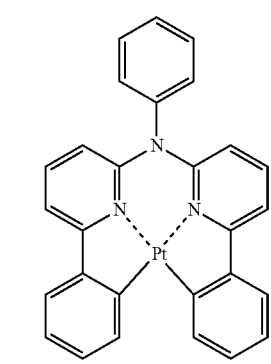
D22
D23 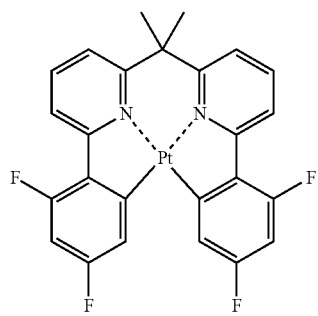
D24 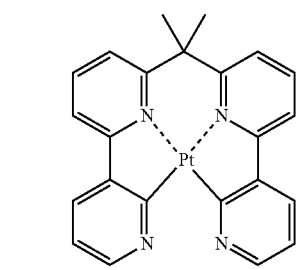
D25 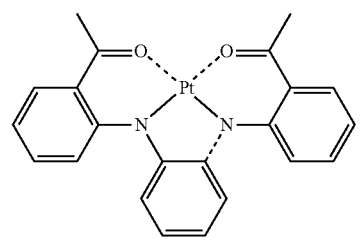
D26 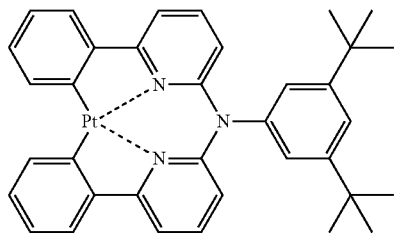
D27 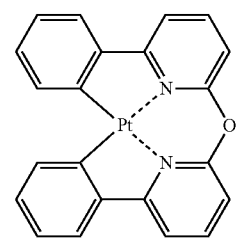
D28 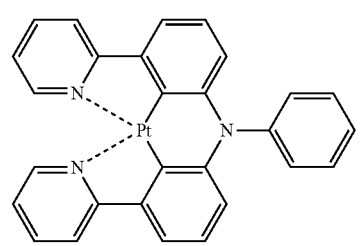

D29 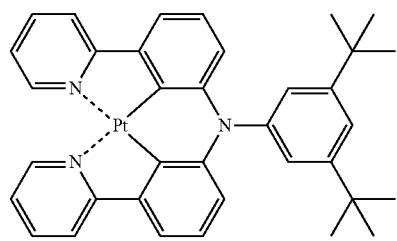
D30 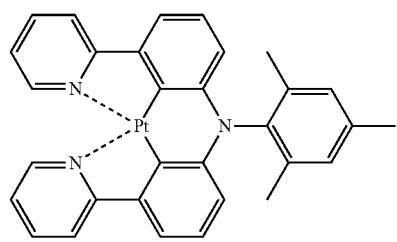
D31 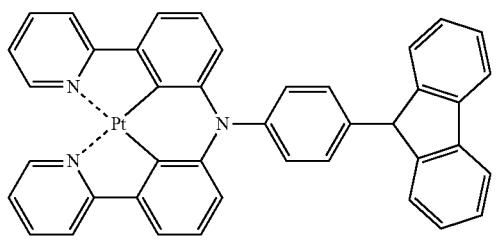
D32 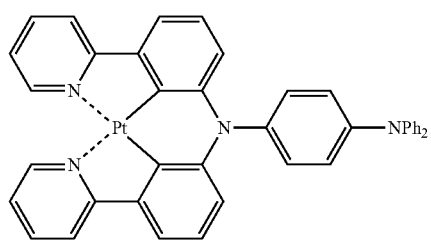
D33 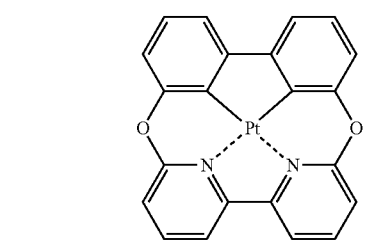
D34 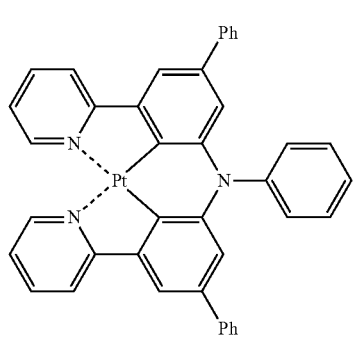
D35 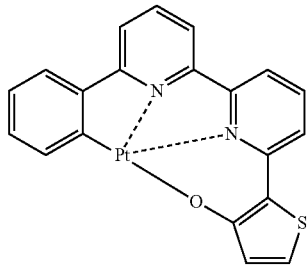
D36 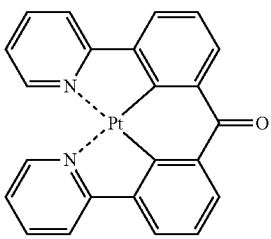
D37 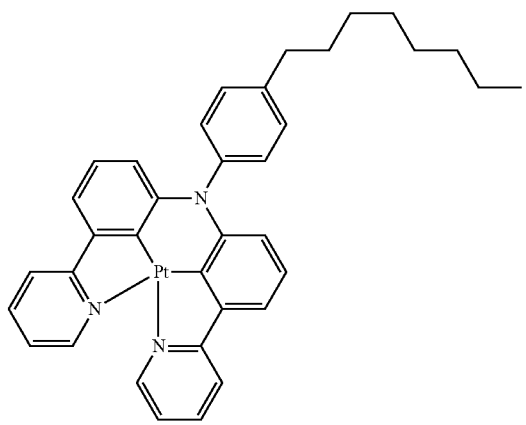
D38 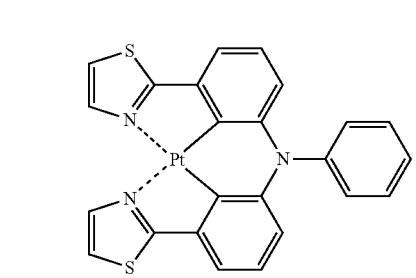
D39 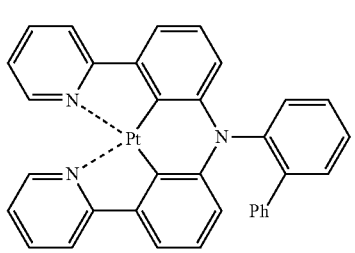

D40
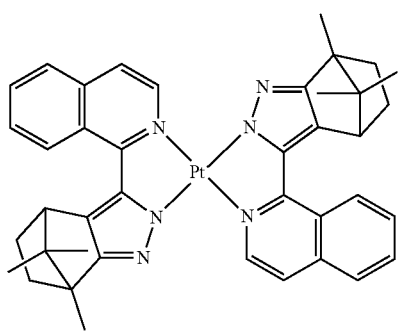
D41
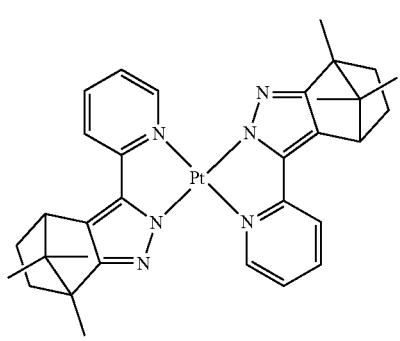
D42
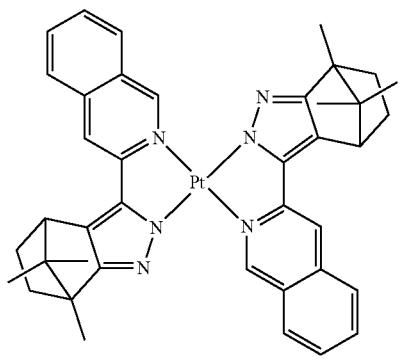
D43
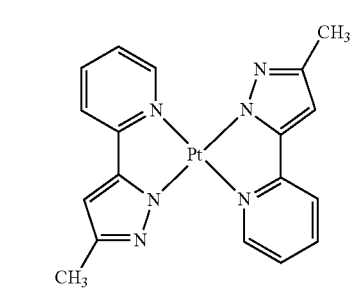
D44
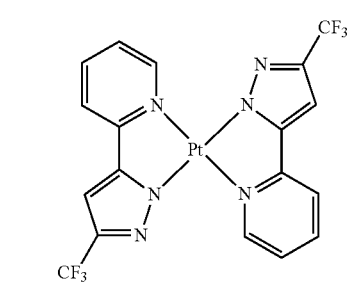
D45
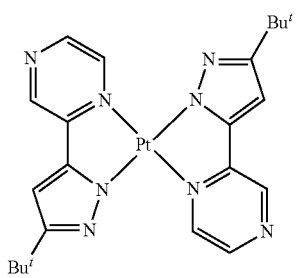
D46
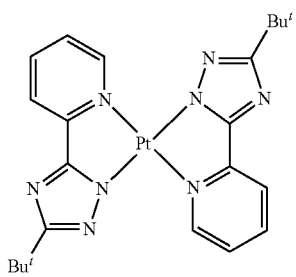
D47
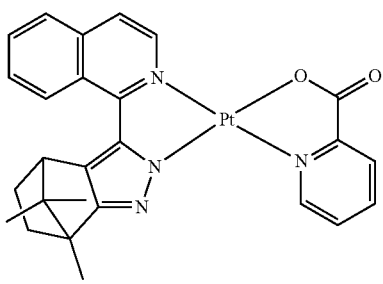
D48
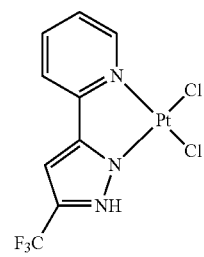
D49
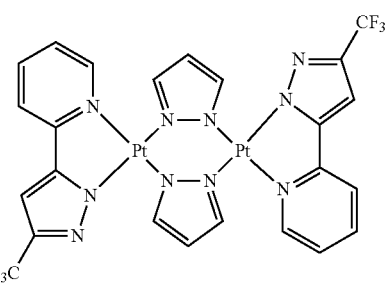

-continued

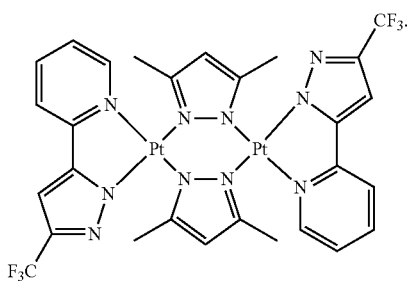

D50

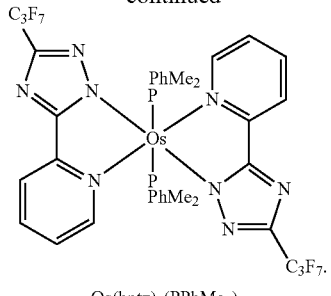

Os(hptz)₂(PPhMe₂)₂

Additional non-limiting examples of dopants that may be included in the EML include the Pt complexes illustrated below:

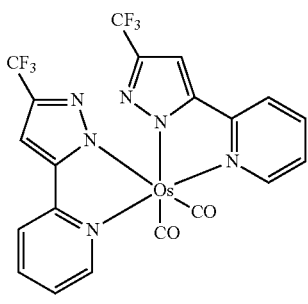

Os(fppz)₂(CO)₂

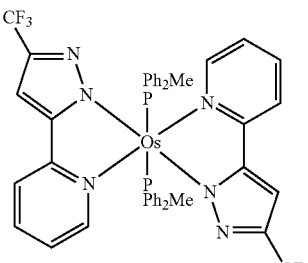

Os(fppz)₂(PPh₂Me)₂

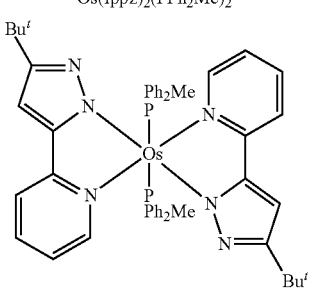

Os(bppz)₂(PPh₃)₂

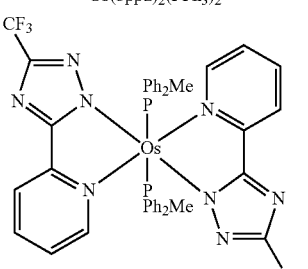

Os(fptz)₂(PPh₂Me)₂

In embodiments in which the EML includes both a host and a dopant, an amount of the dopant may be from about 0.01 parts to about 15 parts by weight based on 100 parts by weight of the host. However, the amount of the dopant is not limited to this range.

A thickness of the EML may be in a range of about 100 Å to about 10,000 Å, for example, about 200 Å to about 600 Å. In embodiments in which the thickness of the EML is within these ranges, the EML may have improved light emitting ability without a substantial increase in driving voltage.

An electron transport layer (ETL) may be formed on the EML using various methods. Examples include vacuum deposition, spin coating, casting, and the like. In embodiments in which the ETL is formed using vacuum deposition or spin coating, the deposition and coating conditions may be similar to those for the formation of the HIL, though the conditions for deposition and coating may vary according to a material that is used to form the ETL. The material used for the ETL may be any one of various electron transporting materials suitable to stably transport electrons injected from an electron injection electrode (cathode). Non-limiting examples of the material for the ETL include a quinoline derivative, tris(8-quinolinolate)aluminum (Alq3), TAZ, Balq, beryllium bis(benzoquinolin-10-olate) (Bebq2), and ADN (some of which are shown below), as well as Compound 201 and Compound 202 below.

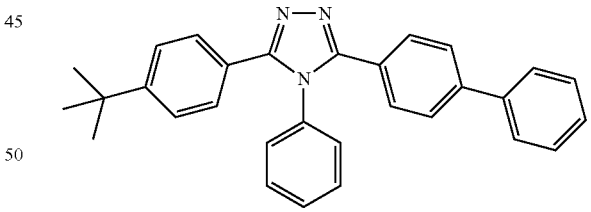

TAZ

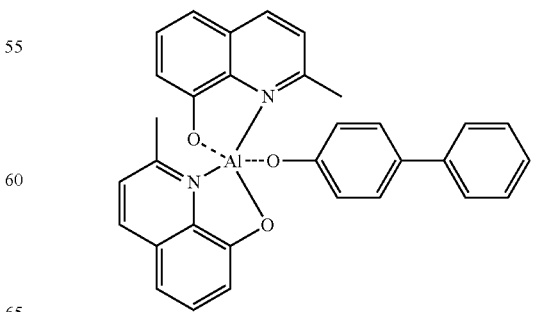

BAlq

<Compound 201>

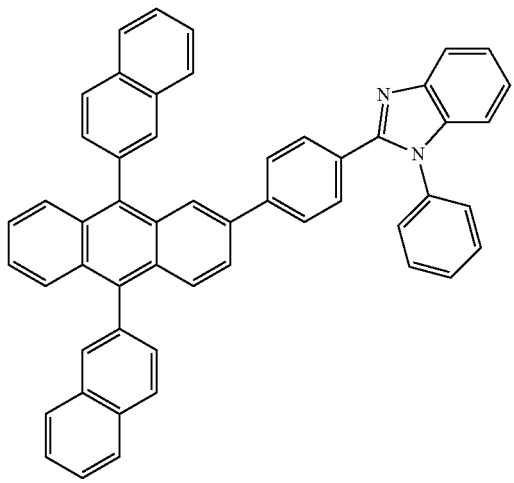

<Compound 202>

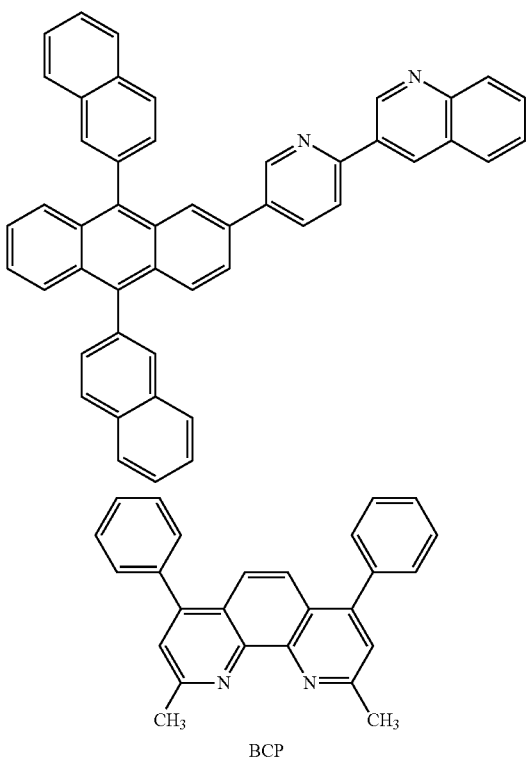

BCP

<Compound 203>

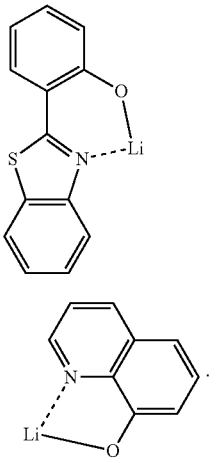

<LiQ>

A thickness of the ETL may be in a range of about 100 Å to about 1000 Å, for example, about 150 Å to about 500 Å. In embodiments in which the thickness of the ETL is within these ranges, the ETL may have good electron transporting ability without a substantial increase in driving voltage.

The ETL may further include a metal-containing material, in addition to an electron transporting inorganic material.

The metal-containing material may include a lithium (Li) complex. Non-limiting examples of the Li complex include lithium quinolate (LiQ) and Compound 203 below:

An EIL, which in some embodiments facilitates injection of electrons from the cathode, may be formed on the ETL. Any suitable electron-injecting material may be used to form the EIL.

Non-limiting examples of materials for forming the EIL include LiF, NaCl, CsF, $Li_2O$, and BaO. The deposition conditions of the EIL may be similar to those used to form the HIL, although the deposition conditions may vary according to a material that is used to form the EIL.

A thickness of the EIL may be in a range of about 1 Å to about 100 Å, for example, about 3 Å to about 90 Å. In embodiments in which the thickness of the EIL is within these ranges, the EIL may have good electron injection ability without a substantial increase in driving voltage.

A second electrode 17 is disposed on the organic layer 15. The second electrode 17 may be a cathode, which is an electron injection electrode. A metal for forming the second electrode may be a metal, an alloy, an electrically conductive compound, which all have a low-work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

An organic light-emitting diode according to an embodiment of the present invention has been described herein with reference to FIG. 1. However, the organic light-emitting diode is not limited thereto.

In addition, in embodiments in which a phosphorescent dopant is used in the EML, a triplet exciton or a hole may diffuse to an electron transport layer. To prevent or reduce the diffusion, a hole blocking layer (HBL) may be formed between the ETL and the EML by vacuum deposition, spin coating, casting, LB deposition, or the like. In embodiments in which the HBL is formed using vacuum deposition or spin coating, the deposition and coating conditions may be similar to those for the formation of the HIL, though the conditions for deposition and coating may vary according to the material that is used to form the HBL. Any hole-blocking material suitable for use in an organic light-emitting diode may be used. Non-limiting examples of hole-blocking materials include oxadiazole derivatives, triazole derivatives, and phenanthroline derivatives. For example, BCP illustrated below may be used as the hole-blocking material.

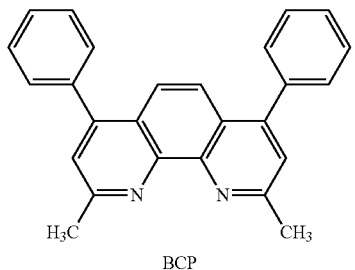

BCP

A thickness of the HBL may be in a range of about 20 Å to about 1000 Å, for example, about 30 Å to about 300 Å. In embodiments in which the thickness of the HBL is within these ranges, the HBL may have improved hole blocking ability without a substantial increase in driving voltage.

The groups described above in connection with Formulae 1, 2, 1A, and 2A (e.g. $Z_{11}$—$Z_{24}$, $R_1$ to $R_4$, $R_{11}$ to $R_{24}$, $Ar_1$, $Ar_2$, p, and q) are described here in more detail.

The unsubstituted $C_1$-$C_{60}$ alkyl group (or $C_1$-$C_{60}$ alkyl group) as used herein may refer to a $C_1$-$C_{60}$ linear or branched alkyl group, such as methyl, ethyl, propyl, isobutyl, sec-butyl, pentyl, iso-amyl, or hexyl, and the substituted $C_1$-$C_{60}$ alkyl group may refer to a group in which at least one hydrogen of the unsubstituted $C_1$-$C_{60}$ alkyl group is substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, a $C_2$-$C_{60}$ heteroaryl group, —N($Q_{11}$)($Q_{12}$), —Si($Q_{13}$)($Q_{14}$)($Q_{15}$) and B($Q_{16}$)($Q_{17}$). $Q_{11}$ to $Q_{17}$ are each independently selected from a hydrogen atom, a $C_1$-$C_{60}$ alkyl group, a $C_2$-a $C_{60}$ alkenyl group, a $C_2$-a $C_{60}$ alkynyl group, a $C_6$-a $C_{60}$ aryl group, and a $C_2$-a $C_{60}$ heteroaryl group.

The unsubstituted $C_1$-$C_{60}$ alkoxy group (or $C_1$-$C_{60}$ alkoxy group) as used herein has a formula of —OA (where A is the unsubstituted $C_1$-$C_{60}$ alkyl group described above), examples of which include methoxy, ethoxy, and isopropyloxy. The substituted $C_1$-$C_{60}$ alkoxy group may refer to a group in which at least one hydrogen atom of the unsubstituted $C_1$-$C_{60}$ alkoxy group is substituted with at least one of the substituents already described above in connection with the substituted $C_1$-$C_{60}$ alkyl group.

The unsubstituted $C_2$-$C_{60}$ alkenyl group (or $C_2$-$C_{60}$ alkenyl group) as used herein may refer to an unsubstituted $C_2$-$C_{60}$ alkyl group having one or more carbon-carbon double bonds at one or more positions along a carbon chain of the unsubstituted $C_2$-$C_{60}$ alkyl group. For example, the unsubstituted $C_2$-$C_{60}$ alkenyl group may include a terminal alkene and/or an internal alkene. Examples of the unsubstituted $C_2$-$C_{60}$ alkenyl group include ethenyl, propenyl, and butenyl. The substituted $C_2$-$C_{60}$ alkenyl group, may refer to a group in which at least one hydrogen atom of the unsubstituted $C_2$-$C_{60}$ alkenyl group is substituted with at least one of the substituents already described above in connection with the substituted $C_1$-$C_{60}$ alkyl group.

The unsubstituted $C_2$-$C_{60}$ alkynyl group (or $C_2$-$C_{60}$ alkynyl group) as used herein may refer to an unsubstituted $C_2$-$C_{60}$ alkyl group having one or more carbon-carbon triple bonds at one or more positions along a carbon chain of the unsubstituted $C_2$-$C_{60}$ alkyl group. For example, the unsubstituted $C_2$-$C_{60}$ alkynyl group may include a terminal alkyne and/or an internal alkyne. Examples of the unsubstituted $C_2$-$C_{60}$ alkynyl group include ethynyl, propynyl, and the like. The substituted $C_2$-$C_{60}$ alkynyl group, may refer to a group in which at least one hydrogen atom of the $C_2$-$C_{60}$ alkynyl group is substituted with at least one of the substituents already described above in connection with the substituted $C_1$-$C_{60}$ alkyl group.

The unsubstituted $C_6$-$C_{60}$ aryl group may refer to a monovalent group having a carbocyclic aromatic system having 6 to 60 carbon atoms, including at least one aromatic ring.

The unsubstituted $C_6$-$C_{60}$ arylene group may refer to a divalent group having a carbocyclic aromatic system having 6 to 60 carbon atoms, including at least one aromatic ring.

In embodiments in which the aryl group or the arylene group includes two or more rings, the rings may be fused to each other. The substituted $C_6$-$C_{60}$ aryl group and the substituted $C_6$-$C_{60}$ arylene group may each refer to a group in which at least one hydrogen atom of the $C_6$-$C_{60}$ aryl group and the $C_6$-$C_{60}$ arylene group, respectively, are substituted with at least one of the substituents already described above in connection with the substituted $C_1$-$C_{60}$ alkyl group.

Non-limiting examples of the substituted and unsubstituted $C_6$-$C_{60}$ aryl group include a phenyl group, a $C_1$-$C_{10}$ alkylphenyl group (for example, an ethylphenyl group), a $C_1$-$C_{10}$ alkylbiphenyl group (for example, an ethylbiphenyl group), a halophenyl group (for example, an o-, m- or p-fluorophenyl group or a dichlorophenyl group), a dicyanophenyl group, a trifluoromethoxyphenyl group, an o-, m-, or p-tolyl group, an o-, m- or p-cumenyl group, a mesityl group, a phenoxyphenyl group, an ($\alpha,\alpha$-dimethylbenzene) phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azrenyl group, a heptalenyl group, an acenaphthylenyl group, a phenalenyl group, a fluorenyl group, an anthraquinolinyl group, a methylanthracenyl group, a phenanthracenyl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group. Examples of the substituted $C_6$-$C_{60}$ aryl group may be further understood by referring to the examples of the unsubstituted $C_6$-$C_{60}$ aryl group and the substituents described above in connection with the substituted $C_1$-$C_{60}$ alkyl group, with which the $C_6$-$C_{60}$ aryl group may be substituted. Examples of the substituted or unsubstituted $C_5$-$C_{60}$ arylene group may be further understood by referring to examples of the substituted or unsubstituted $C_6$-$C_{60}$ aryl group.

The unsubstituted $C_2$-$C_{60}$ heteroaryl group as used herein may refer to a monovalent group including one or more aromatic rings having at least one heteroatom selected from nitrogen (N), oxygen (O), phosphorous (P), and sulfur (S) in the ring, with carbon atoms as the remaining ring atoms. The unsubstituted $C_2$-$C_{60}$ heteroarylene group as used herein may refer to a divalent group including one or more aromatic rings having at least one heteroatom selected from nitrogen (N), oxygen (O), phosphorous (P), and sulfur (S) in the ring, with carbon atoms as the remaining ring atoms. In embodiments in which the $C_2$-$C_{60}$ heteroaryl group or the $C_2$-$C_{60}$ heteroarylene group includes two or more rings, the rings may be fused to each other. The substituted $C_2$-$C_{60}$ heteroaryl group and the substituted $C_2$-$C_{60}$ heteroarylene group may each refer to a group in which at least one hydrogen atom of the $C_2$-$C_{60}$ heteroaryl group and the $C_2$-$C_{60}$ heteroarylene group, respectively, is substituted with one or more of the substituents already described in connection with the $C_1$-$C_{60}$ alkyl group.

Examples of the unsubstituted $C_2$-$C_{60}$ heteroaryl group include a pyrazolyl group, an imidazolyl group, a oxazolyl group, a thiazolyl group, a triazolyl group, tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoin imidazolyl group, an imidazo pyridinyl group, and an imidazo pyrimidinyl group. Examples of the substituted and unsubstituted $C_2$-$C_{60}$ heteroarylene groups may be understood by referring to the examples of the substituted or unsubstituted $C_2$-$C_{60}$ arylene group.

The substituted or unsubstituted $C_6$-$C_{60}$ aryloxy group referred to herein, has a formula of —$OA_2$ (where $A_2$ is the substituted or unsubstituted $C_6$-$C_{60}$ aryl group), and the substituted or unsubstituted $C_6$-$C_{60}$ arylthio group has a formula of —$SA_3$ (where $A_3$ is the substituted or unsubstituted $C_6$-$C_{60}$ aryl group).

Hereinafter, one or more embodiments of the present invention are described in more detail with reference to the following examples. However, these examples are not intended to limit the scope of the present invention.

EXAMPLES

Synthesis of Sub 2(1) to 2(6) Belonging to Sub 2

Sub 2(1) to Sub 2(6) belonging to Sub 2 were synthesized according to Reaction Scheme 1:

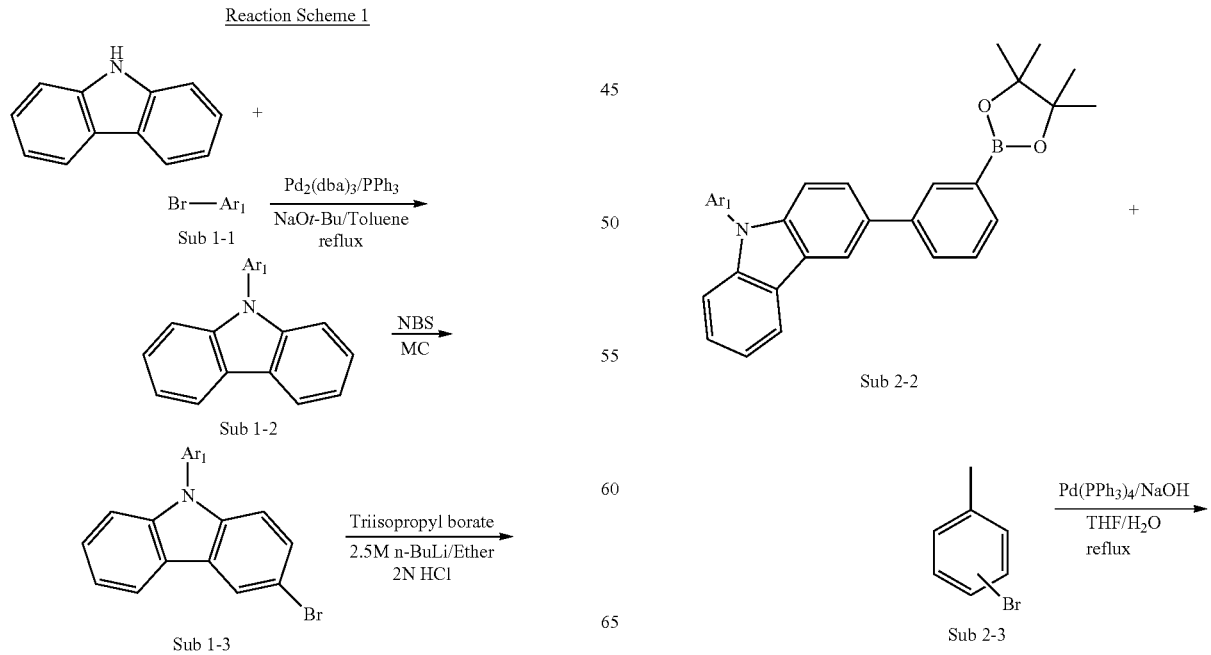

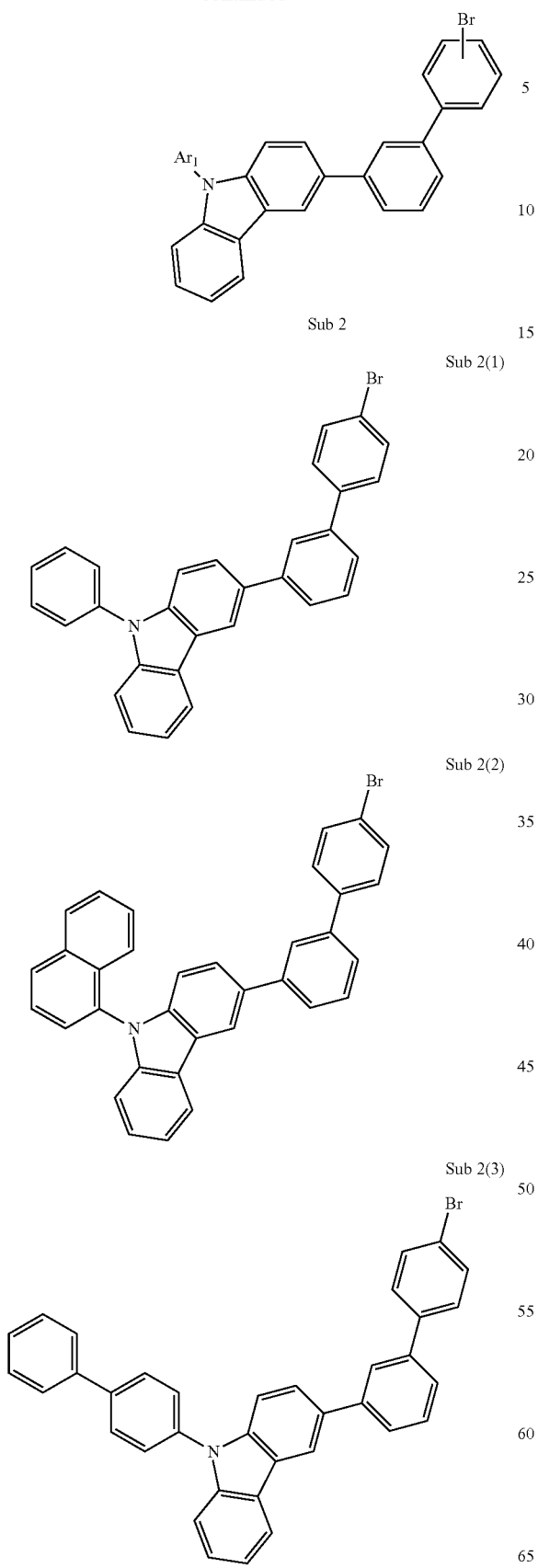

Sub 2

Sub 2(1)

Sub 2(2)

Sub 2(3)

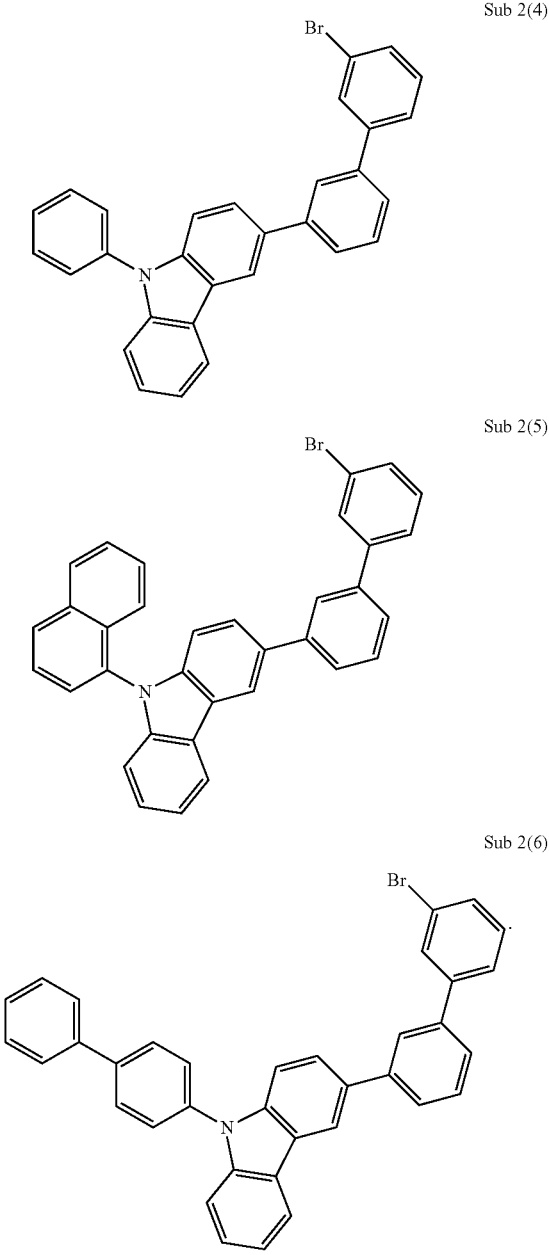

Sub 2(4)

Sub 2(5)

Sub 2(6)

$Ar_1$ and Sub 2-3 in Reaction Scheme 1 for the synthesis of Sub 2(1) to Sub 2(6) are shown in Table 1 below:

TABLE 1

| | Reaction Scheme 1 | |
|---|---|---|
| Compound | $Ar_1$ | Sub 2-3 |
| Sub 2(1) | phenyl group | 1-bromo-4-iodobenzene |
| Sub 2(2) | 1-naphthyl group | 1-bromo-4-iodobenzene |
| Sub 2(3) | biphenyl group | 1-bromo-4-iodobenzene |
| Sub 2(4) | phenyl group | 1-bromo-3-iodobenzene |
| Sub 2(5) | 1-naphthyl group | 1-bromo-3-iodobenzene |
| Sub 2(6) | biphenyl group | 1-bromo-3-iodobenzene |

Synthesis of Sub 1-2

Carbazole (1 eq.) and Sub 1-1 (1.1 eq.) were added to toluene, and $Pd_2(dba)_3$ (0.05 eq.), $PPh_3$ (0.1 eq.), and NaOt-Bu (3 eq.) were separately added thereto, and the mixture was stirred at a temperature of 100° C. for 24 hours while refluxing. Then, extraction was performed thereon with ether and water, and an organic layer was dried using $MgSO_4$, and then condensed. The generated organic material was subjected to silica gel column chromatography and re-crystallization to obtain Sub 1-2.

Synthesis of Sub 1-3

Sub 1-2 (1 eq.) was dissolved in methylenechloride, and then, N-bromosuccimide (NBS) (1.1 eq.) was slowly added thereto. The mixture was stirred for 24 hours at room temperature. When the reaction was finished, 5% HCl was added thereto, and then, water was added thereto to remove the residual NBS. Thereafter, extraction was performed thereon with ether and water, and an organic layer was dried using $MgSO_4$ and then condensed. The generated organic material was subjected to silica gel column chromatography and re-crystallization to obtain Sub 1-3.

Synthesis of Sub 1-4

Sub 1-3 (1 eq.) was dissolved in an anhydrous ether, and the resulting solution was cooled to a temperature of −78° C., and n-BuLi (2.5M in hexane) (1.1 eq.) was slowly added drop-wise thereto. The resultant reaction product was stirred for 30 minutes. Thereafter, the reaction product was cooled to a temperature of −78° C. and triisopropylborate (1.5 eq.) was added drop-wise thereto. The resultant mixture was stirred at room temperature and then, diluted with water and then, 2N HCl was added thereto. When the reaction was finished, extraction was performed thereon with ethyl acetate and water, and then, an organic layer was dried using $MgSO_4$. The generated organic material was subjected to silica gel column chromatography and re-crystallization to obtain Sub 1-4.

Synthesis of Sub 2-1

Sub 1-4 (1 eq.) was dissolved in THF, and then, 1,3-dibromobenzene(1,3-dibromobenzene)(1.1 eq.), $Pd(PPh_3)_4$ (0.03 eq.), NaOH(3 eq.), and water were added thereto, and the mixture was stirred while refluxing. When the reaction was finished, extraction was performed thereon with ether and water, and then, an organic layer was dried using $MgSO_4$. The generated organic material was subjected to silica gel column chromatography and re-crystallization to obtain Sub 2-1.

Synthesis of Sub 2-2

Sub 2-1 (1 eq.) was dissolved in DMF, and then, bispinacolato diboron (1.1 eq.), $PdCl_2(dppf)$ (0.03 eq.), and KOAc (3 eq.) were sequentially added thereto, and the mixture was stirred for 24 hours to synthesize a borate compound. The obtained compound was subjected to silica gel column chromatography and re-crystallization to obtain Sub 2-2.

Synthesis of Sub 2

Sub 2-2 (1 eq.) was dissolved in THF, and then, Sub 2-3(1.1 eq.), $Pd(PPh_3)_4$ (0.03 eq.), NaOH(3 eq.), and water were added thereto, and the mixture was stirred while refluxing. When the reaction was finished, extraction was performed thereon with ether and water, and an organic layer was dried using $MgSO_4$. The generated organic material was subjected to silica gel column chromatography and re-crystallization to obtain Sub 2.

MS data of Sub 2(1) to 2(6) of Sub 2 are shown in Table 2 below:

TABLE 2

| Compound | FD-MS |
| --- | --- |
| Sub 2(1) | m/z = 473.08($C_{30}H_{20}BrN$ = 474.39) |
| Sub 2(2) | m/z = 523.09($C_{34}H_{22}BrN$ = 524.45) |
| Sub 2(3) | m/z = 549.11($C_{36}H_{24}BrN$ = 550.49) |
| Sub 2(4) | m/z = 473.08($C_{30}H_{20}BrN$ = 474.39) |
| Sub 2(5) | m/z = 523.09($C_{34}H_{22}BrN$ = 524.45) |
| Sub 2(6) | m/z = 549.11($C_{36}H_{24}BrN$ = 550.49) |

Synthesis of Sub 3(1) to 3(24) Belonging to Sub 3

Sub 3(1) to Sub 3(24) belonging to Sub 3 were synthesized according to Reaction Scheme 2:

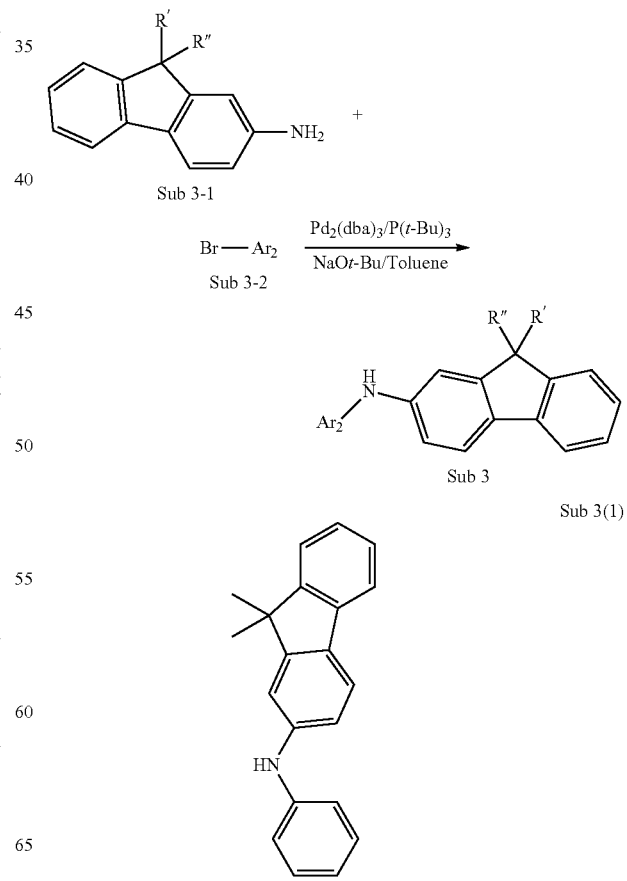

-continued
Sub 3(2)
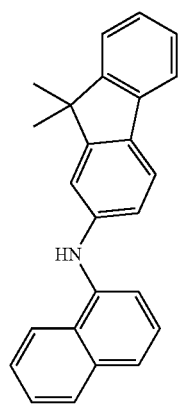
Sub 3(3)
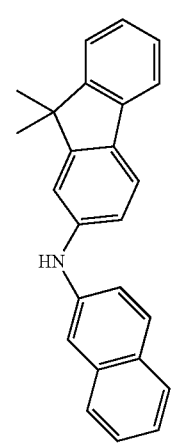
Sub 3(4)
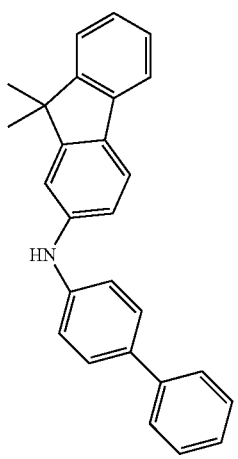
-continued
Sub 3(5)
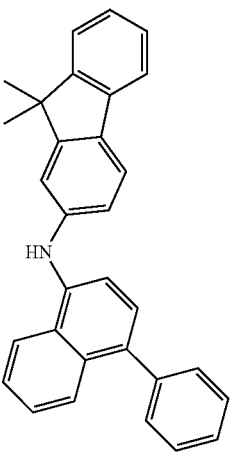
Sub 3(6)
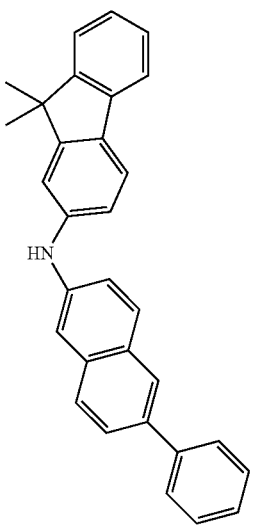
Sub 3(7)
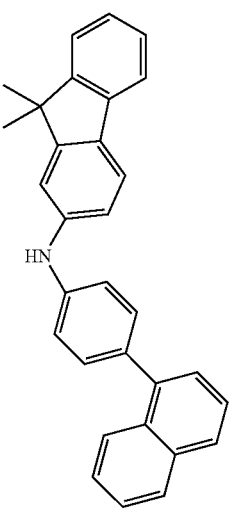

Sub 3(8)
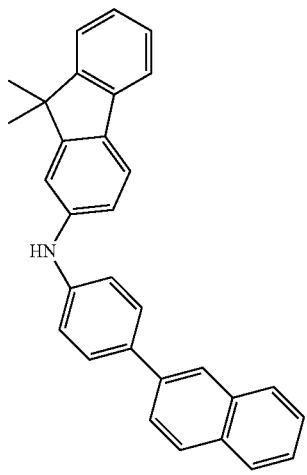
Sub 3(9)
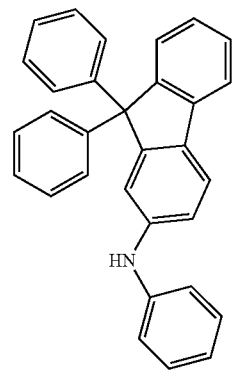
Sub 3(10)
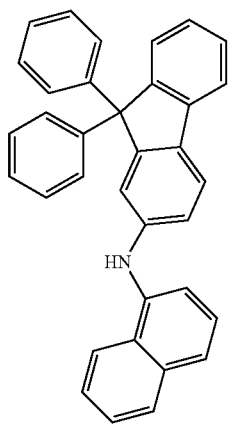
Sub 3(11)
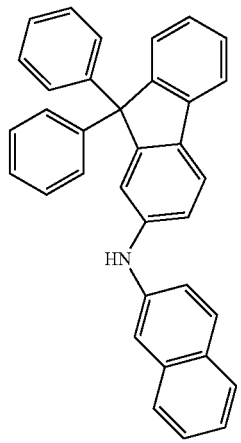
Sub 3(12)
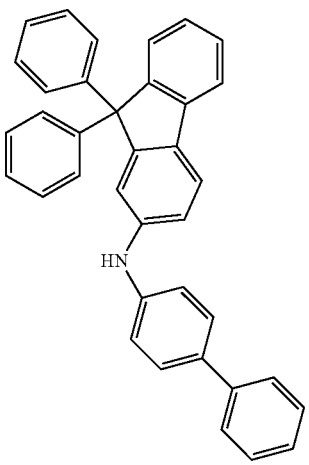
Sub 3(13)
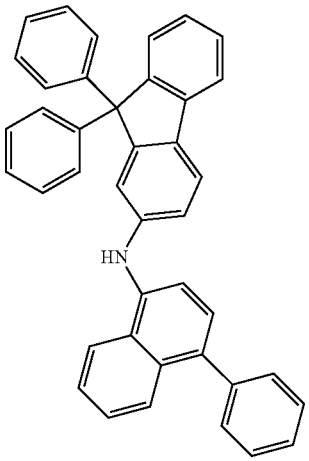

Sub 3(14)
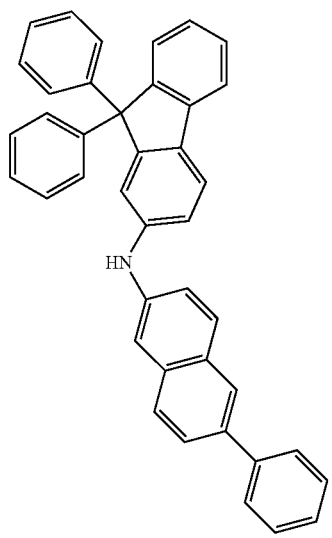
Sub 3(15)
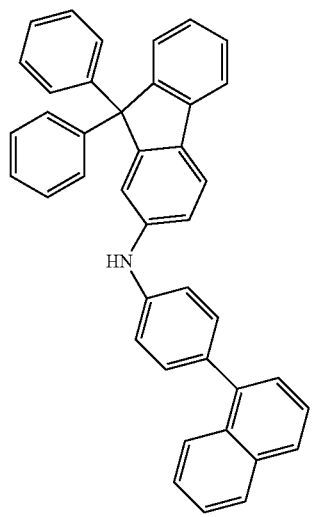
Sub 3(16)
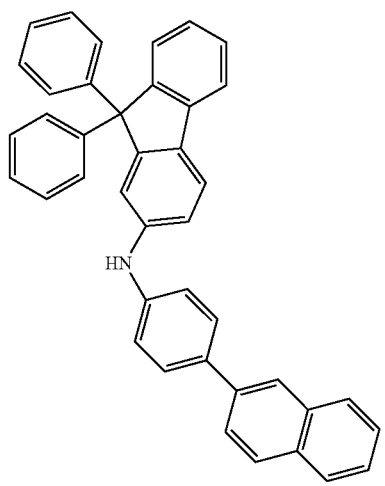
Sub 3(17)
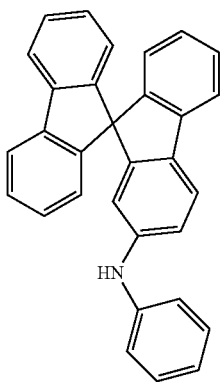
Sub 3(18)
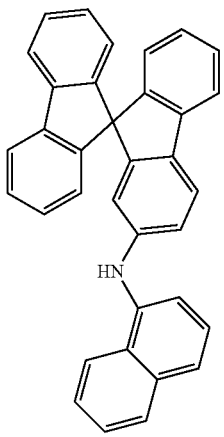
Sub 3(19)
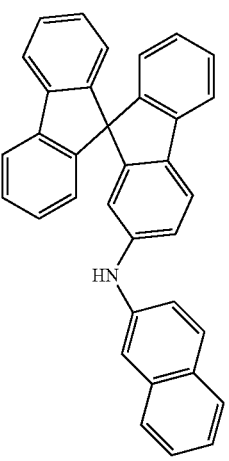

Sub 3(20)
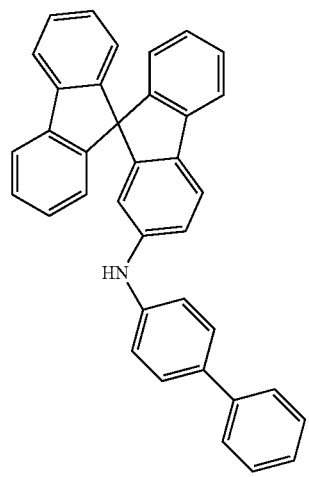
Sub 3(21)
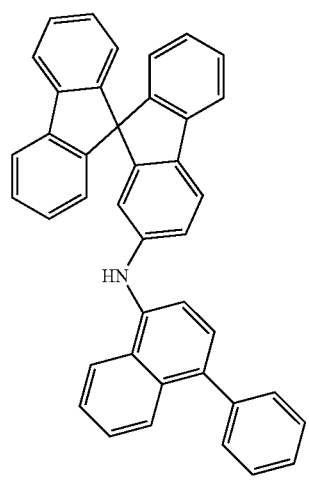
Sub 3(22)
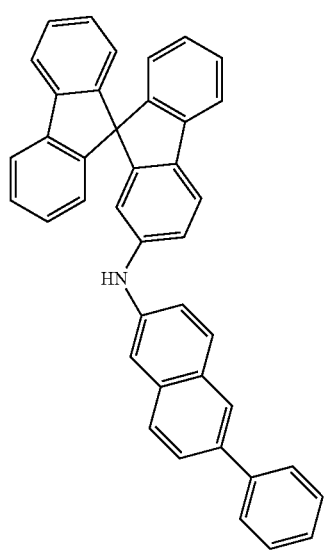
Sub 3(23)
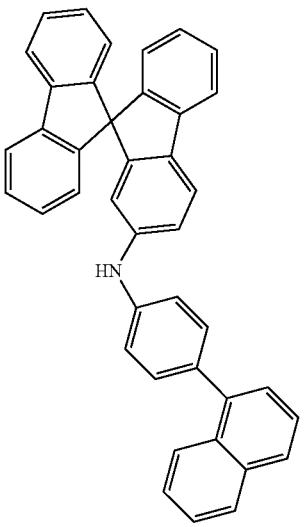
Sub 3(24)
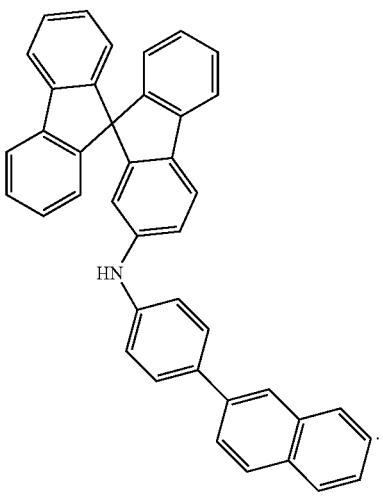
Sub 3-1 and Ar₂ in Reaction Scheme 2 for the synthesis of Sub 3(1) to Sub 3(24) are shown in Table 3 below:

TABLE 3

| | Reaction Scheme 2 | |
|---|---|---|
| Compound | Ar₂ | Sub 3-1 |
| Sub 3(1) | phenyl | 9,9-dimethyl-9H-fluorene-2-amine |
| Sub 3(2) | 1-naphthyl | |
| Sub 3(3) | 2-naphthyl | |
| Sub 3(4) | ![4-biphenyl] | |
| Sub 3(5) | ![4-phenyl-1-naphthyl] | |
| Sub 3(6) | ![6-phenyl-2-naphthyl] | |
| Sub 3(7) | ![4-(1-naphthyl)phenyl] | |
| Sub 3(8) | ![4-(2-naphthyl)phenyl] | |
| Sub 3(9) | phenyl | 9,9-dimethyl-9H-fluorene-2-amine |
| Sub 3(10) | 1-naphthyl | |
| Sub 3(11) | 2-naphthyl | |
| Sub 3(12) | ![4-biphenyl] | |
| Sub 3(13) | ![4-phenyl-1-naphthyl] | |
| Sub 3(14) | ![6-phenyl-2-naphthyl] | |
| Sub 3(15) | ![4-(1-naphthyl)phenyl] | |

TABLE 3-continued

| | Reaction Scheme 2 | |
|---|---|---|
| Compound | Ar₂ | Sub 3-1 |
| Sub 3(16) | *-C₆H₄-(2-naphthyl) | |
| Sub 3(17) | phenyl | 2-amino-9,9'-spirobifluorene |
| Sub 3(18) | 1-naphthyl | |
| Sub 3(19) | 2-naphthyl | |
| Sub 3(20) | *-biphenyl-4-yl | |
| Sub 3(21) | *-(4-phenyl-1-naphthyl) | |
| Sub 3(22) | *-(6-phenyl-2-naphthyl) | |
| Sub 3(23) | *-[4-(1-naphthyl)phenyl] | |
| Sub 3(24) | *-[4-(2-naphthyl)phenyl] | |

Sub 3-1 (1 eq.), Sub 3-2 (1.1 eq.), Pd$_2$(dba)$_3$ (0.05 eq.), P(t-Bu)$_3$ (0.1 eq.), NaOt-Bu (3 eq.), toluene (10.5 mL/1 mmol of starting material) were loaded into a round-bottom flask, and the reaction was performed at a temperature of 100° C. When the reaction was finished, extraction was performed thereon with ether and water, and an organic layer was dried using MgSO$_4$. The generated organic material was subjected to silica gel column chromatography and re-crystallization to obtain Sub 3.

MS data of Sub 3(1) to 3(24) of Sub 3 are shown in Table 4 below:

TABLE 4

| Compound | FD-MS |
|---|---|
| Sub 3(1) | m/z = 285.15(C$_{21}$H$_{19}$N = 285.38) |
| Sub 3(2) | m/z = 335.17(C$_{25}$H$_{21}$N = 335.44) |
| Sub 3(3) | m/z = 335.17(C$_{25}$H$_{21}$N = 335.44) |
| Sub 3(4) | m/z = 361.18(C$_{27}$H$_{28}$N = 361.48) |
| Sub 3(5) | m/z = 411.20(C$_{31}$H$_{25}$N = 411.54) |
| Sub 3(6) | m/z = 411.20(C$_{31}$H$_{25}$N = 411.54) |
| Sub 3(7) | m/z = 411.20(C$_{31}$H$_{25}$N = 411.54) |
| Sub 3(8) | m/z = 411.20(C$_{31}$H$_{25}$N = 411.54) |
| Sub 3(9) | m/z = 409.18(C$_{31}$H$_{23}$N = 409.52) |
| Sub 3(10) | m/z = 459.20(C$_{35}$H$_{25}$N = 459.58) |
| Sub 3(11) | m/z = 459.20(C$_{35}$H$_{25}$N = 459.58) |
| Sub 3(12) | m/z = 485.21(C$_{37}$H$_{27}$N = 485.62) |
| Sub 3(13) | m/z = 535.23(C$_{41}$H$_{29}$N = 535.68) |
| Sub 3(14) | m/z = 535.23(C$_{41}$H$_{29}$N = 535.68) |
| Sub 3(15) | m/z = 535.23(C$_{41}$H$_{29}$N = 535.68) |
| Sub 3(16) | m/z = 535.23(C$_{41}$H$_{29}$N = 535.68) |
| Sub 3(17) | m/z = 407.17(C$_{31}$H$_{21}$N = 407.51) |
| Sub 3(18) | m/z = 457.18(C$_{35}$H$_{23}$N = 457.56) |
| Sub 3(19) | m/z = 457.18(C$_{35}$H$_{23}$N = 457.56) |
| Sub 3(20) | m/z = 483.20(C$_{37}$H$_{25}$N = 483.60) |
| Sub 3(21) | m/z = 533.21(C$_{41}$H$_{27}$N = 533.66) |
| Sub 3(22) | m/z = 533.21(C$_{41}$H$_{27}$N = 533.66) |
| Sub 3(23) | m/z = 533.21(C$_{41}$H$_{27}$N = 533.66) |
| Sub 3(24) | m/z = 533.21(C$_{41}$H$_{27}$N = 533.66) |

Synthesis Example 1

Synthesis of Compound 2

Sub 3 (12) (1 eq.), Sub 2(1) (1.1 eq.), Pd$_2$(dba)$_3$ (0.05 eq.), P(t-Bu)$_3$ (0.1 eq.), NaOt-Bu (3 eq.), and toluene (10.5 mL 11 mmol of starting material) were loaded into a round-bottom flask, and the reaction was performed at a temperature of 100° C. When the reaction was finished, extraction was performed thereon with ether and water, and an organic layer was dried using MgSO$_4$. The generated organic material was subjected to silica gel column chromatography and re-crystallization to obtain Compound 2. The synthesized compound was identified by MS/FAB and $^1$H NMR.

m/z=878.37 (C$_{67}$H$_{46}$N$_2$=879.10)

$^1$H NMR (CDCl$_3$, 400 MHz) δ(ppm) 7.13-7.23 (m, 15H), 7.30-7.75 (m, 28H), 7.92 (s, 1H), 8.22 (d, J=7.7 Hz, 1H), 8.43 (d, J=1.3 Hz, 1H)

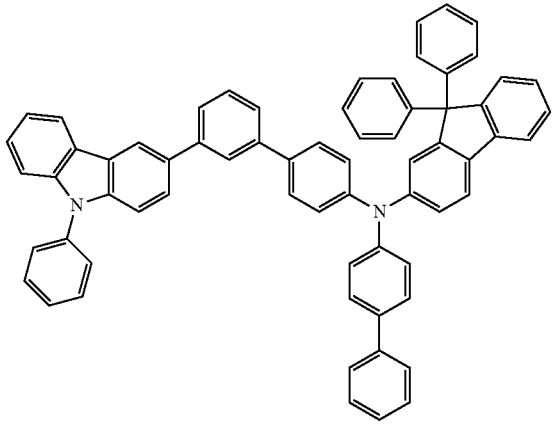

Synthesis Example 2

Synthesis of Compound 8

Compound 8 was synthesized in the same manner as in Synthesis Example 1, except that Sub 2(3) was used instead of Sub 2(1). The synthesized compound was identified by MS/FAB and $^1$H NMR.

m/z=954.40 (C$_{73}$H$_{50}$N$_2$=955.19)

$^1$H NMR (CDCl$_3$, 400 MHz) δ(ppm) 7.12-7.79 (m, 45H), 7.86 (d, J=8.5 Hz, 2H), 7.94 (s, 1H), 8.24 (d, J=7.6 Hz, 1H), 8.45 (d, J=1.4 Hz, 1H)

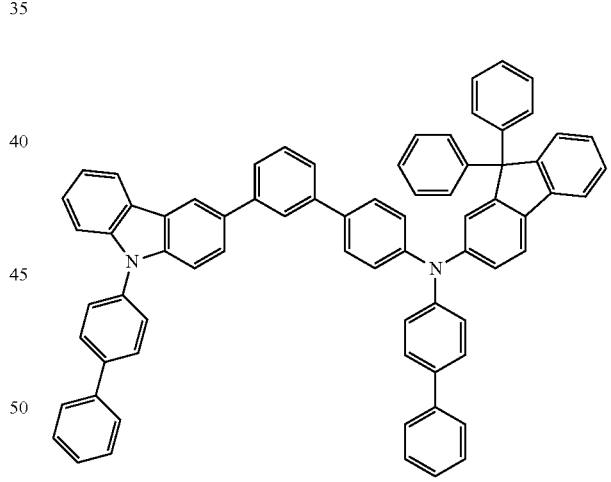

Synthesis Example 3

Synthesis of Compound 7

Compound 7 was synthesized in the same manner as in Synthesis Example 1, except that Sub 3(9) and Sub 2(3) were used instead of Sub 3(12) and Sub 2(1). The synthesized compound was identified by MS/FAB and $^1$H NMR.

m/z=878.37 (C$_{67}$H$_{46}$N$_2$=879.10)

$^1$H NMR (CDCl$_3$, 400 MHz) δ(ppm) 6.99-7.79 (m, 41H), 7.86 (d, J=8.5 Hz, 2H), 7.93 (s, 1H), 8.24 (d, J=7.6 Hz, 1H), 8.44 (d, J=1.3 Hz, 1H)

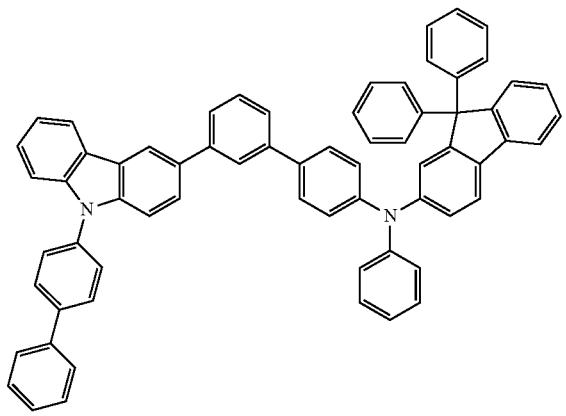

7

Synthesis Example 4

Synthesis of Compound 26

Compound 26 was synthesized in the same manner as in Synthesis Example 1, except that Sub 3(4) and Sub 2(3) were used instead of Sub 3(12) and Sub 2(1). The synthesized compound was identified by MS/FAB and $^1$H NMR.

m/z=754.33 ($C_{57}H_{42}N_2$=754.96)

$^1$H NMR (CDCl$_3$, 400 MHz) δ(ppm) 1.45 (s, 6H), 7.15 (brs, 2H), 7.27-7.34 (m, 8H), 7.39-7.74 (m, 23H), 7.94 (s, 1H), 8.21 (d, J=7.7 Hz, 1H), 8.42 (d, J=1.6 Hz, 1H)

26

Synthesis Example 5

Synthesis of Compound 55

Compound 55 was synthesized in the same manner as in Synthesis Example 1, except that Sub 3(9) and Sub 2(6) were used instead of Sub 3(12) and Sub 2(1). The synthesized compound was identified by MS/FAB and $^1$H NMR.

m/z=878.37 ($C_{67}H_{46}N_2$=879.10)

$^1$H NMR (CDCl$_3$, 400 MHz) δ(ppm) 6.97-7.75 (m, 41H), 7.80-7.87 (m, 3H), 8.18 (d, J=7.6 Hz, 1H), 8.36 (d, J=1.2 Hz, 1H)

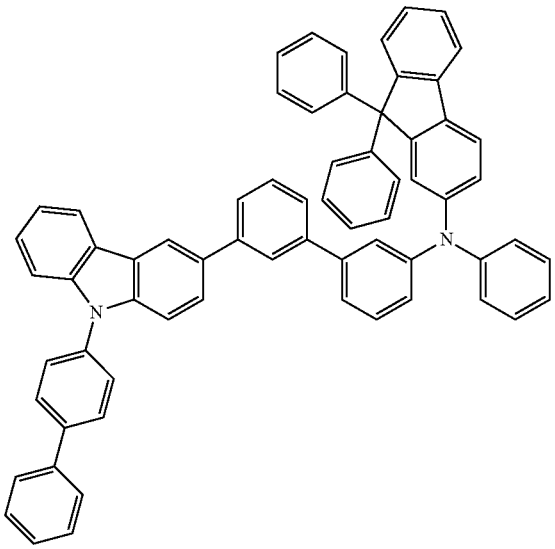

55

Synthesis Example 6

Synthesis of Compound 50

Compound 50 was synthesized in the same manner as in Synthesis Example 1, except that Sub 2(4) was used instead of Sub 2(1). The synthesized compound was identified by MS/FAB and $^1$H NMR.

m/z=878.37 ($C_{67}H_{46}N_2$=879.10)

$^1$H NMR (CDCl$_3$, 400 MHz) δ(ppm) 7.06-7.76 (m, 43H), 7.84 (s, 1H), 8.18 (d, J=7.7 Hz, 1H), 8.38 (d, J=1.6 Hz, 1H)

50

Synthesis Example 7

Synthesis of Compound 14

Compound 14 was synthesized in the same manner as in Synthesis Example 1, except that Sub 2(2) was used instead of Sub 2(1). The synthesized compound was identified by MS/FAB and $^1$H NMR.

m/z=928.38 ($C_{71}H_{48}N_2$=929.15)

¹H NMR (CDCl₃, 400 MHz) δ(ppm) 7.01-7.24 (m, 16H), 7.27-7.79 (m, 27H), 7.92 (s, 1H), 8.02-8.10 (m, 2H), 8.25-8.29 (m, 1H), 8.48 (d, J=1.2 Hz, 1H)

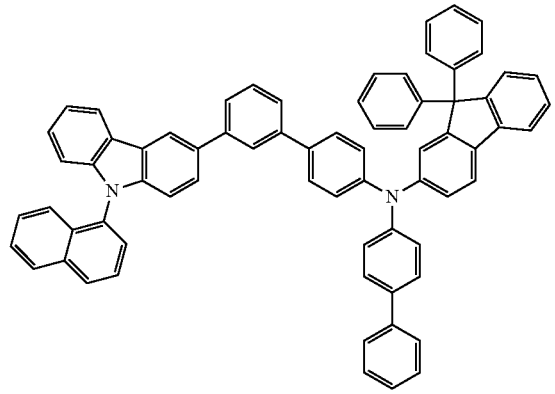

Synthesis Example 8

Synthesis of Compound 5

Compound 5 was synthesized in the same manner as in Synthesis Example 12, except that Sub 3(10) was used instead of Sub 3(12). The synthesized compound was identified by MS/FAB and ¹H NMR.

m/z=852.35 (C₆₅H₄₄N₂=853.06)

¹H NMR (CDCl₃, 400 MHz) δ(ppm) 6.98 (dd, J=8.3, 2.1 Hz, 1H), 7.04 (d, J=8.6 Hz, 2H), 7.09-7.22 (m, 11H), 7.27-7.38 (m, 6H), 7.42-7.66 (m, 17H), 7.70 (dd, J=8.5, 1.7 Hz, 1H), 7.78 (d, J=8.3 Hz, 1H), 7.87-7.91 (m, 3H), 8.19 (d, J=7.7 Hz, 1H), 8.39 (d, J=1.6 Hz, 1H)

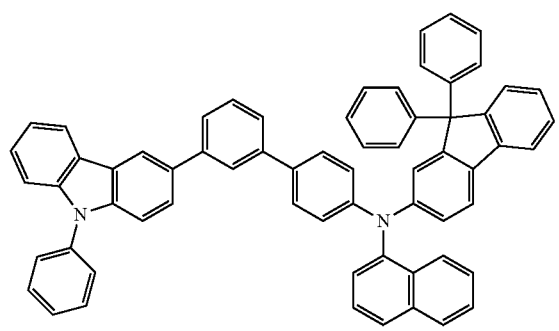

Other amine-based compounds represented by Formula 1 or Formula 2 may be synthesized in a similar manner to that described above, by referring to Sub 2(1) to 2(6), Sub 3(1) to 3(24), and Synthesis Examples 1 to 8.

Comparative Synthesis Example 1

Synthesis of Compound A

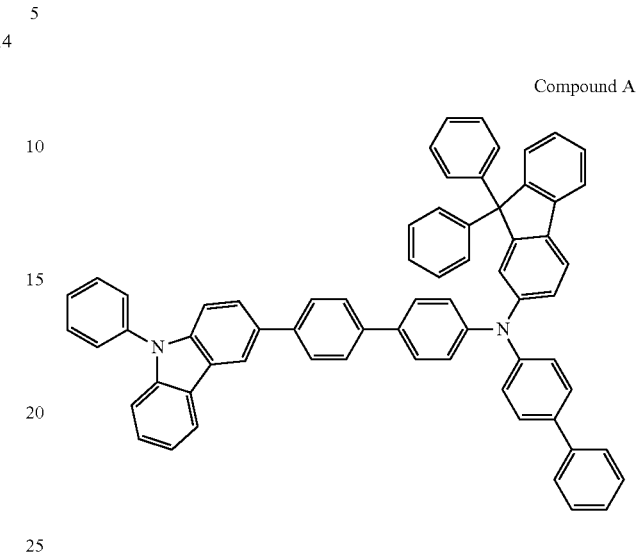

Compound A was synthesized in the same manner as in Synthesis Example 1, except that Sub 1(1), synthesized according to the following Reaction Scheme 3, was used instead of Sub 2(1). The synthesized compound was identified by MS/FAB and ¹H NMR.

m/z=754.33 (C₅₇H₄₂N₂=754.96)

¹H NMR (CDCl₃, 400 MHz) δ(ppm) 1.46 (s, 6H), 7.15 (dd, J=8.0, 1.9 Hz, 1H), 7.21-7.37 (m, 9H), 7.39-7.76 (m, 22H), 7.80 (d, J=8.2 Hz, 2H), 8.21 (d, J=7.7 Hz, 1H), 8.41 (d, J=1.3 Hz, 1H)

Reaction Scheme 3

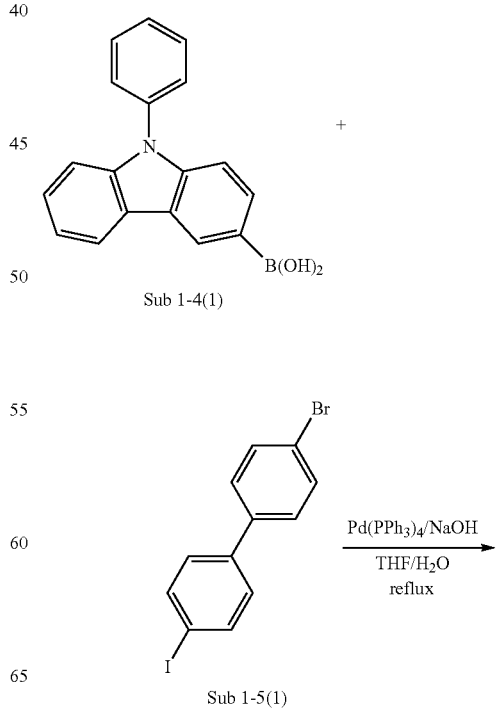

-continued

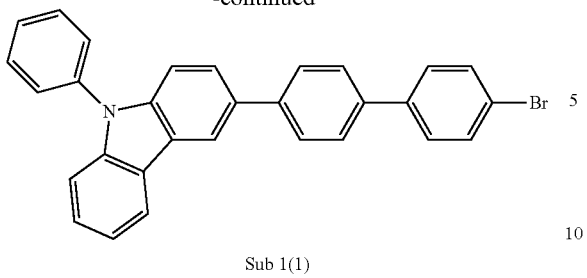
Sub 1(1)

Sub 1-4(1) (1 eq.) (the synthesis method for Sub 1-4(1) may be understood by referring to Reaction Scheme 1) was dissolved in THF, and then, Sub 1-5(1) (1.1 eq.), Pd(PPh$_3$)$_4$ (0.03 eq.), NaOH(3 eq.), and water were added thereto, and the resultant mixture was stirred while refluxing. When the reaction was finished, extraction was performed thereon with ether and water, and an organic layer was dried using MgSO$_4$. The generated organic material was subjected to silica gel column chromatography and re-crystallization to obtain Sub 1-1.

Comparative Synthesis Example 2

Synthesis of Compound B

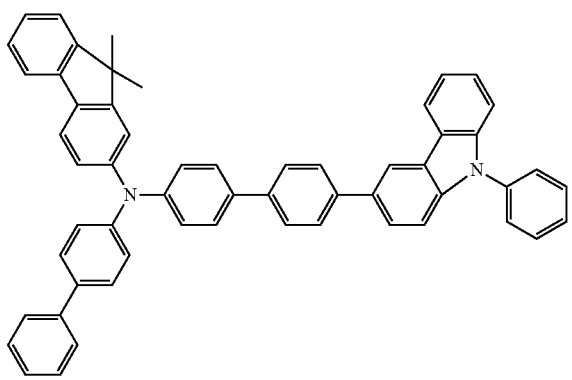
Compound B

Compound B was synthesized in the same manner as in Synthesis Example 1, except that Sub 1(1) and Sub 3(4) were used instead of Sub 2(1) and Sub 3(12). The synthesized compound was identified by MS/FAB and $^1$H NMR.
m/z=878.37 (C$_{67}$H$_{46}$N$_2$=879.10)
$^1$H NMR (CDCl$_3$, 400 MHz) δ(ppm) 7.07-7.26 (m, 15H), 7.29-7.76 (m, 27H), 7.81 (d, J=8.34 Hz, 2H), 8.21 (d, J=7.7 Hz, 1H), 8.40 (d, J=1.4 Hz, 1H)

Example 1

An anode was prepared by cutting a substrate with a stack of ITO/Ag/ITO having thicknesses of 70/1000/70 Å to a size of 50 mm×50 mm×0.5 mm, ultrasonically cleaning the glass substrate using isopropyl alcohol and pure water for 5 minutes each, and then irradiating with UV light for 30 minutes and exposing to ozone to clean. Then, this glass substrate was loaded into a vacuum deposition apparatus.
Compound 2 was deposited on the ITO of the anode to form a hole transport layer having a thickness of 1400 Å, and then αβ-ADN as a host and Compound 204 as a dopant were co-deposited on the hole transport layer at a weight ratio of 97:3 to form an emission layer having a thickness of 200 Å.

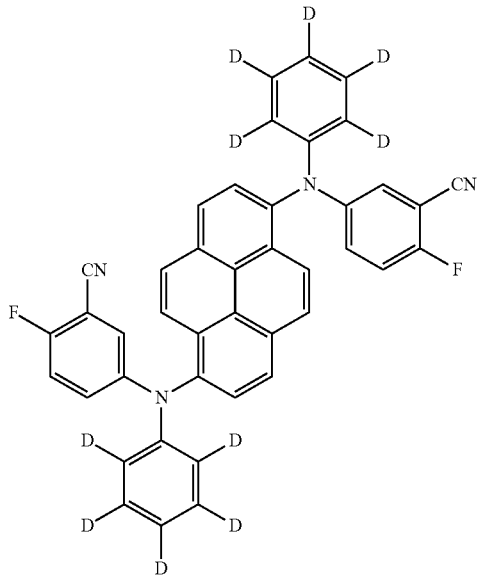
Compound 204

Compound 201 and LiQ were co-deposited at a weight ratio of 1:1 on the emission layer to form an electron transport layer having a thickness of 360 Å, and LiQ was deposited on the electron transport layer to form an electron injection layer having a thickness of 5 Å, and then Mg and Ag were deposited at a weight of 90:10 on the electron injection layer to form a cathode having a thickness of 130 Å, thereby completing manufacturing of an organic light-emitting diode.

Example 2

An organic light-emitting diode was manufactured in the same manner as Example 1, except that Compound 8 was used instead of Compound 2 in forming the hole transport layer.

Example 3

An organic light-emitting diode was manufactured in the same manner as Example 1, except that Compound 7 was used instead of Compound 2 in forming the hole transport layer.

Example 4

An organic light-emitting diode was manufactured in the same manner as Example 1, except that Compound 14 was used instead of Compound 2 in forming the hole transport layer.

Example 5

An organic light-emitting diode was manufactured in the same manner as Example 1, except that Compound 26 was used instead of Compound 2 in forming the hole transport layer.

Example 6

An organic light-emitting diode was manufactured in the same manner as Example 1, except that Compound 55 was used instead of Compound 2 in forming the hole transport layer.

Example 7

An organic light-emitting diode was manufactured in the same manner as Example 1, except that Compound 5 was used instead of Compound 2 in forming the hole transport layer.

Example 8

An organic light-emitting diode was manufactured in the same manner as Example 1, except that Compound 50 was used instead of Compound 2 in forming the hole transport layer.

Comparative Example 1

An organic light-emitting diode was manufactured in the same manner as Example 1, except that NPB was used instead of Compound 2 in forming the hole transport layer.

Comparative Example 2

An organic light-emitting diode was manufactured in the same manner as Example 1, except that Compound A was used instead of Compound 2 in forming the hole transport layer.

Comparative Example 3

An organic light-emitting diode was manufactured in the same manner as Example 1, except that Compound B was used instead of Compound 2 in forming the hole transport layer.

Evaluation Example 1

Figure 2:
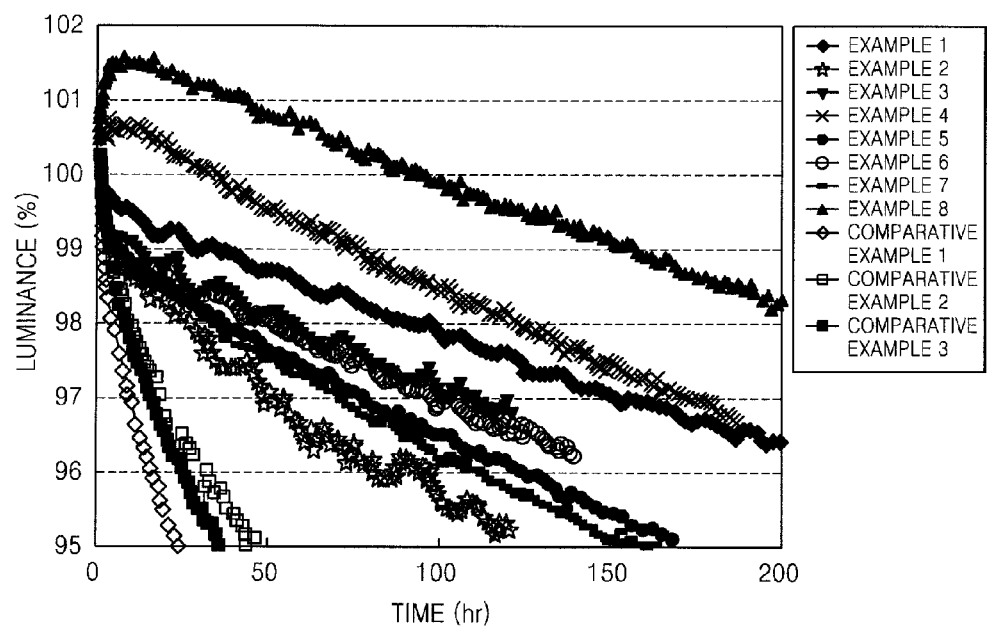
FIG. 2 shows lifespan (@500 cd/m$^2$) data of Examples 1 to 8 and Comparative Examples 1 to 3.

The driving voltage, current density, brightness, power, and color purity of the organic light-emitting diodes manufactured according to Examples 1 to 8 and Comparative Examples 1 to 3 were measured using a Kethley SMU 236 and a luminance meter PR650. Lifespan data was measured as shown in FIG. 2, which shows a graph of time versus brightness of the organic light-emitting diodes of Examples 1 to 8 and Comparative Example 3 (@ 500 cd/m$_2$)). The brightness values of FIG. 2 are indicated as % of an initial brightness.

TABLE 5

| | Hole transport layer material | Driving voltage (V) | Current density (mA/cm$^2$) | Brightness (cd/A) | Power (lm/W) | CIE_x | CIE_y |
|---|---|---|---|---|---|---|---|
| Example 1 | Compound 2 | 4.2 | 9.6 | 5.2 | 3.9 | 0.145 | 0.043 |
| Example 2 | Compound 8 | 4.3 | 7.0 | 7.2 | 5.3 | 0.133 | 0.071 |
| Example 3 | Compound 7 | 4.6 | 9.0 | 5.5 | 3.8 | 0.145 | 0.044 |
| Example 4 | Compound 14 | 4.2 | 8.9 | 5.6 | 4.2 | 0.140 | 0.052 |
| Example 5 | Compound 26 | 4.1 | 11.0 | 4.5 | 3.5 | 0.140 | 0.053 |
| Example 6 | Compound 55 | 4.7 | 14.3 | 3.5 | 2.4 | 0.151 | 0.032 |
| Example 7 | Compound 5 | 4.6 | 9.0 | 5.5 | 3.8 | 0.145 | 0.044 |
| Example 8 | Compound 50 | 4.6 | 11.4 | 4.4 | 3.0 | 0.149 | 0.036 |
| Comparative Example 1: | NPB | 4.1 | 15.5 | 3.2 | 2.5 | 0.141 | 0.049 |
| Comparative Example 2: | Compound A | 4.0 | 10.0 | 5.0 | 3.9 | 0.139 | 0.051 |
| Comparative Example 3: | Compound B | 3.9 | 10.9 | 4.6 | 3.7 | 0.142 | 0.044 |

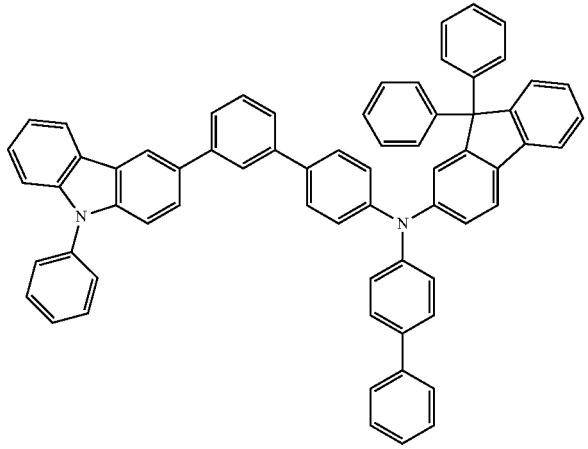

TABLE 5-continued
| Hole transport layer material | Driving voltage (V) | Current density (mA/cm²) | Brightness (cd/A) | Power (lm/W) | CIE_x | CIE_y |
|---|---|---|---|---|---|---|
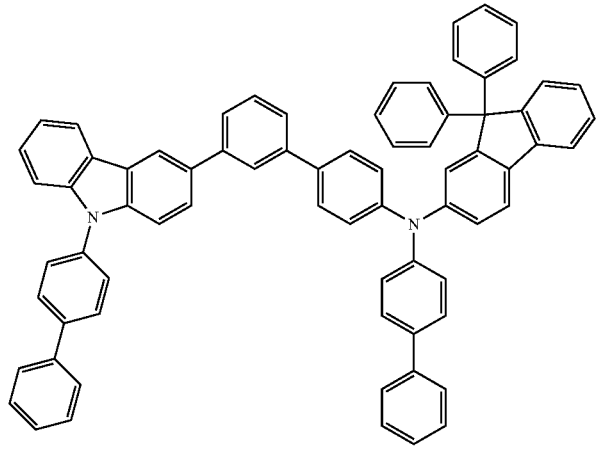
8
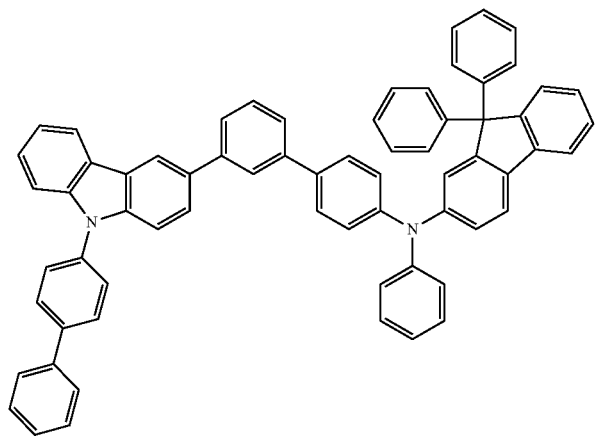
7
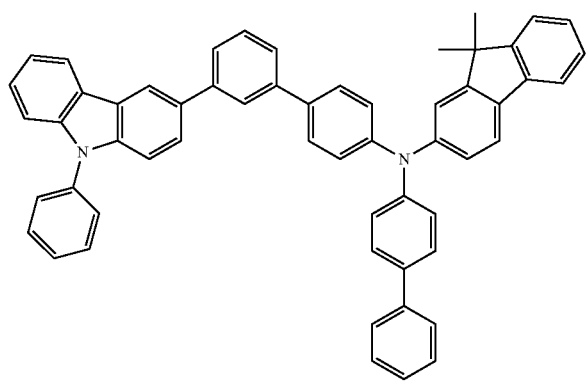
26

TABLE 5-continued
| Hole transport layer material | Driving voltage (V) | Current density (mA/cm²) | Brightness (cd/A) | Power (lm/W) | CIE_x | CIE_y |
|---|---|---|---|---|---|---|
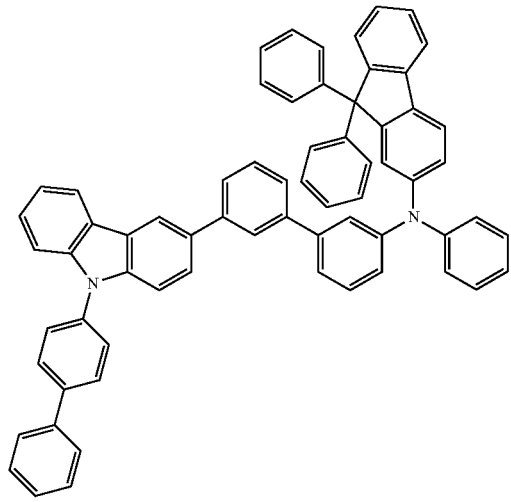
55
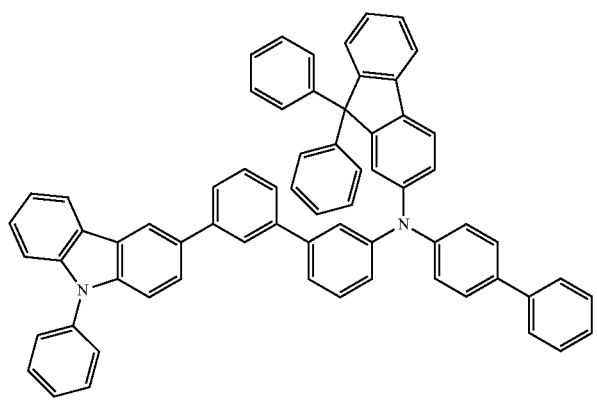
50
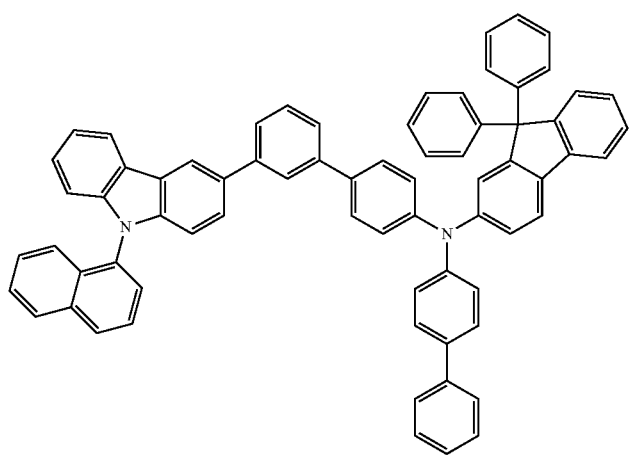
14

TABLE 5-continued

| Hole transport layer material | Driving voltage (V) | Current density (mA/cm²) | Brightness (cd/A) | Power (lm/W) | CIE_x | CIE_y |
| --- | --- | --- | --- | --- | --- | --- |

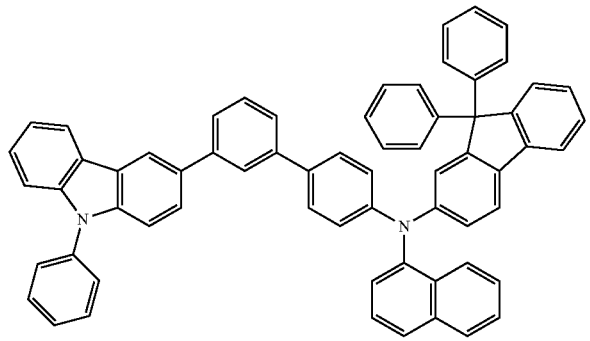

<Compound A>

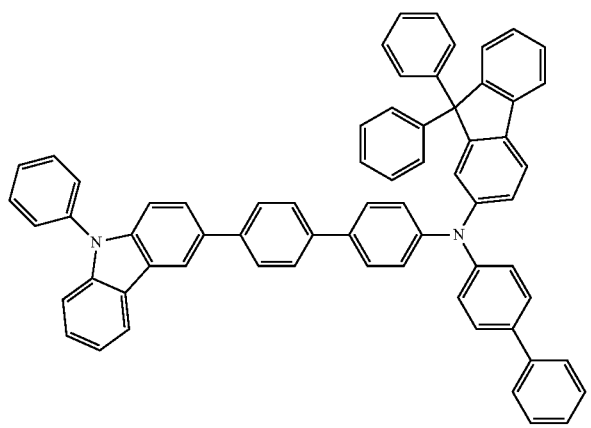

<Compound B>

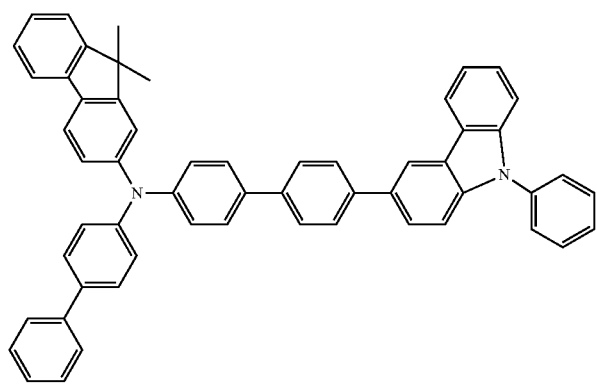

From Table 5 and FIG. 2, it was shown that current density, brightness, power, color purity and/or lifespan of the organic light-emitting diodes of Examples 1 to 8 are higher than those of the organic light-emitting diodes of Comparative Examples 1 to 3, and do not have a substantially increased driving voltage compared to Comparative Examples 1 to 3.

An organic light-emitting diode including the amine-based compound according to embodiments of the present invention may have a low-driving voltage, while also having an improved efficiency, improved color purity, and/or longer lifespan, without having a substantially increased driving voltage.

While the present invention has been particularly shown and described with reference to certain embodiments thereof, it is to be understood that the invention is not limited to the disclosed embodiments, but, on the contrary, is intended to cover various modifications and equivalent arrangements included within the spirit and scope of the appended claims, and equivalents thereof. It will be understood by those of ordinary skill in the art that various changes in form and details may be made therein without departing from the spirit and scope of the present invention.

What is claimed is:
1. An amine-based compound represented by Formula 1 or Formula 2 below:

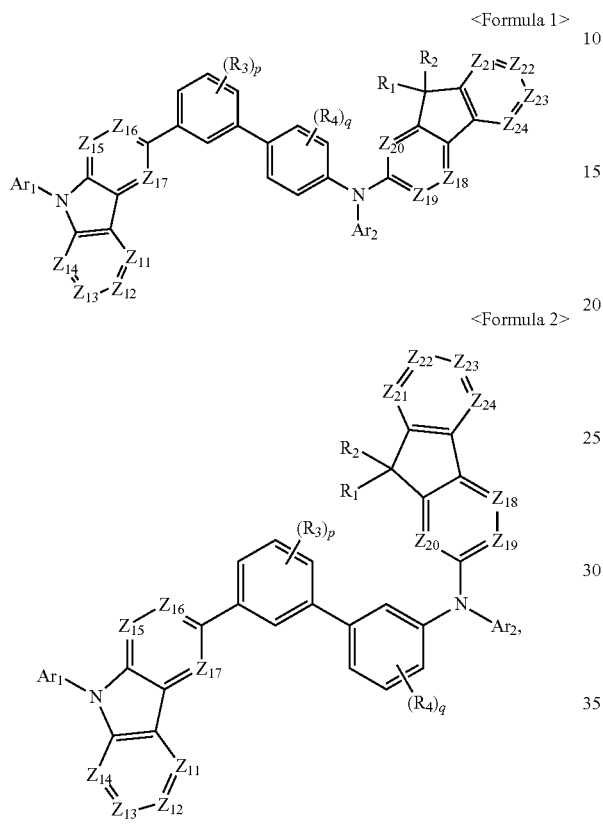

wherein in Formula 1 and Formula 2:
$Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ and $Ar_2$ are each independently selected from:
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, and
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_1$ and $R_2$ are each independently selected from:
a $C_1$-$C_{60}$ alkyl group, a $C_2$-$C_{60}$ alkenyl group, a $C_2$-$C_{60}$ alkynyl group, and a $C_1$-$C_{60}$ alkoxy group,
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group,
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, and
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and $C_2$-$C_{60}$ heteroaryl group;

$R_3$, $R_4$, and $R_{11}$ to $R_{24}$ are each independently selected from:
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group,
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group,
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group,
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, and —N($Q_{11}$)($Q_{12}$), —Si($Q_{13}$)($Q_{14}$)($Q_{15}$), and —B($Q_{16}$)($Q_{17}$), wherein $Q_{11}$ to $Q_{17}$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group; and p and q are each independently selected from an integer of 1 to 4.

2. The amine-based compound of claim 1, wherein:
$Z_{11}$ is C($R_{11}$), $Z_{12}$ is C($R_{12}$), $Z_{13}$ is C($R_{13}$), $Z_{14}$ is C($R_{14}$), $Z_{15}$ is C($R_{15}$), $Z_{16}$ is C($R_{16}$), $Z_{17}$ is C($R_{17}$), $Z_{18}$ is C($R_{18}$), $Z_{19}$ is C($R_{19}$), $Z_{20}$ is C($R_{20}$), $Z_{21}$ is C($R_{21}$), $Z_{22}$ is C($R_{22}$), $Z_{23}$ is C($R_{23}$), and $Z_{24}$ is C($R_{24}$).

3. The amine-based compound of claim 1, wherein:
$Ar_1$ and $Ar_2$ are each independently selected from:
phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl, and
phenyl, pentalenyl, indenyl, naphthyl, azulenyl, heptalenyl, indacenyl, acenaphthyl, fluorenyl, spiro-fluorenyl, phenalenyl, phenanthrenyl, anthracenyl, fluoranthenyl, triphenylenyl, pyrenyl, chrysenyl, naphthacenyl, picenyl, perylenyl, pentaphenyl, hexacenyl, pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoxazolyl, benzoimidazolyl, furanyl, benzofuranyl, thiophenyl, benzothiophenyl, thiazolyl, isothiazolyl, benzothiazolyl, isoxazolyl, oxazolyl, thiazolyl, tetrazolyl, oxadiazolyl, triazinyl, benzooxazolyl, dibenzofuranyl, dibenzothiophenyl, and benzocarbazolyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

4. The amine-based compound of claim 1, wherein:
$Ar_1$ and $Ar_2$ are each independently selected from:
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

5. The amine-based compound of claim 1, wherein:
$Ar_1$ and $Ar_2$ are each independently selected from a group represented by one of Formulae 3-1 to 3-20 below:

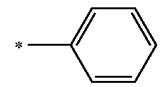

Formula 3-1

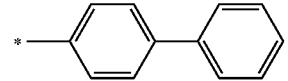

Formula 3-2

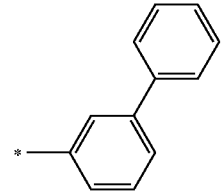

Formula 3-3

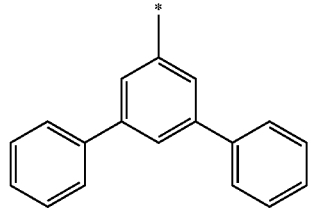

Formula 3-4

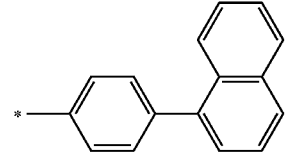

Formula 3-5

115
-continued

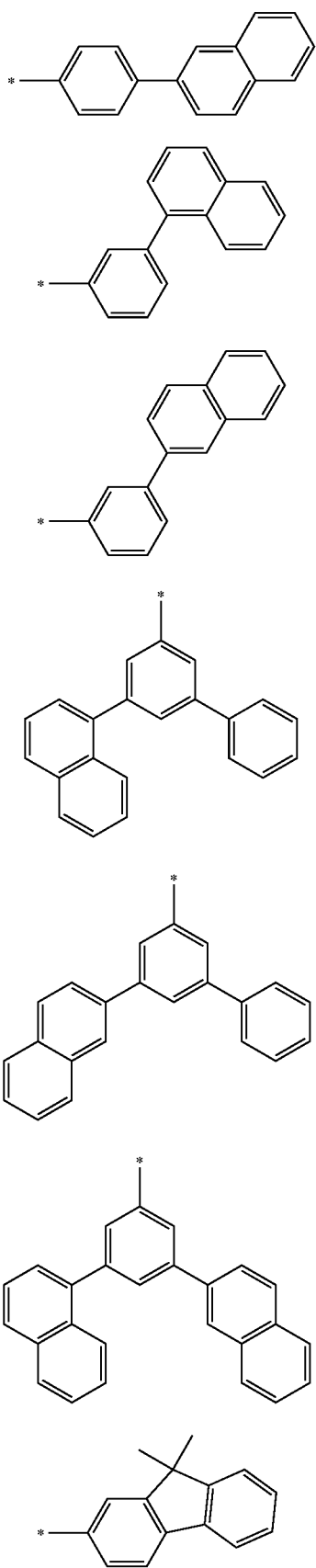

Formula 3-6

Formula 3-7

Formula 3-8

Formula 3-9

Formula 3-10

Formula 3-11

Formula 3-12

116
-continued

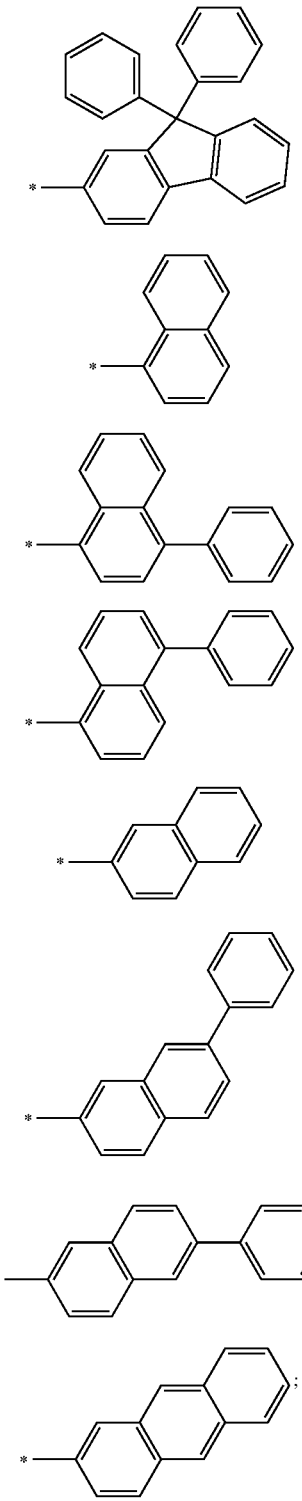

Formula 3-13

Formula 3-14

Formula 3-15

Formula 3-16

Formula 3-17

Formula 3-18

Formula 3-19

Formula 3-20 and in Formulae 3-1 to 3-20, * represents a binding site to a corresponding N of Formula 1 or Formula 2.

6. The amine-based compound of claim 1, wherein:

$R_1$ and $R_2$ are each independently selected from:
  a $C_1$-$C_{20}$ alkyl group,
  a $C_1$-$C_{20}$ alkyl group, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

7. The amine-based compound of claim 1, wherein:
$R_1$ and $R_2$ are each independently selected from methyl, ethyl, propyl, butyl, pentyl, hexyl, heptyl, and a group represented by one of Formulae 3-1 to 3-20 below:

Formula 3-1

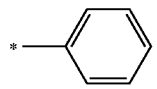

Formula 3-2

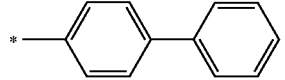

Formula 3-3

Formula 3-4

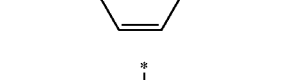

Formula 3-5

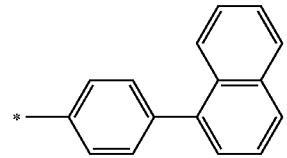

Formula 3-6

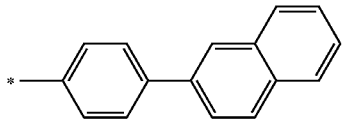

Formula 3-7

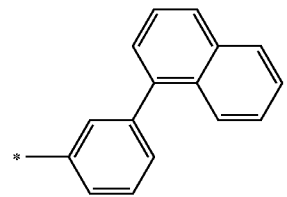

Formula 3-8

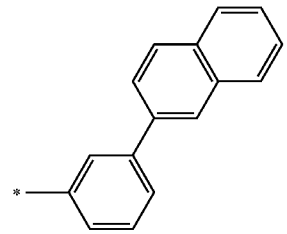

Formula 3-9

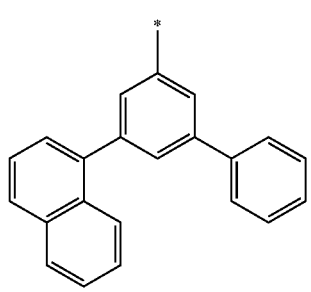

Formula 3-10

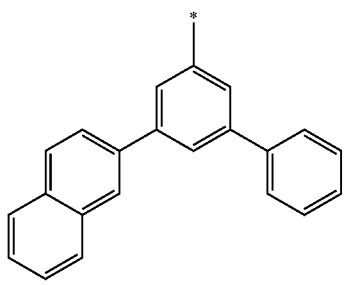

Formula 3-11

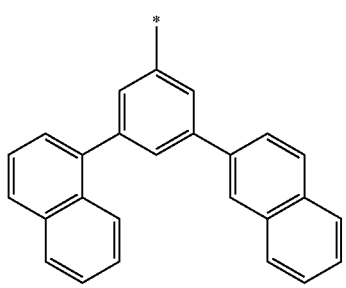

-continued

Formula 3-12

Formula 3-13

Formula 3-14

Formula 3-15

Formula 3-16

Formula 3-17

Formula 3-18

Formula 3-19

Formula 3-20

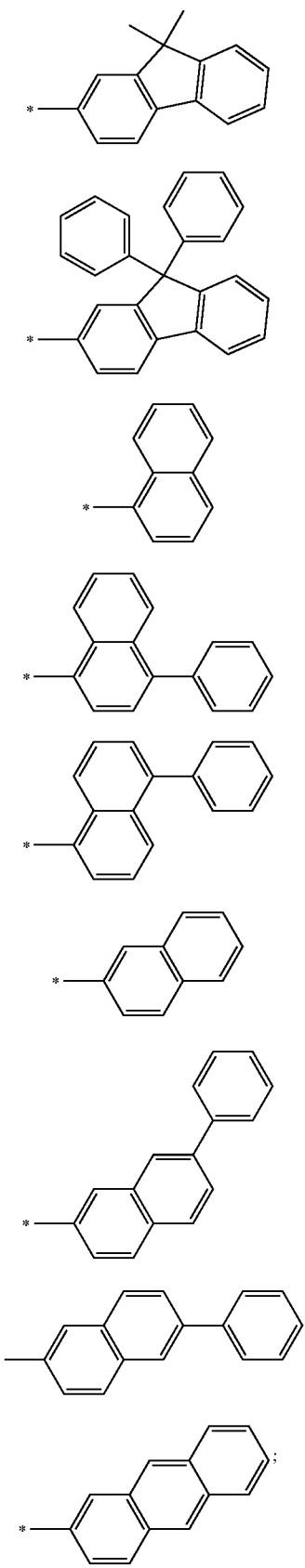

and in Formulae 3-1 to 3-20, * represents a binding site to a corresponding fluorene carbon of Formula 1 or Formula 2.

8. The amine-based compound of claim 1, wherein:
$R_3$, $R_4$, and $R_{11}$ to $R_{24}$ are each independently selected from:
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group,
a $C_1$-$C_{20}$ alkyl group, substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl,
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, and
phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl, each substituted with at least one selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, phenyl, naphthyl, fluorenyl, spiro-fluorenyl, phenanthrenyl, anthracenyl, fluoranthenyl, triphenylenyl, pyrenyl, chrysenyl, pyridinyl, pyrazinyl, pyrimidinyl, pyridazinyl, isoindolyl, indolyl, quinolinyl, benzoquinolinyl, quinoxalinyl, quinazolinyl, cinnolinyl, carbazolyl, and triazinyl.

9. The amine-based compound of claim 1, wherein:
$R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, and a $C_1$-$C_{20}$ alkyl group.

10. The amine-based compound of claim 1, wherein:
$R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, methyl, ethyl, propyl, butyl, pentyl, hexyl, heptyl, and a group represented by one of Formulae 3-1 to 3-20 below:

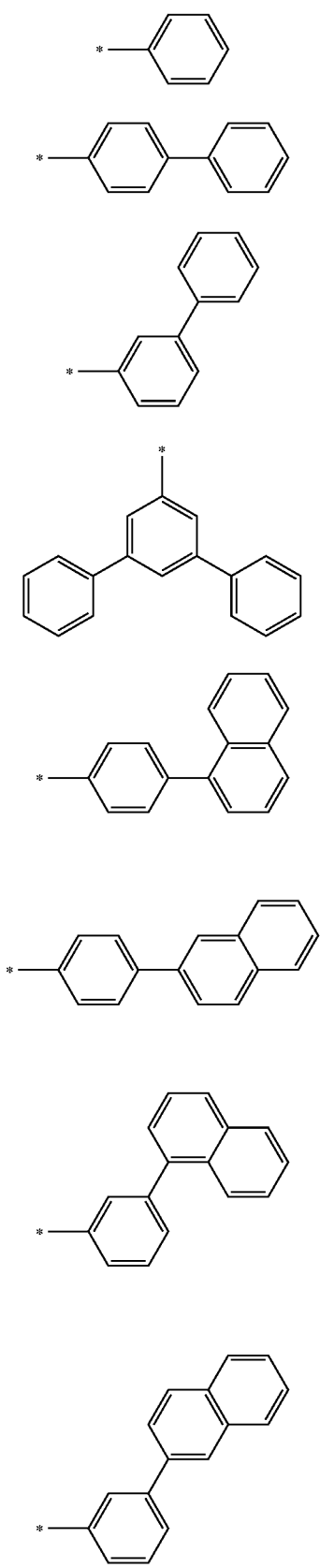
Formula 3-1
Formula 3-2
Formula 3-3
Formula 3-4
Formula 3-5
Formula 3-6
Formula 3-7
Formula 3-8
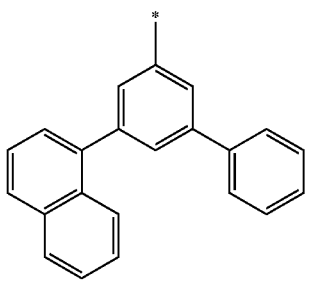
Formula 3-9
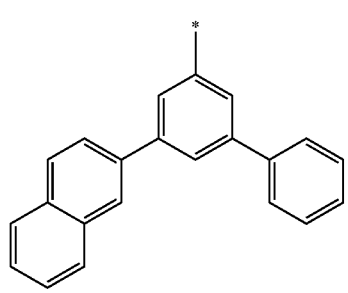
Formula 3-10
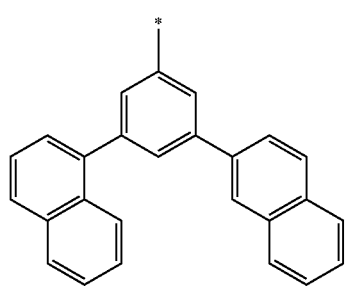
Formula 3-11
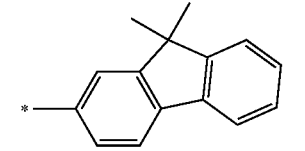
Formula 3-12
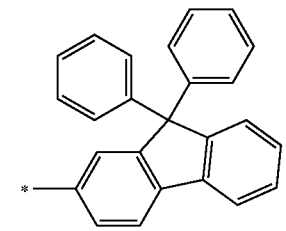
Formula 3-13
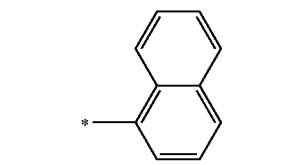
Formula 3-14
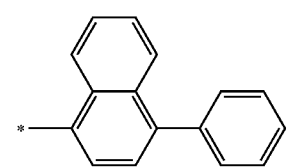
Formula 3-15

-continued

Formula 3-16
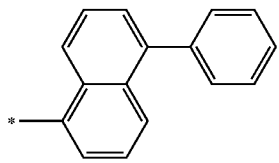

Formula 3-17
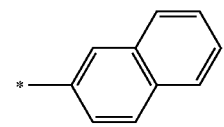

Formula 3-18
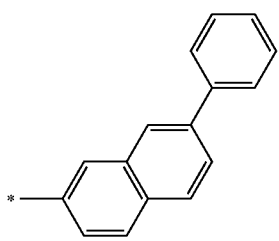

Formula 3-19
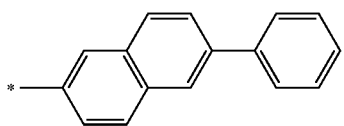

Formula 3-20
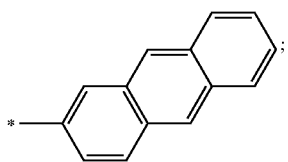

and in Formulae 3-1 to 3-20, * represents a binding site to a corresponding position on the amine-based compound represented by Formula 1 or Formula 2.

11. The amine-based compound of claim 1, wherein the amine-based compound is represented by Formula 1A or Formula 2A below:

<Formula 1A>
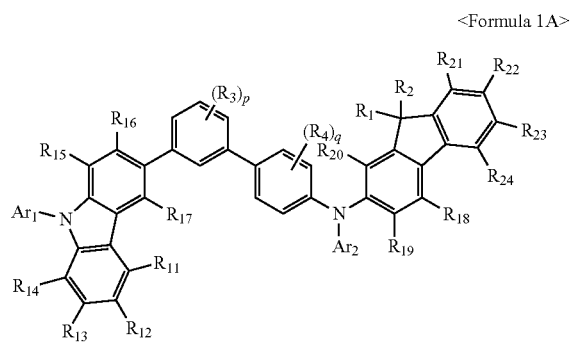

<Formula 2A>
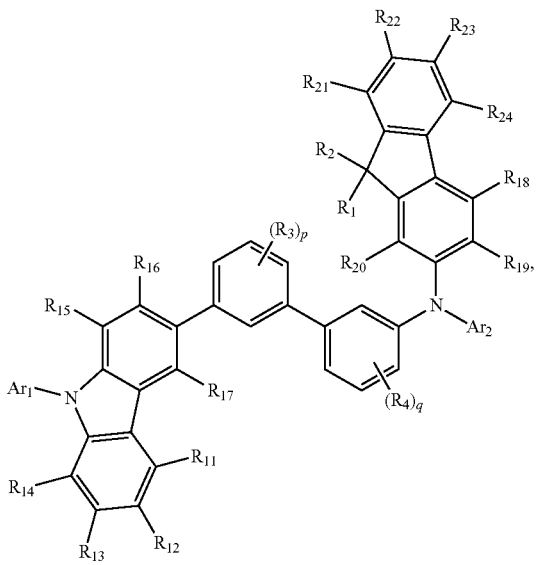

wherein in Formulae 1A and 2A:

p and q are each independently selected from an integer of 1 to 4;

$Ar_1$ and $Ar_2$ are each independently selected from a group represented by one of Formulae 3-1 to 3-20 below;

$R_1$ and $R_2$ are each independently selected from a $C_1$-$C_{20}$ alkyl group and a group represented by one of Formulae 3-1 to 3-20 below;

$R_3$, $R_4$ and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a group represented by one of Formulae 3-1 to 3-20 below;

Formula 3-1
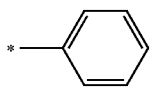

Formula 3-2
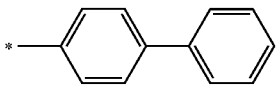

Formula 3-3
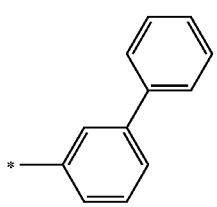

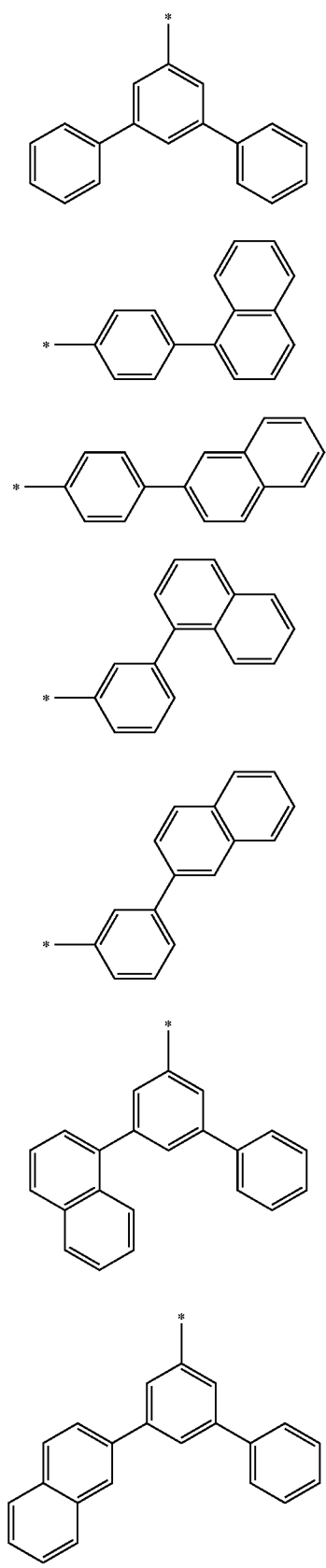
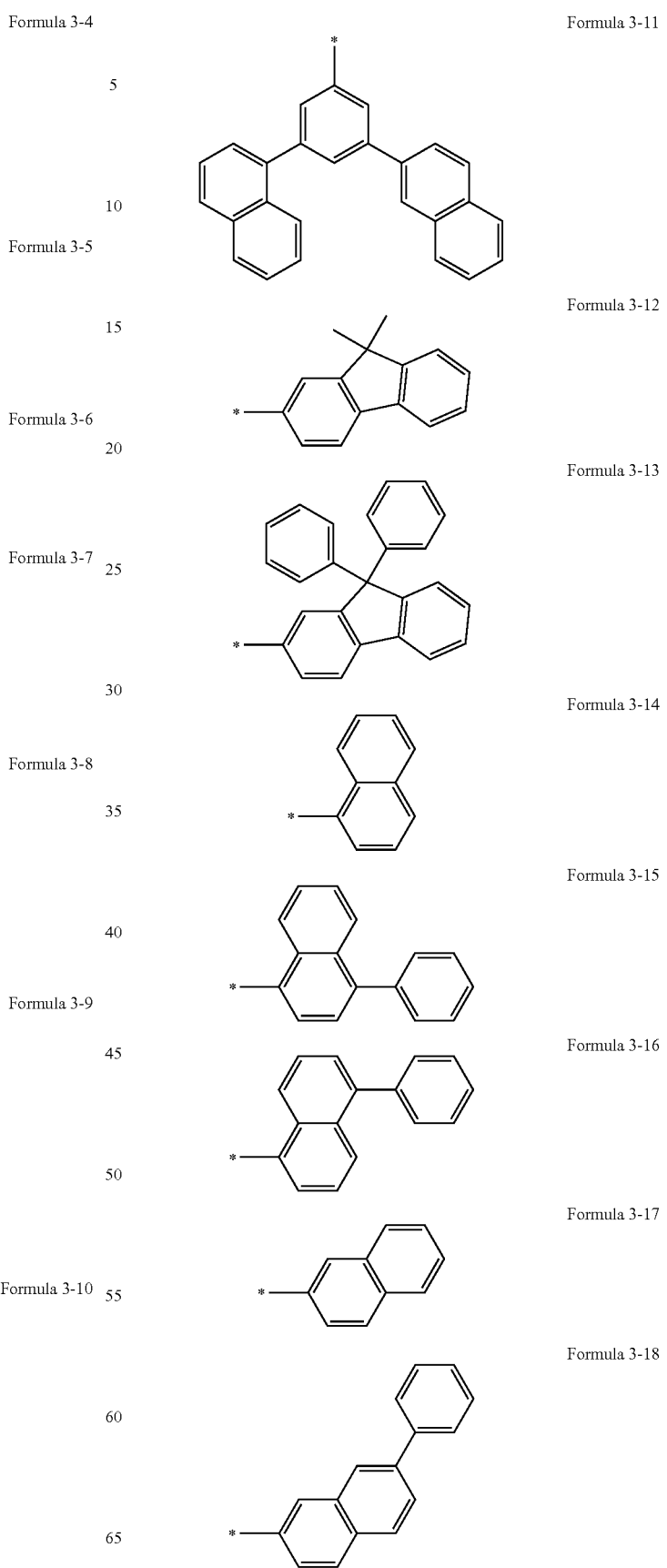
Formula 3-4
Formula 3-5
Formula 3-6
Formula 3-7
Formula 3-8
Formula 3-9
Formula 3-10
Formula 3-11
Formula 3-12
Formula 3-13
Formula 3-14
Formula 3-15
Formula 3-16
Formula 3-17
Formula 3-18

-continued

Formula 3-19

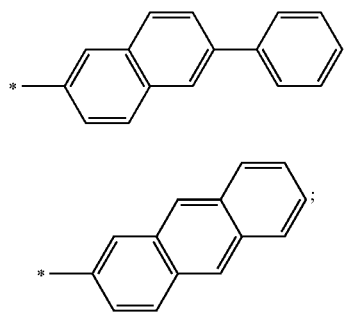

Formula 3-20 and in Formulae 3-1 to 3-20, * represents a binding site to a corresponding position on the amine-based compound represented by Formula 1A or Formula 2A.

12. The amine-based compound of claim 11, wherein $R_3$, $R_4$, and $R_{11}$ to $R_{24}$ are hydrogen atoms.

13. The amine-based compound of claim 1, wherein the amine-based compound is selected from one of Compounds 1 to 96 below:

1

2

-continued

3

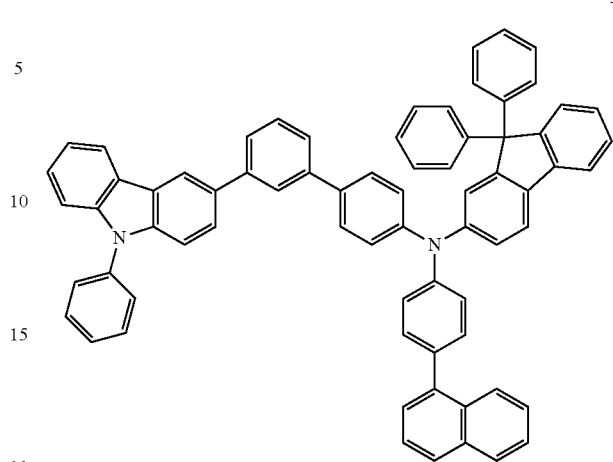

4

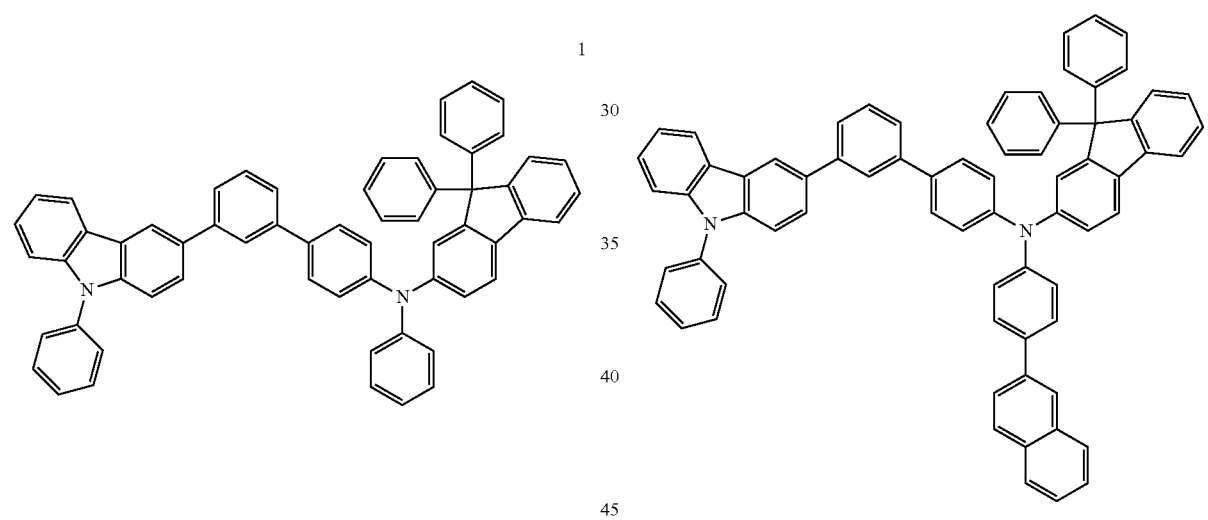

5

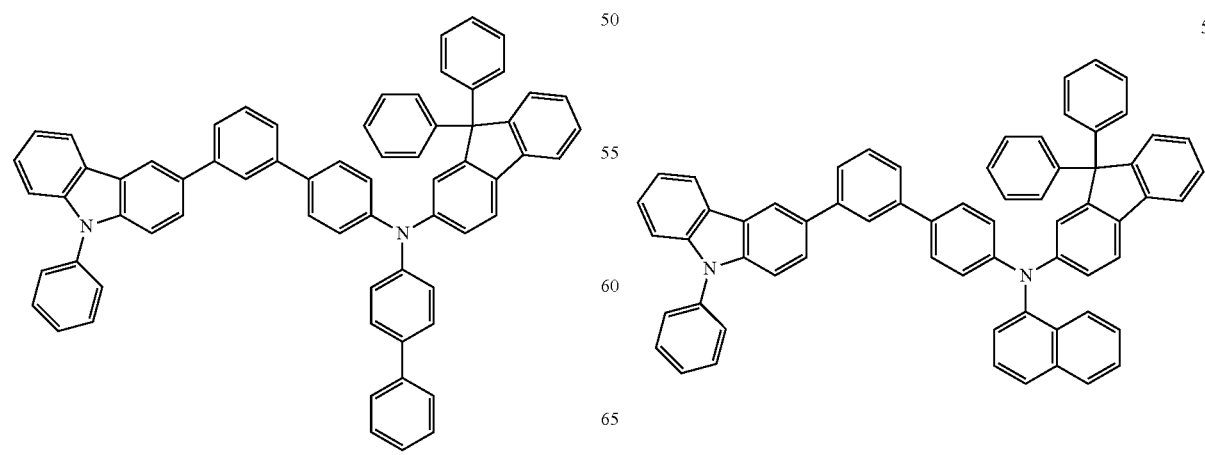

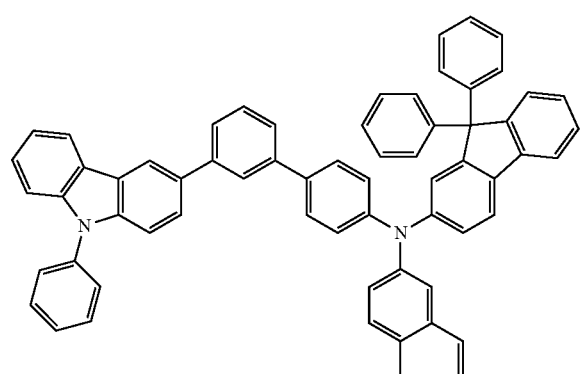 [SMILES: c1ccc(-n2c3ccccc3c3cc(-c4cccc(-c5ccc(N(c6ccc7c(c6)C(c6ccccc6)(c6ccccc6)c6ccccc6-7)c6cccc7ccccc67)cc5)c4)ccc32)cc1]
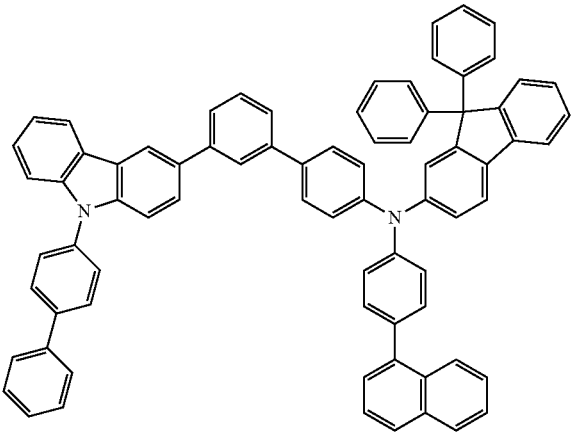
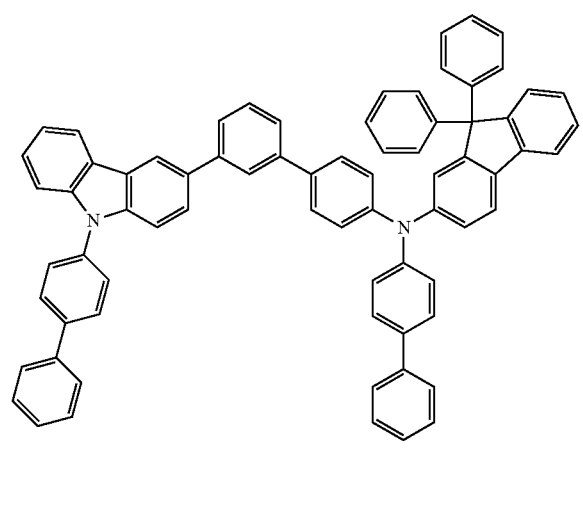

12
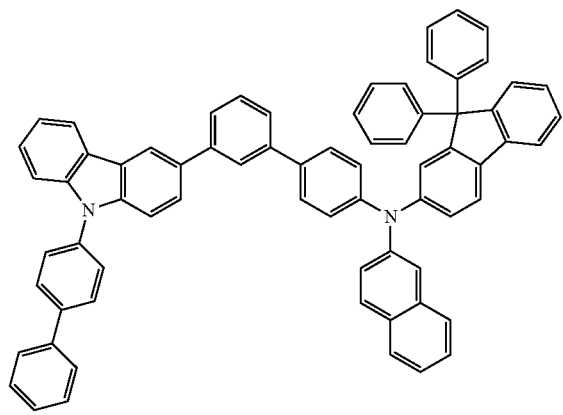
13
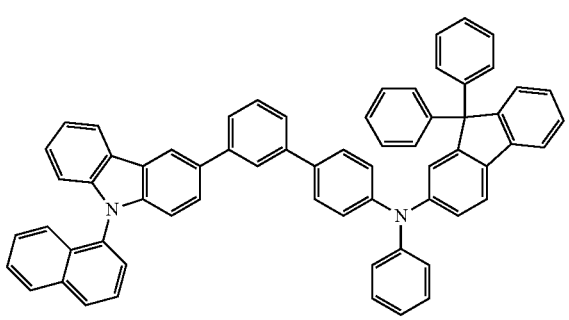
14
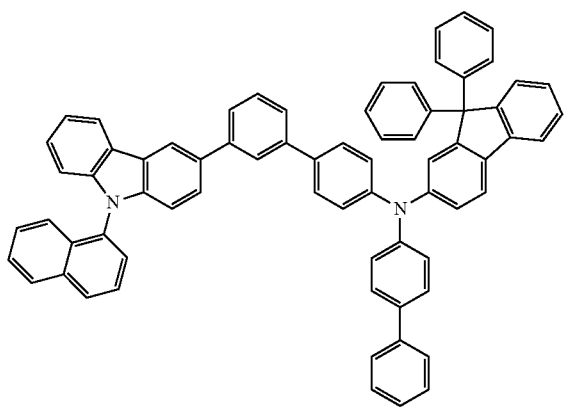
15
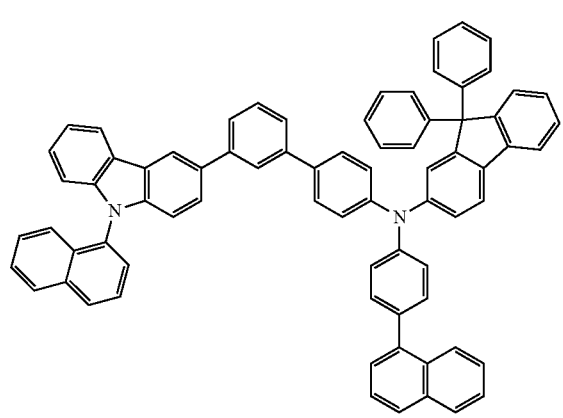
16
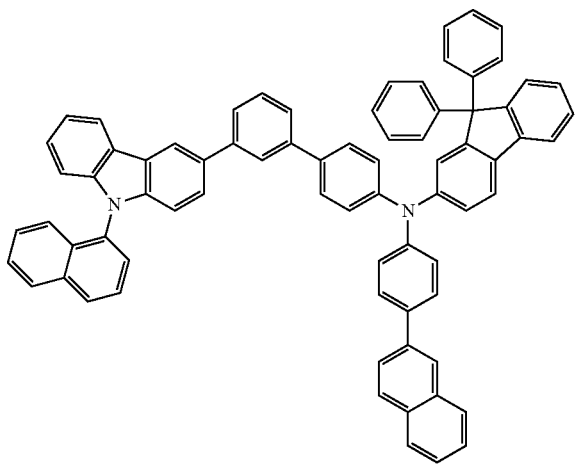
17
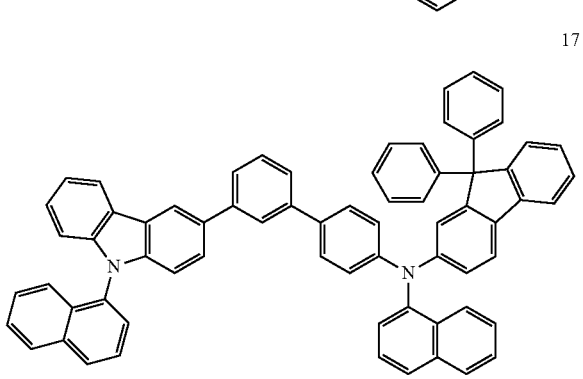
18
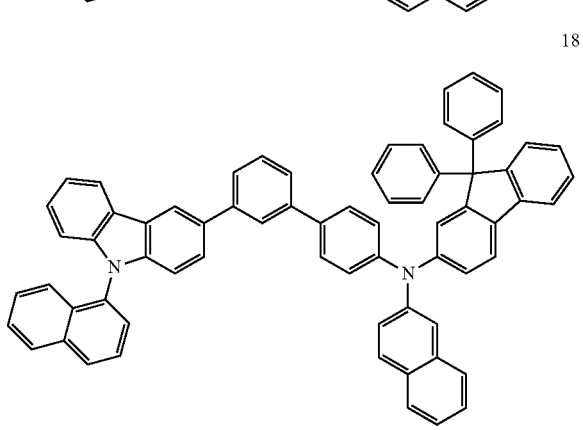
19
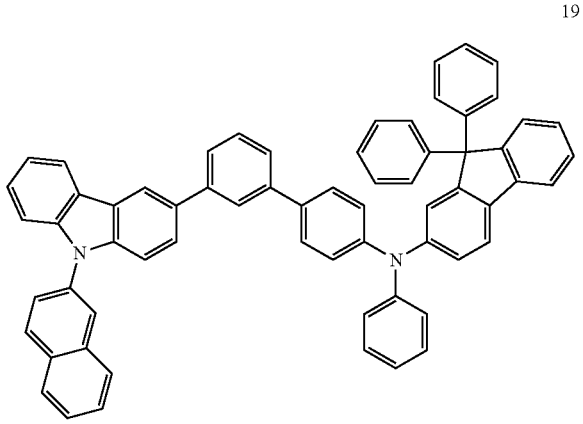

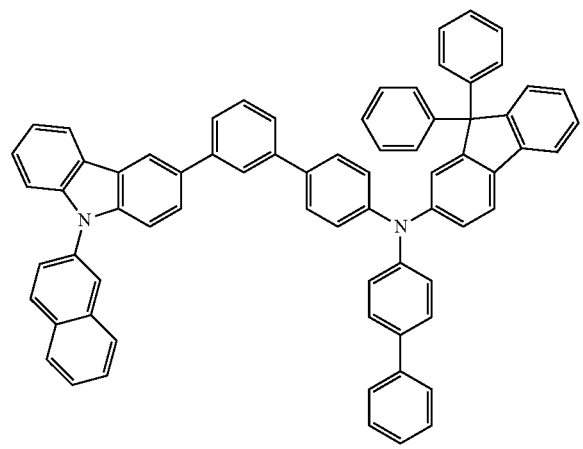
20
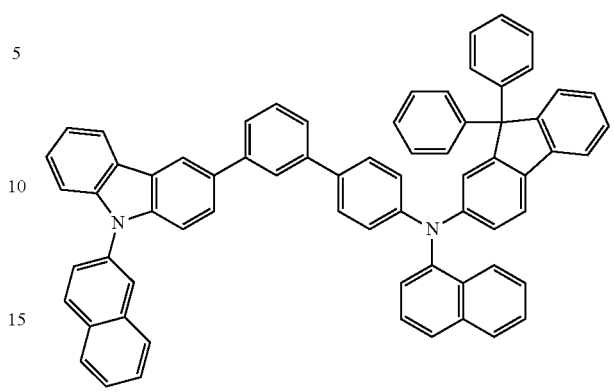
23
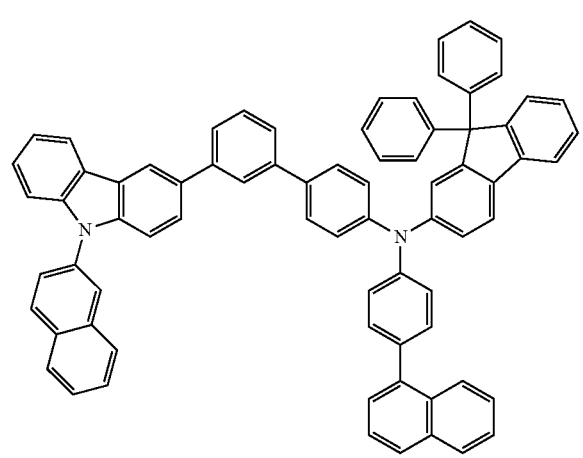
21
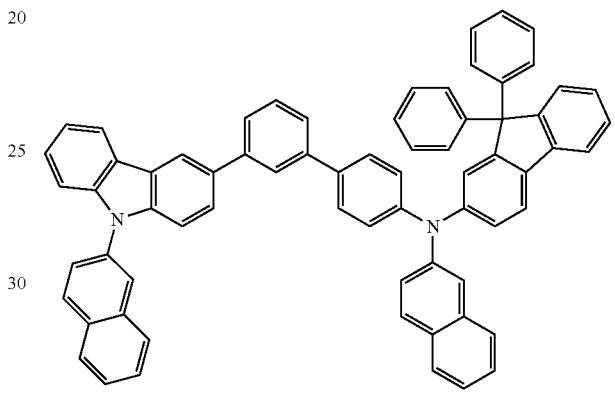
24
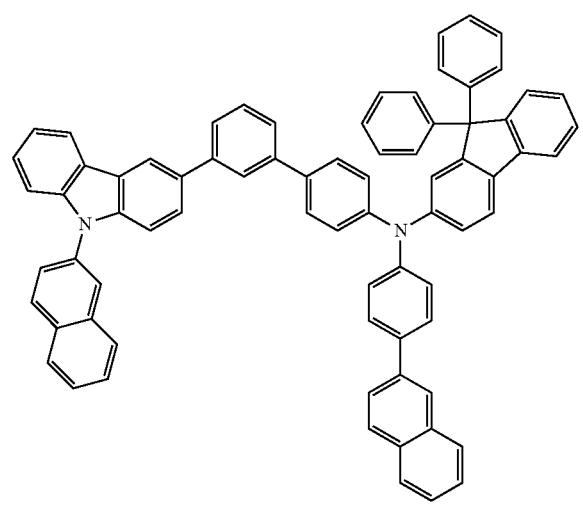
22
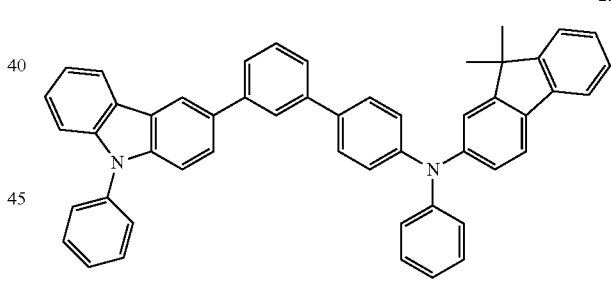
25
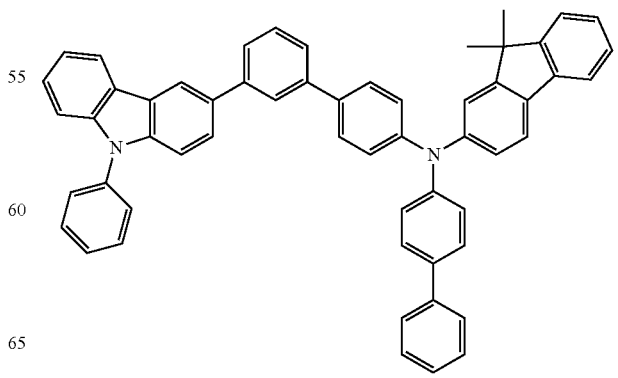
26

-continued

35
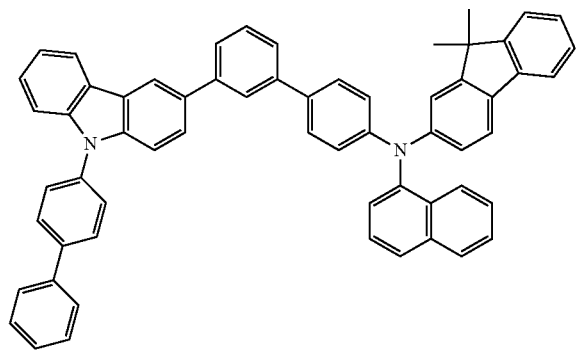
36
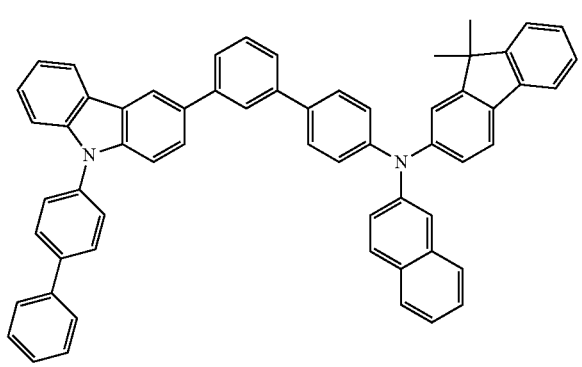
37
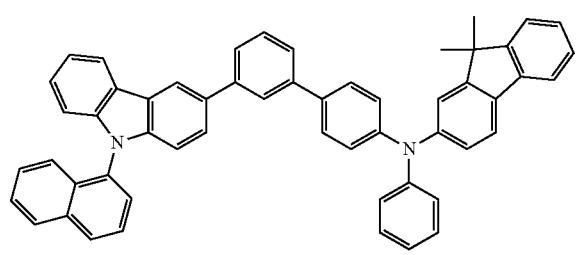
38
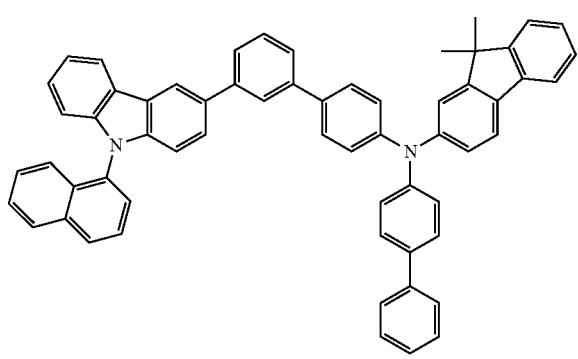
39
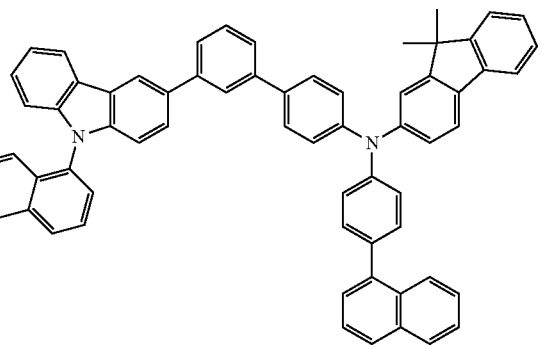
40
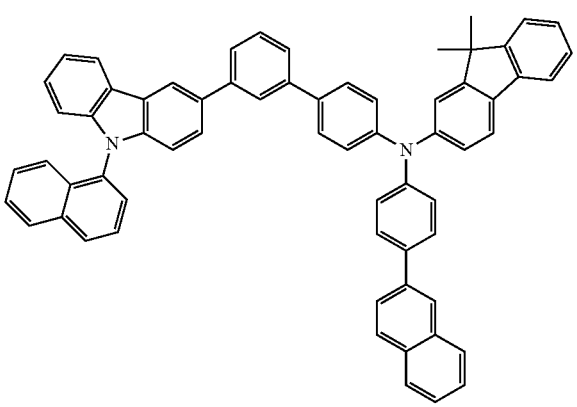
41
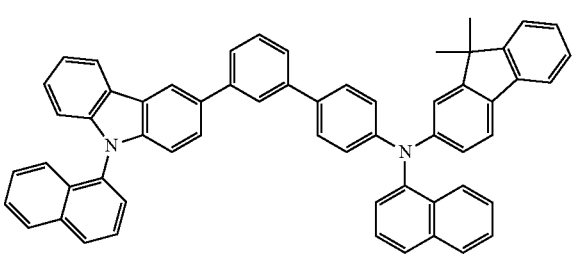
42
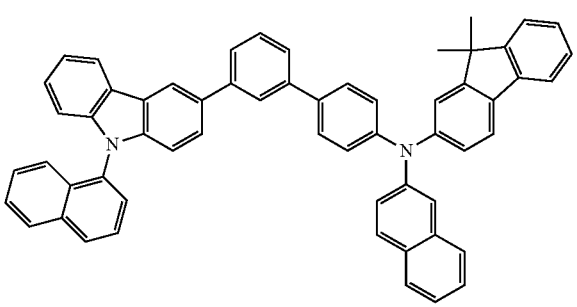

43
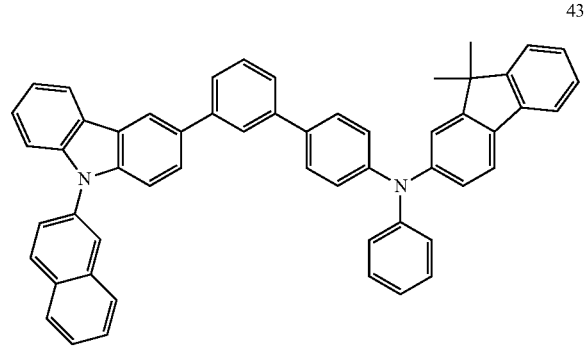
44
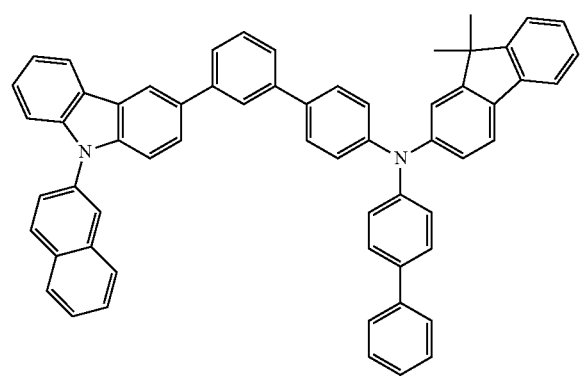
45
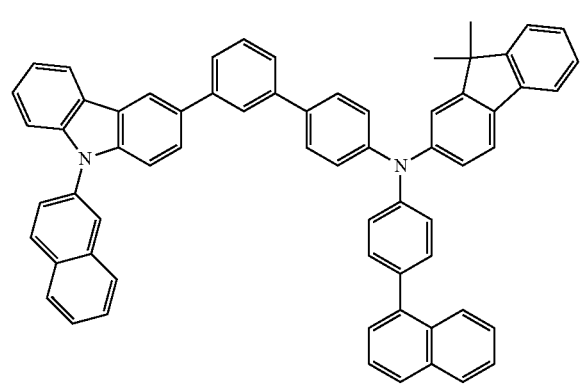
46
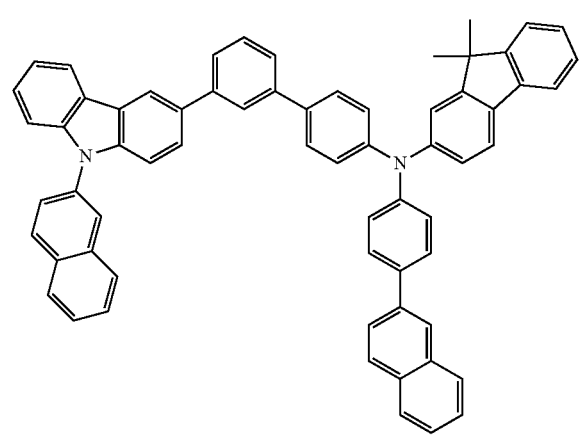
47
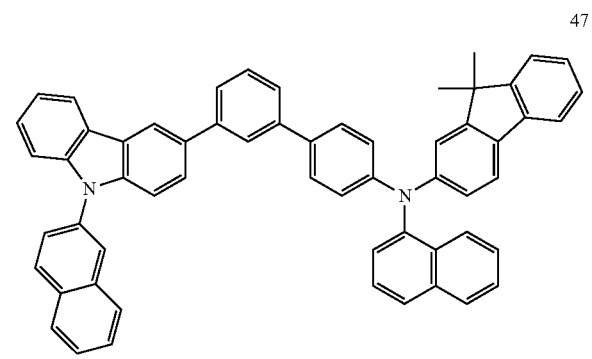
48
49
50
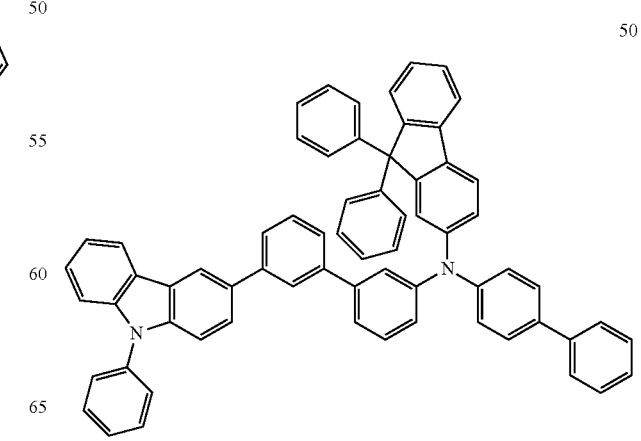

51
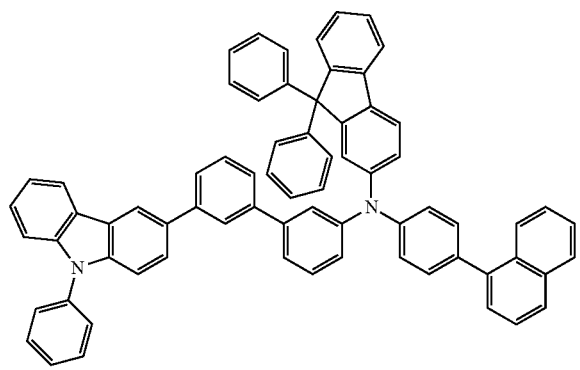
52
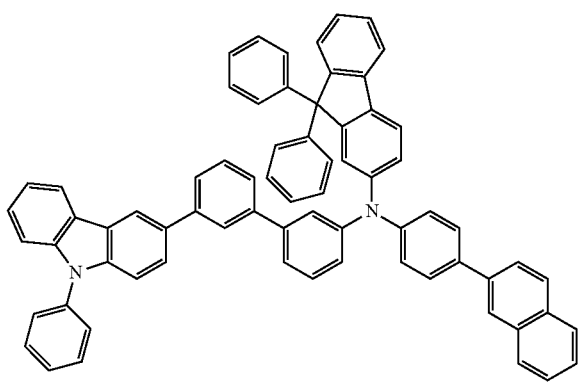
53
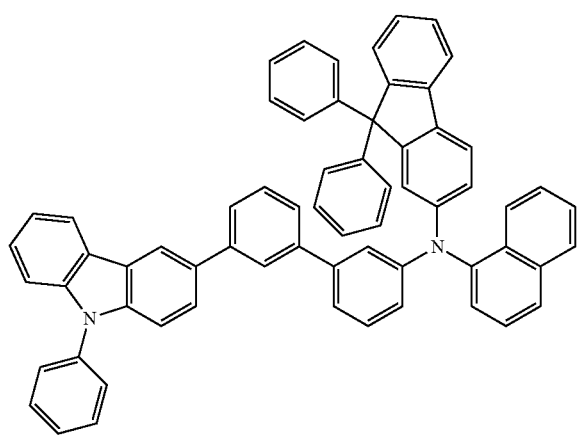
54
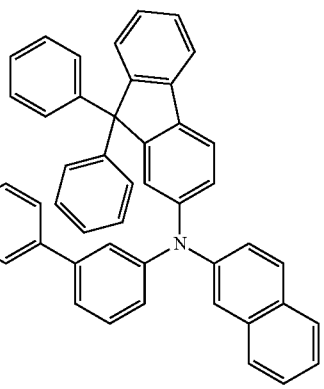
55, 56
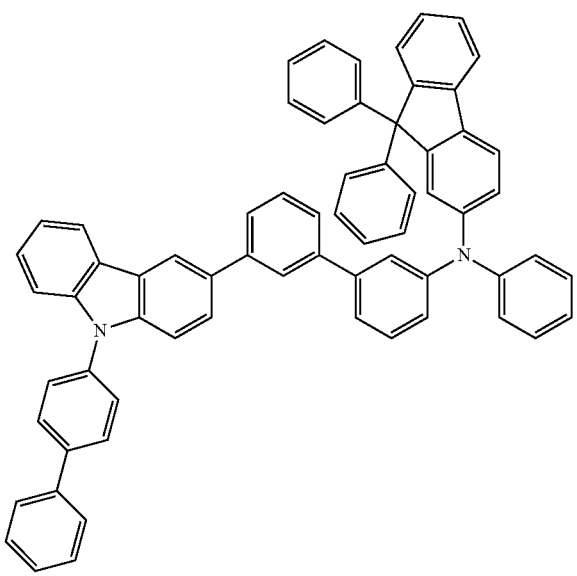

57
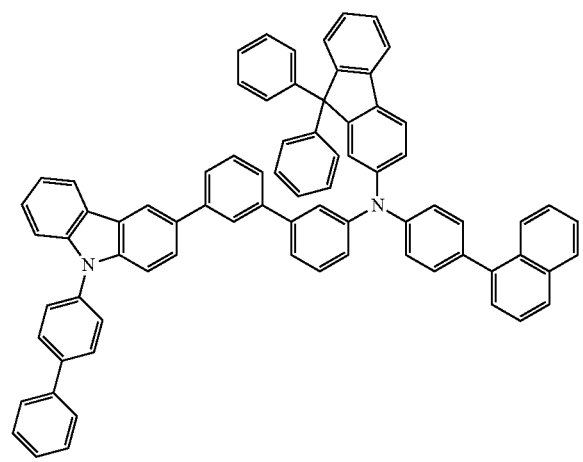
58
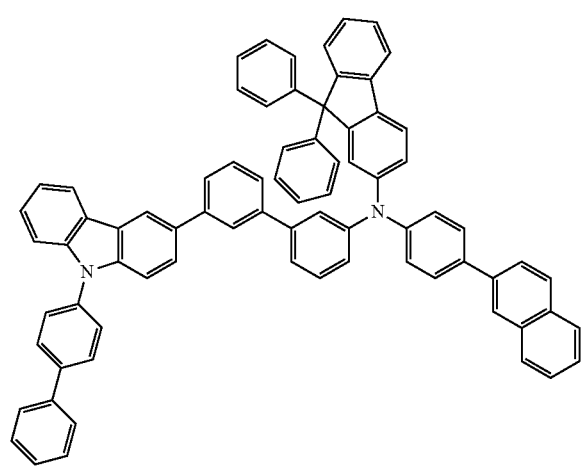
59
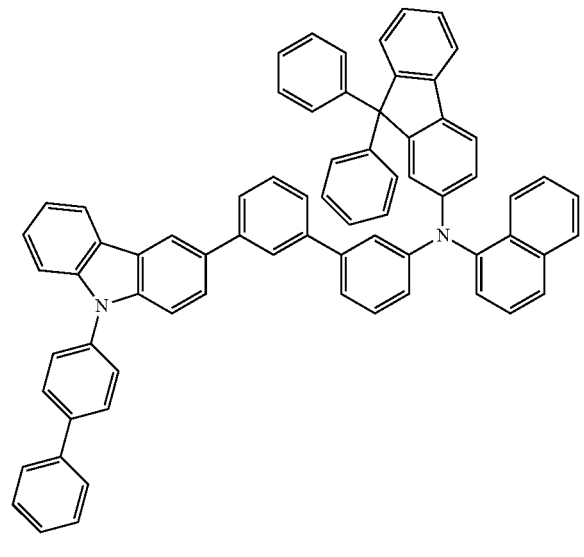
60
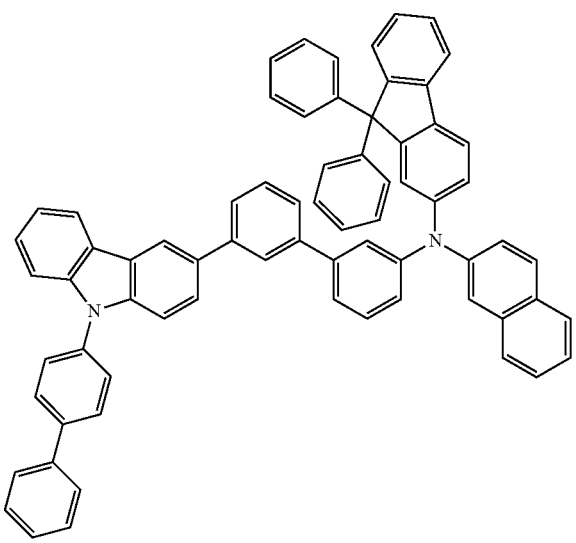
61
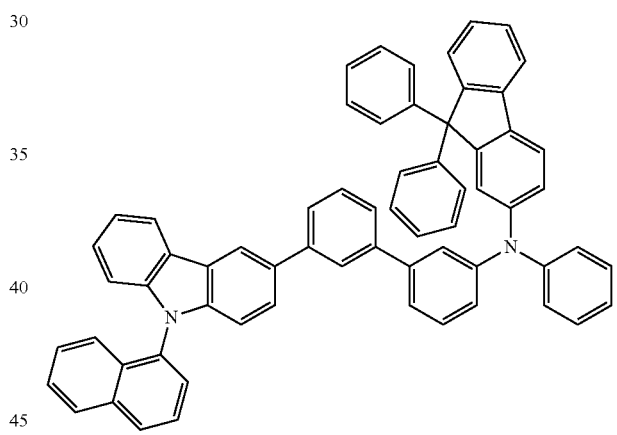
62
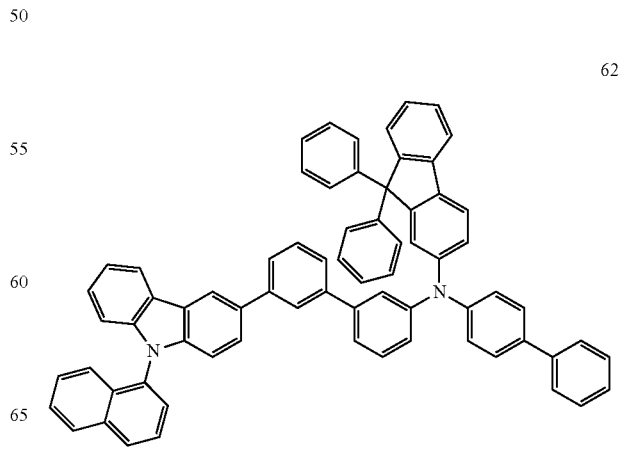

63
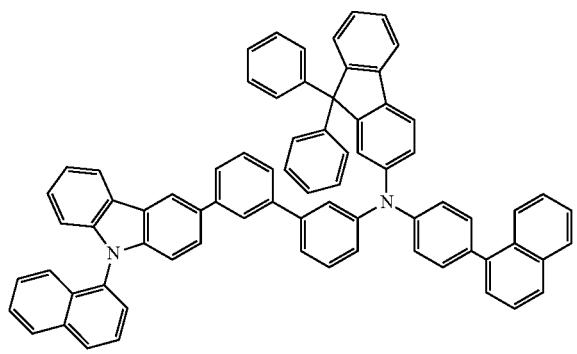
64
65
66
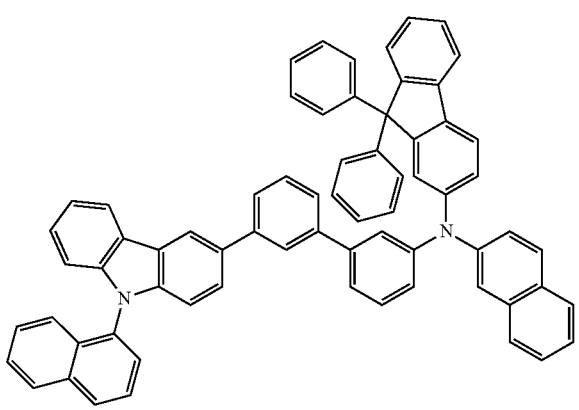
67
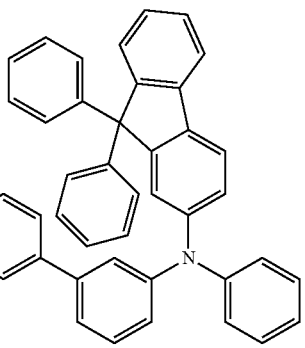
68
69
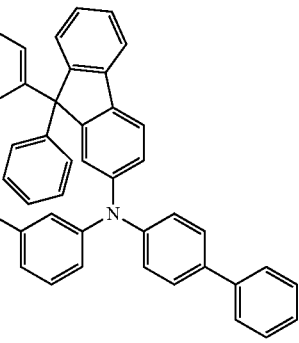

70
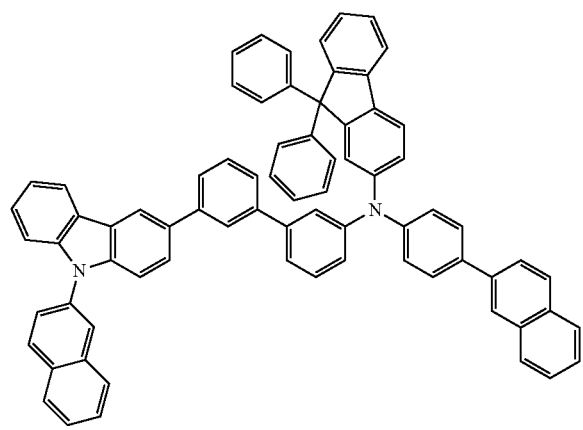
71
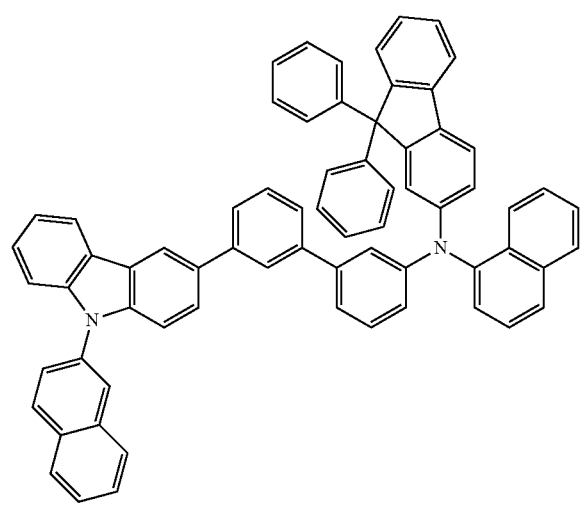
72
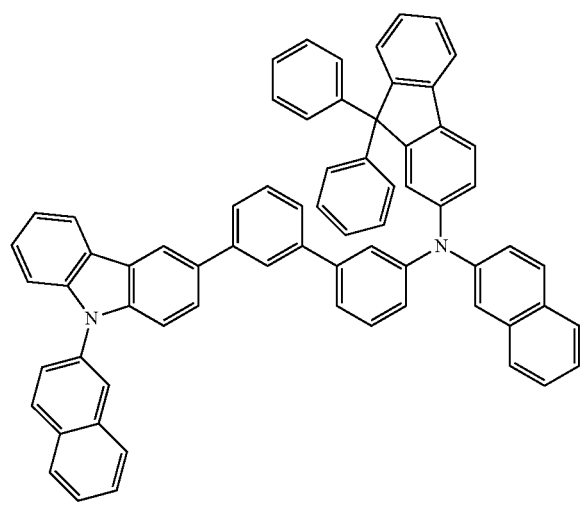
73
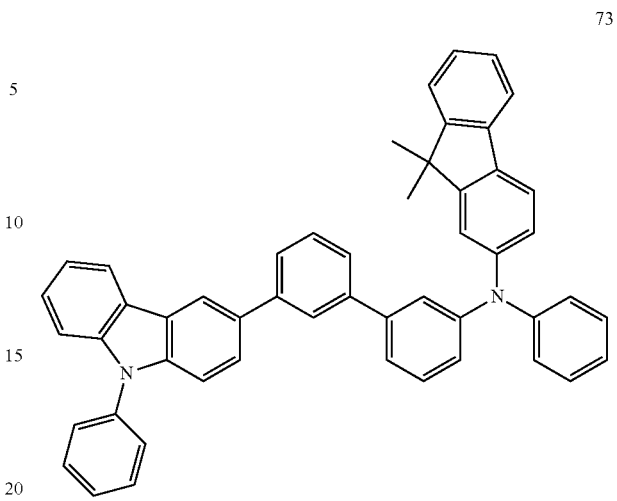
74
75
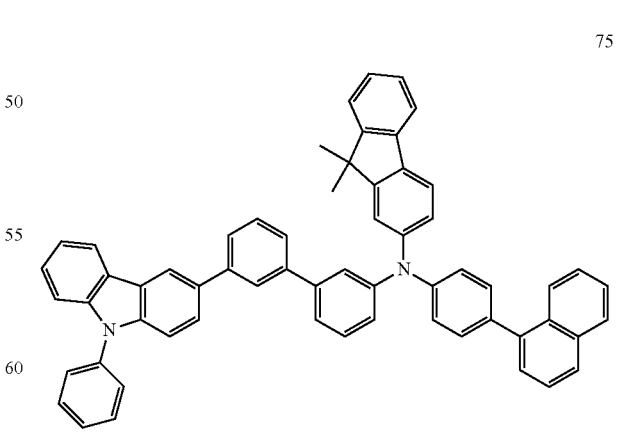

76
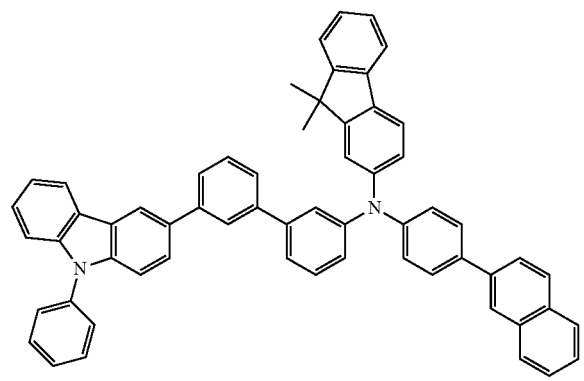
77
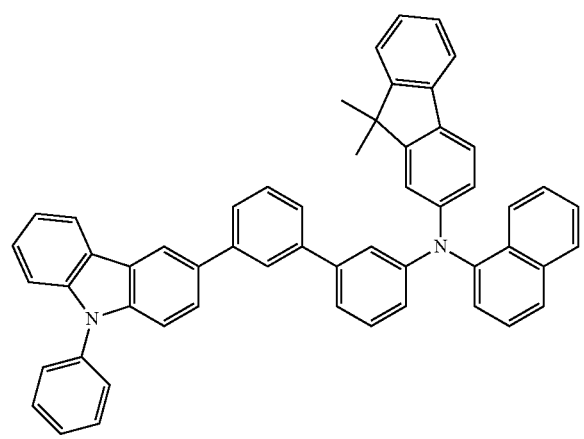
78
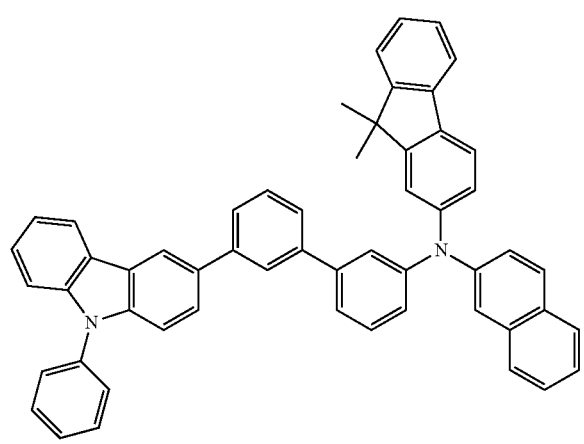
79
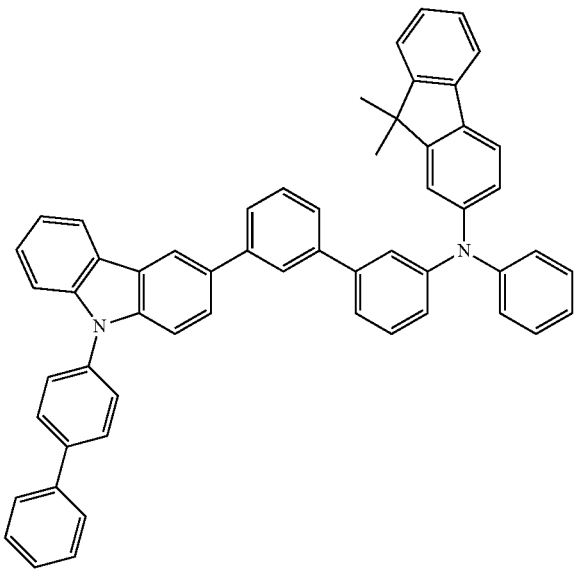
80
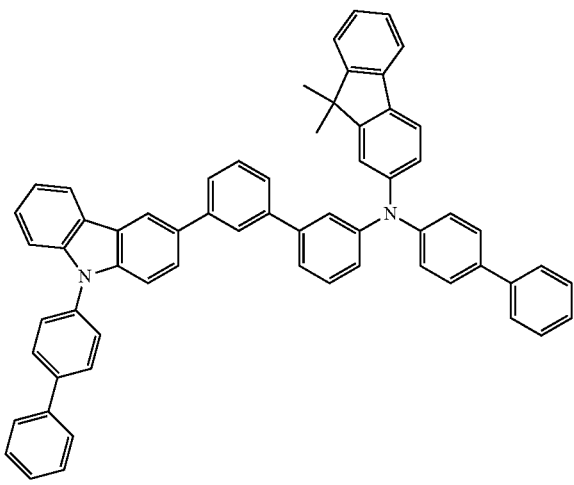
81
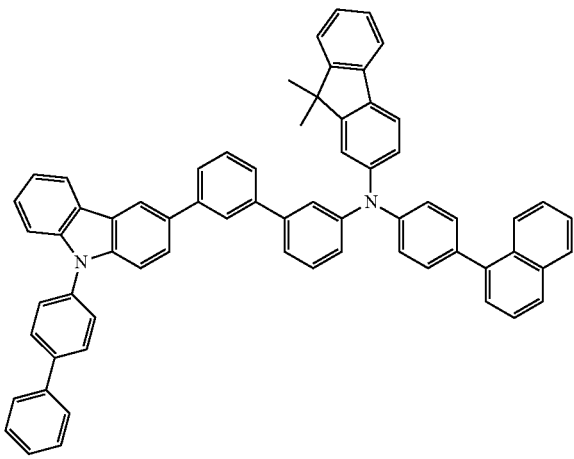

82
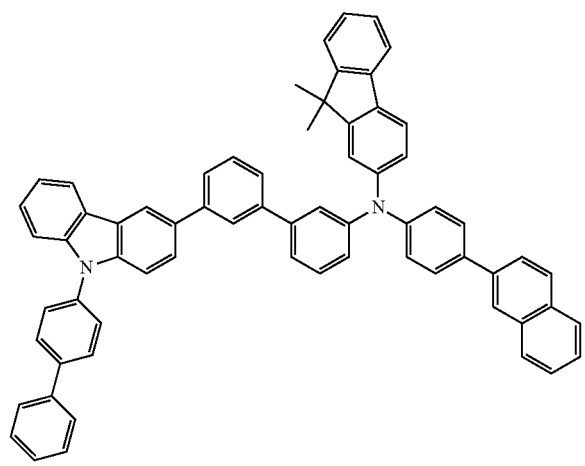
83
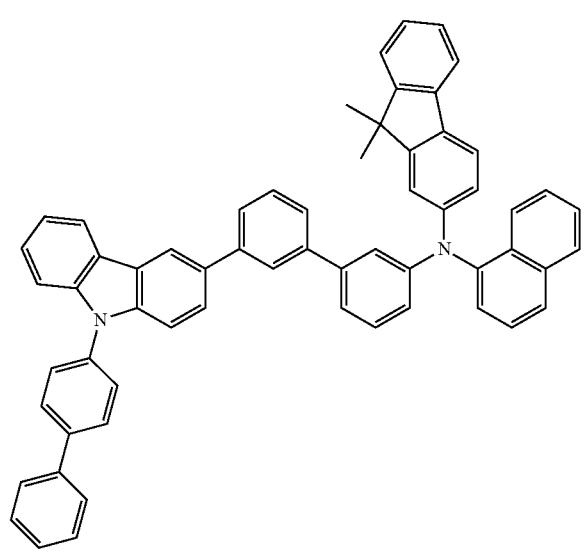
84
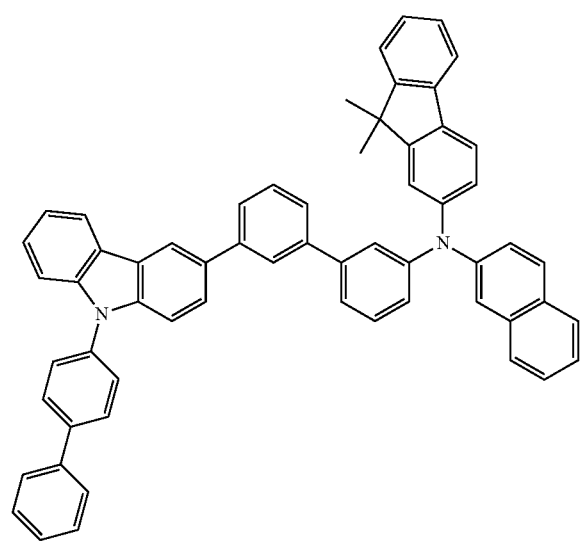
85
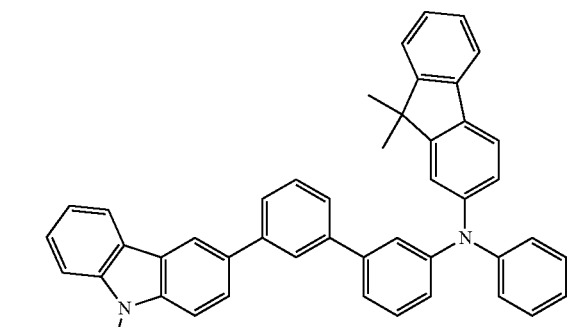
86
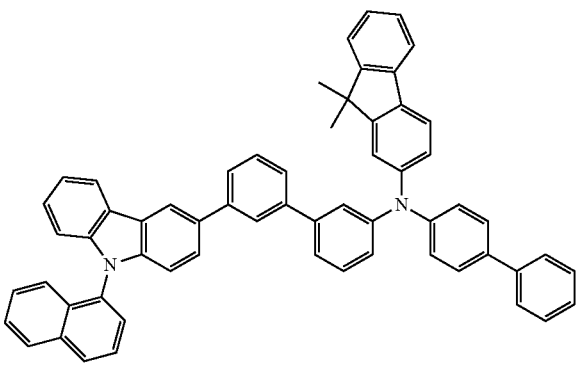
87
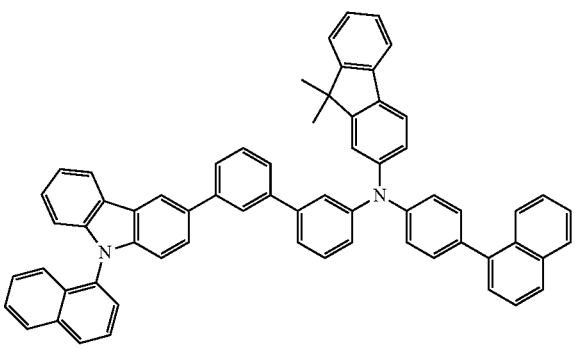
88
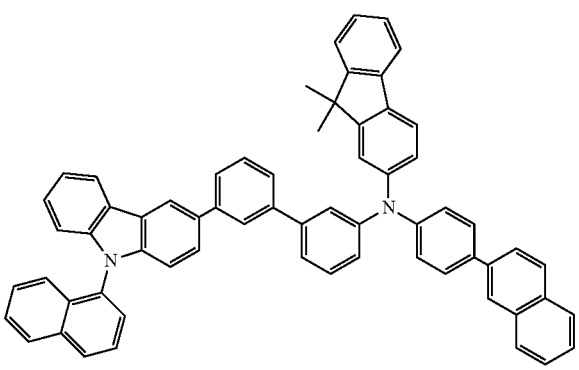

89
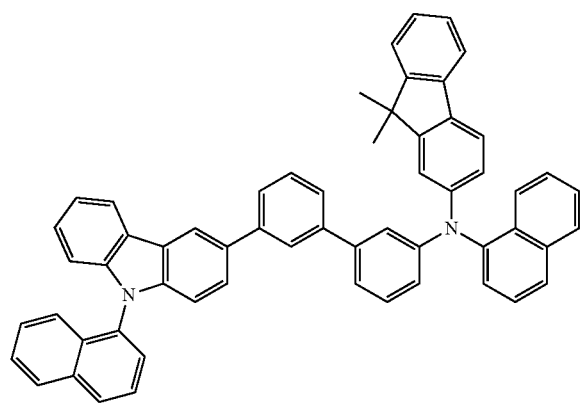
90
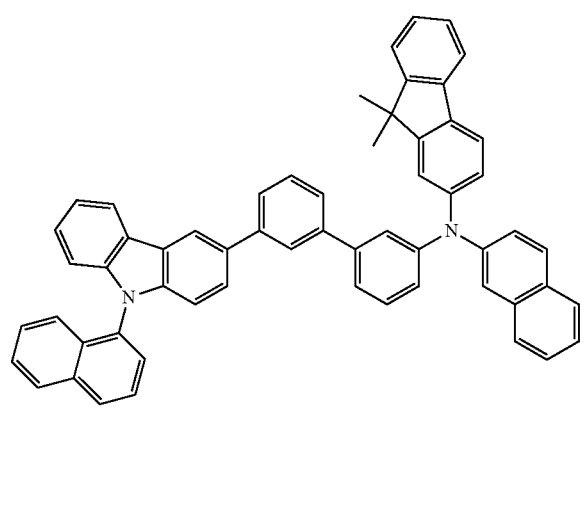
91
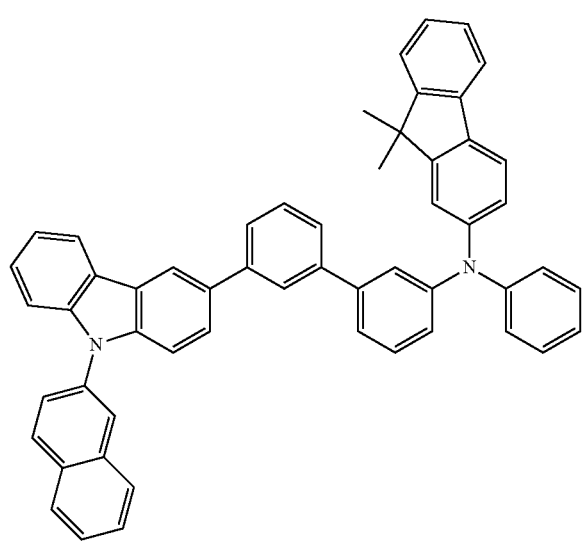
92
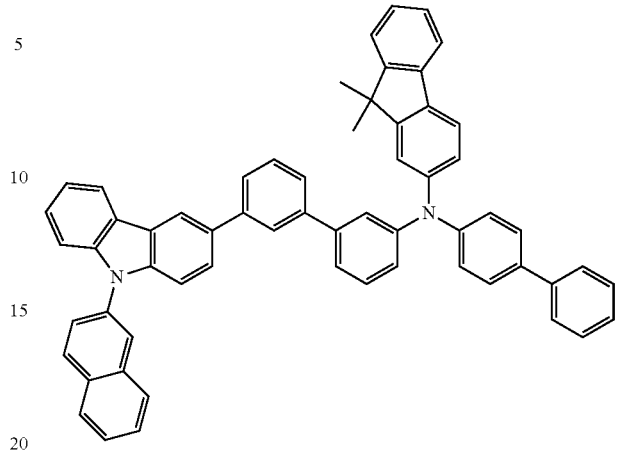
93
94
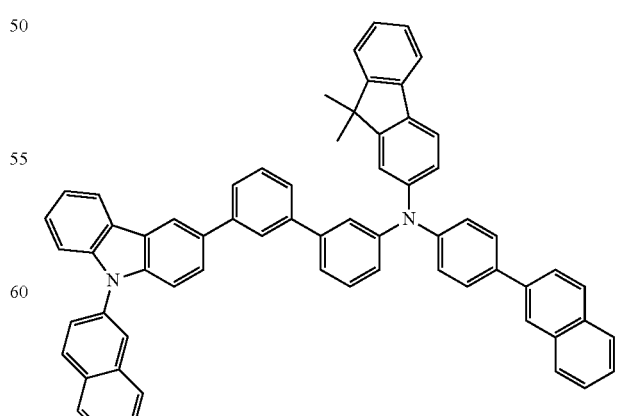

95

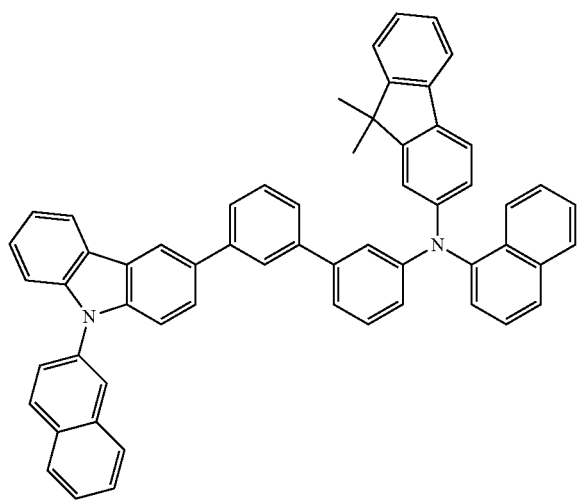

96

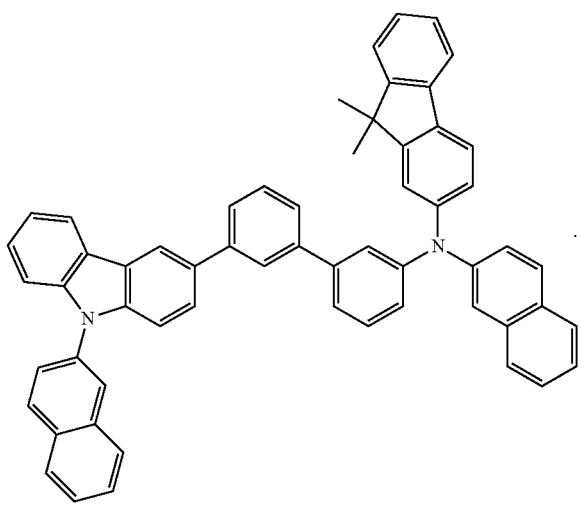

14. An amine-based compound represented by Formula 1A or Formula 2A below:

<Formula 1A>

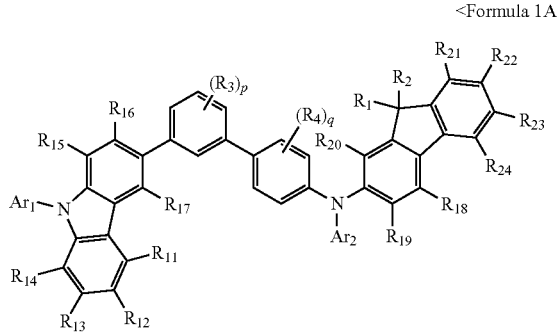

<Formula 2A>

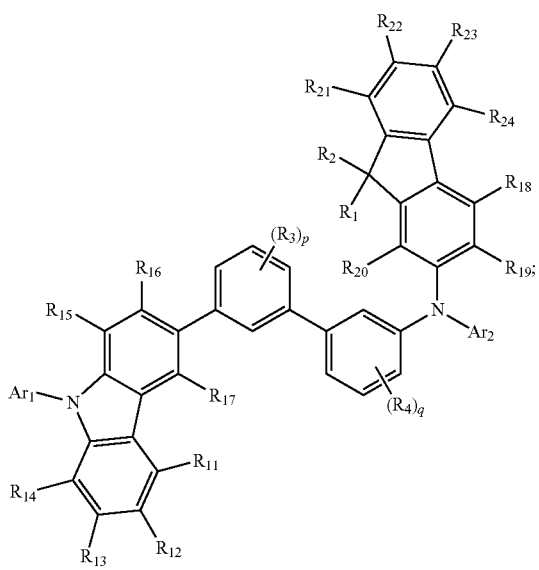

wherein in Formulae 1A and 2A:

p and q are each independently selected from an integer of 1 to 4;

$Ar_1$ and $Ar_2$ are each independently selected from a group represented by one of Formulae 3-1 to 3-20 below;

$R_1$ and $R_2$ are each independently selected from a $C_1$-$C_{20}$ alkyl group and a group represented by one of Formulae 3-1 to 3-20 below;

$R_3$, $R_4$, and $R_{11}$ to $R_{24}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a group represented by one of Formulae 3-1 to 3-20 below;

Formula 3-1

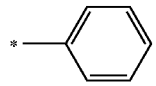

Formula 3-2

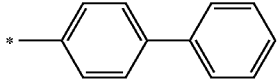

Formula 3-3

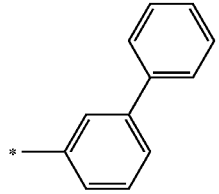

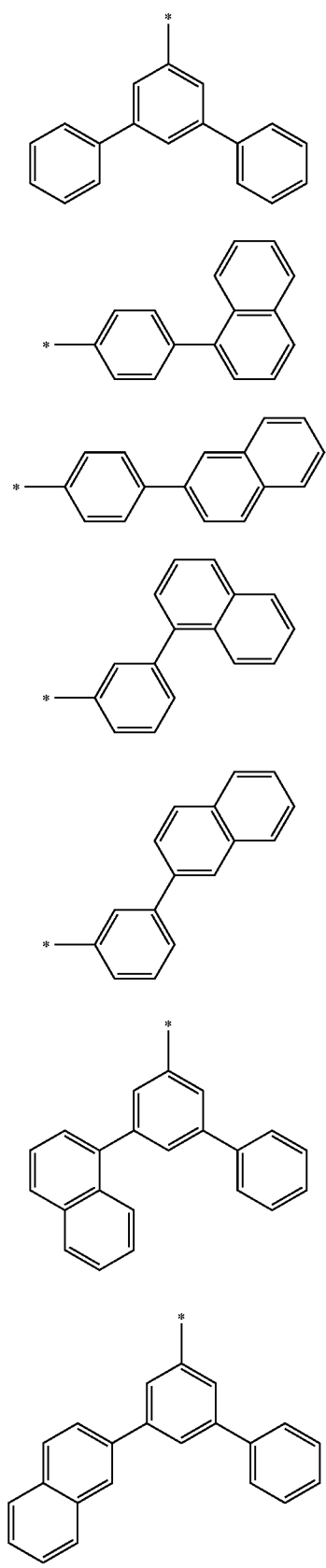
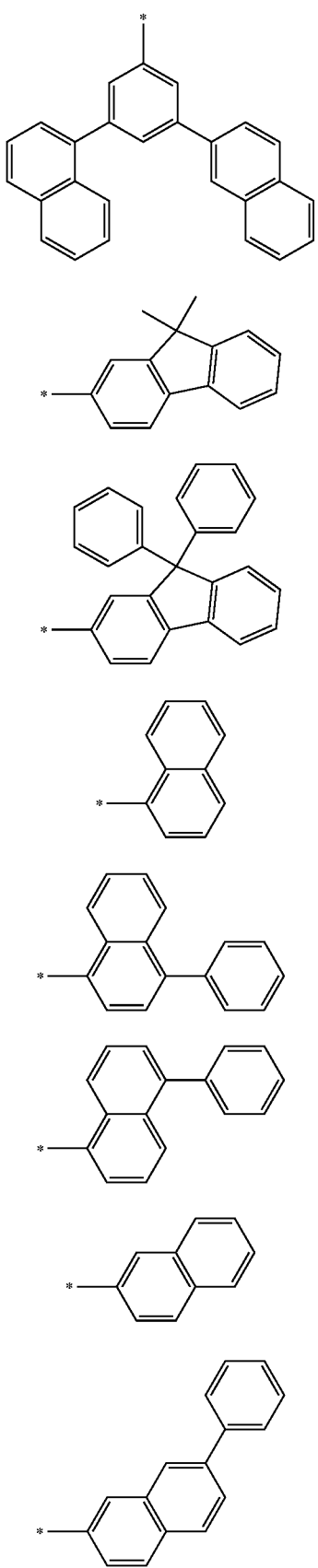

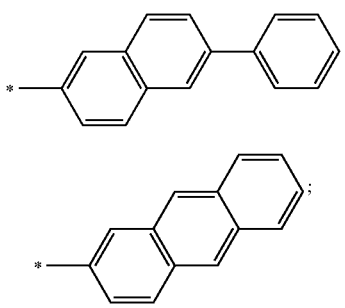

and in Formulae 3-1 to 3-20, * represents a binding site to a corresponding position on the amine-based compound represented by Formula 1A or Formula 2A.

15. An organic light-emitting diode comprising:
a first electrode;
a second electrode on the first electrode; and
an organic layer between the first electrode and the second electrode, the organic layer comprising an emission layer and the amine-based compound according to claim 1.

16. The organic light-emitting diode of claim 15, wherein the organic layer comprises:
a hole transporting region between the first electrode and the emission layer, the hole transporting region comprising at least one selected from a hole injection layer, a hole transport layer, a functional layer having a hole injection capability and a hole transport capability, a buffer layer, and an electron blocking layer; and
an electron transporting region between the emission layer and the second electrode, the electron transporting region comprising at least one selected from a hole blocking layer, an electron transport layer, and an electron injection layer.

17. The organic light-emitting diode of claim 16, wherein the hole transporting region comprises the amine-based compound.

18. The organic light-emitting diode of claim 17, wherein the hole transporting region further comprises a p-dopant.

19. The organic light-emitting diode of claim 16, wherein the hole transporting region comprises a hole transport layer, the hole transport layer comprising the amine-based compound.

20. The organic light-emitting diode of claim 15, wherein the emission layer comprises a host and a dopant, the dopant comprising an organometallic compound comprising at least one selected from Ir, Pt, Os, Ti, Zr, Hf, Eu, Tb, and Tm.

* * * * *